US011158647B2

(12) United States Patent
Wu et al.

(10) Patent No.: US 11,158,647 B2
(45) Date of Patent: Oct. 26, 2021

(54) MEMORY DEVICE

(71) Applicant: TAIWAN SEMICONDUCTOR MANUFACTURING CO., LTD., Hsinchu (TW)

(72) Inventors: Yun-Chi Wu, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/716,222

(22) Filed: Dec. 16, 2019

(65) Prior Publication Data

US 2020/0119035 A1  Apr. 16, 2020

Related U.S. Application Data

(62) Division of application No. 15/652,310, filed on Jul. 18, 2017, now Pat. No. 10,510,765.

(51) Int. Cl.
| *H01L 29/792* | (2006.01) |
| *H01L 27/11568* | (2017.01) |
| *H01L 21/8234* | (2006.01) |
| *H01L 21/28* | (2006.01) |
| *H01L 29/423* | (2006.01) |
| *H01L 27/11573* | (2017.01) |

(Continued)

(52) U.S. Cl.
CPC ........... *H01L 27/11568* (2013.01); *H01L 21/823437* (2013.01); *H01L 21/823462* (2013.01); *H01L 21/823468* (2013.01); *H01L 21/823481* (2013.01); *H01L 27/1157* (2013.01); *H01L 27/11573* (2013.01); *H01L 29/40117* (2019.08); *H01L 29/42344* (2013.01); *H01L 29/66833* (2013.01); *H01L 29/792* (2013.01); *H01L 21/823418* (2013.01)

(58) Field of Classification Search
CPC ......... H01L 21/823462; H01L 27/0922; H01L 27/11563; H01L 27/11565; H01L 27/11568; H01L 29/66545; H01L 29/66871

See application file for complete search history.

(56) References Cited

U.S. PATENT DOCUMENTS 6,992,361 B2 * 1/2006 Shin ............... H01L 21/823892
257/499
8,883,624 B1 * 11/2014 Ramkumar ......... H01L 29/4966
438/587

(Continued)

FOREIGN PATENT DOCUMENTS

JP          2013020677 A  *  1/2013

*Primary Examiner* — Earl N Taylor
(74) *Attorney, Agent, or Firm* — Birch, Stewart, Kolasch & Birch, LLP

(57) ABSTRACT

A memory device includes a semiconductor substrate, a logic transistor, and a storage transistor. The semiconductor substrate has a logic region and a memory region. The logic transistor is disposed on the logic region, in which the logic transistor comprises a high-k metal gate structure. The storage transistor is disposed on the memory region, in which the storage transistor includes a charge storage structure and a high-k metal gate structure. The charge storage structure is disposed on the memory region. The high-k metal gate structure is disposed on the charge storage structure.

20 Claims, 61 Drawing Sheets

(51) Int. Cl.
*H01L 27/1157* (2017.01)
*H01L 29/66* (2006.01)

(56) References Cited

U.S. PATENT DOCUMENTS

| | | | | |
|---|---|---|---|---|
| 9,437,500 | B1* | 9/2016 | Hong | H01L 27/11546 |
| 9,583,499 | B1* | 2/2017 | Zhu | H01L 27/11531 |
| 9,673,210 | B1* | 6/2017 | Thees | H01L 29/40117 |
| 9,793,286 | B2* | 10/2017 | Wu | H01L 29/4916 |
| 9,831,262 | B2* | 11/2017 | Wu | H01L 29/40117 |
| 9,842,845 | B1* | 12/2017 | Melde | H01L 21/31111 |
| 2003/0198086 | A1* | 10/2003 | Shukuri | H01L 27/11521 |
| | | | | 365/185.18 |
| 2004/0208055 | A1* | 10/2004 | Wang | G11C 17/16 |
| | | | | 365/182 |
| 2006/0245254 | A1* | 11/2006 | Ishii | G11C 16/3468 |
| | | | | 365/185.18 |
| 2006/0261398 | A1* | 11/2006 | Lee | H01L 21/823462 |
| | | | | 257/314 |
| 2011/0032766 | A1* | 2/2011 | Fang | G11C 16/28 |
| | | | | 365/185.18 |
| 2013/0171786 | A1* | 7/2013 | Shroff | H01L 29/7881 |
| | | | | 438/266 |
| 2013/0334584 | A1* | 12/2013 | Tang | H01L 21/823857 |
| | | | | 257/315 |
| 2014/0073126 | A1* | 3/2014 | Shen | H01L 29/40114 |
| | | | | 438/591 |
| 2014/0239407 | A1* | 8/2014 | Manabe | H01L 21/823842 |
| | | | | 257/369 |
| 2014/0374814 | A1* | 12/2014 | Wu | H01L 27/11568 |
| | | | | 257/326 |
| 2015/0041875 | A1* | 2/2015 | Perera | H01L 29/7881 |
| | | | | 257/314 |
| 2015/0072489 | A1* | 3/2015 | Baker, Jr. | H01L 27/11546 |
| | | | | 438/267 |
| 2015/0171104 | A1* | 6/2015 | Prabhakar | H01L 29/40117 |
| | | | | 438/200 |
| 2015/0206949 | A1* | 7/2015 | Zhao | H01L 29/517 |
| | | | | 257/410 |
| 2015/0249140 | A1* | 9/2015 | Shroff | H01L 21/32139 |
| | | | | 438/592 |
| 2015/0279853 | A1* | 10/2015 | Hall | H01L 29/42332 |
| | | | | 438/591 |
| 2015/0279854 | A1* | 10/2015 | Hall | H01L 21/31051 |
| | | | | 438/591 |
| 2015/0348786 | A1* | 12/2015 | Loiko | H01L 29/7883 |
| | | | | 257/316 |
| 2016/0049302 | A1* | 2/2016 | Grass | H01L 21/823857 |
| | | | | 257/369 |
| 2017/0004063 | A1* | 1/2017 | Broderick | G06F 11/3636 |
| 2017/0011967 | A1* | 1/2017 | Yeo | H01L 21/26513 |
| 2017/0194333 | A1* | 7/2017 | Wu | H01L 29/517 |
| 2017/0194335 | A1* | 7/2017 | Wu | H01L 29/4916 |
| 2017/0194344 | A1* | 7/2017 | Wu | H01L 29/40117 |
| 2017/0194493 | A1* | 7/2017 | Kwon | H01L 29/1608 |
| 2017/0213838 | A1* | 7/2017 | Li | H01L 27/11536 |
| 2017/0271476 | A1* | 9/2017 | Jang | H01L 21/265 |
| 2019/0006377 | A1* | 1/2019 | Leobandung | H01L 29/66825 |
| 2019/0027486 | A1* | 1/2019 | Wu | H01L 21/823468 |

* cited by examiner

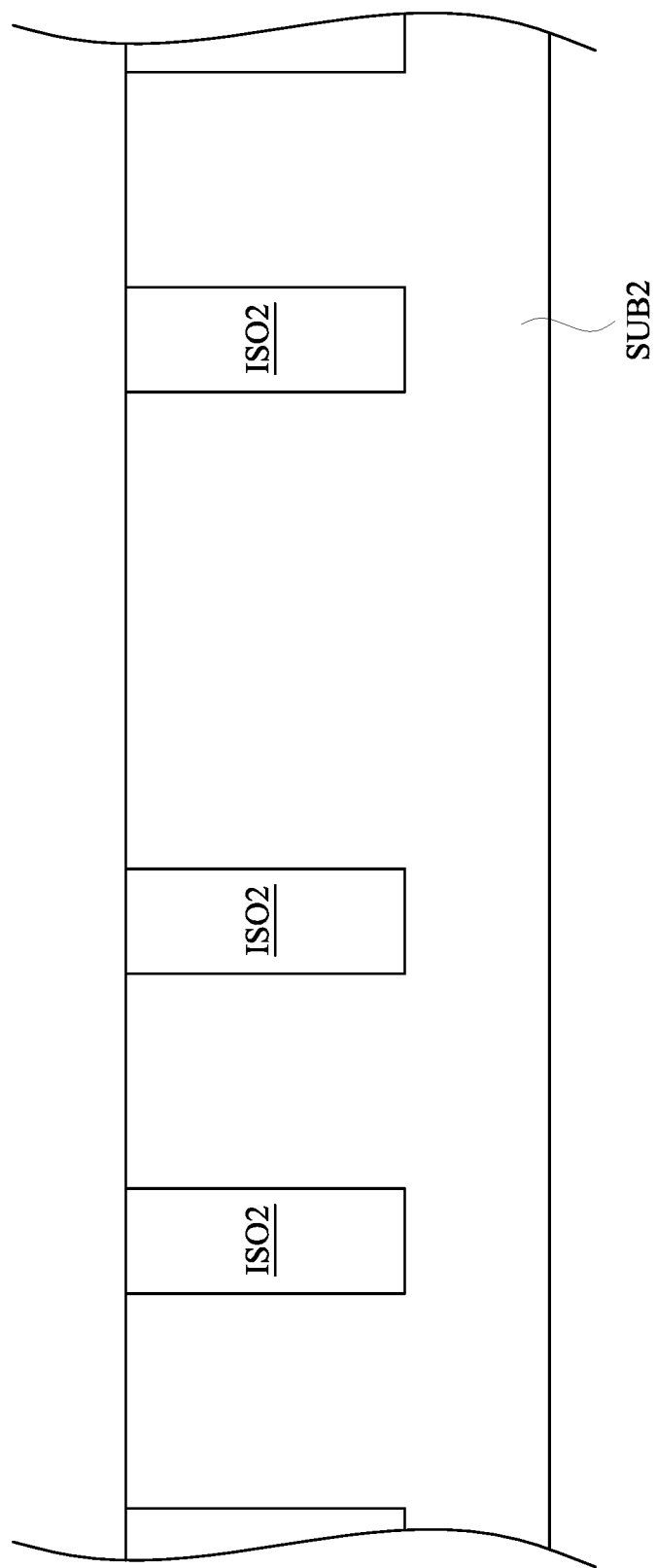

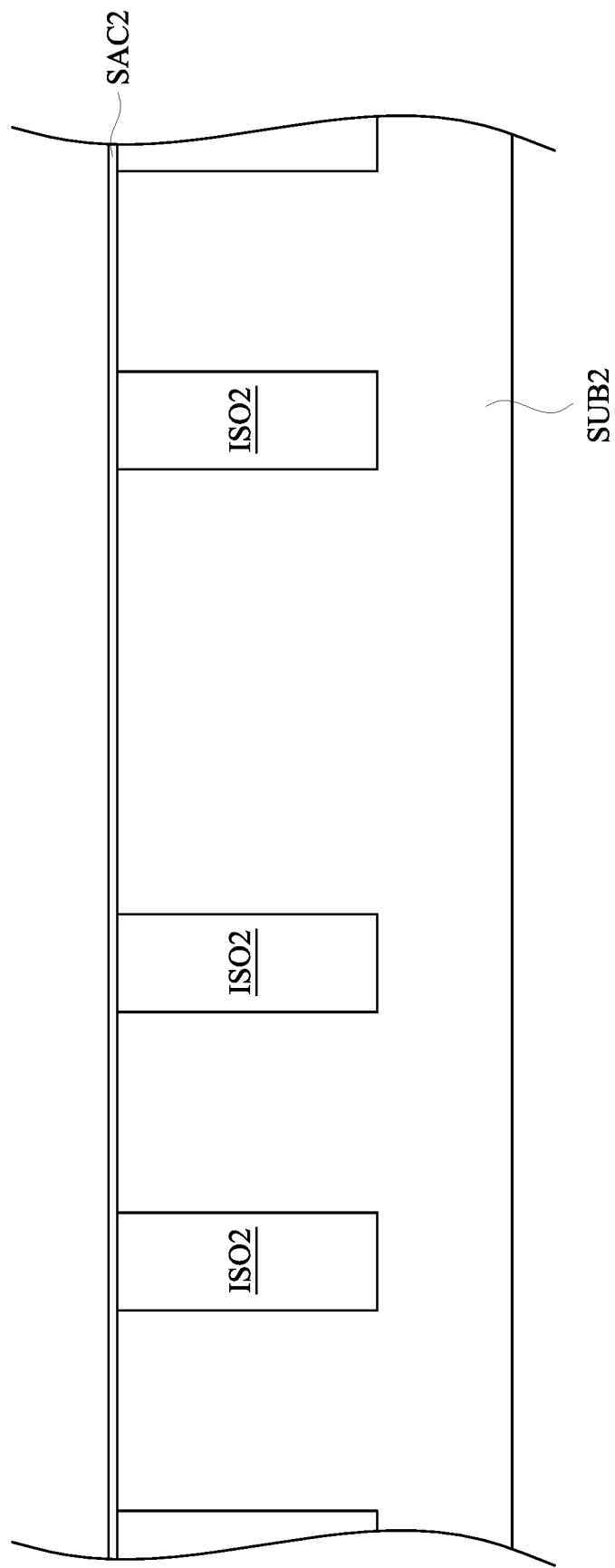
Fig. 2C(1)

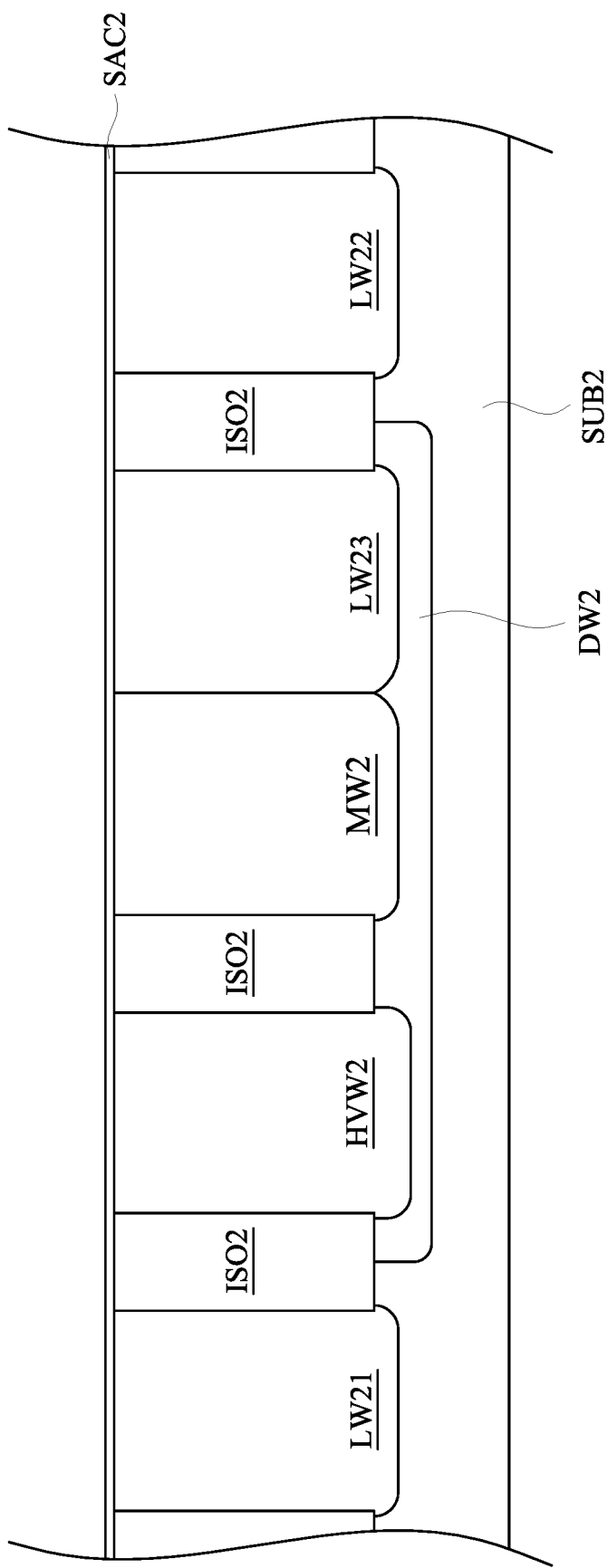
Fig. 2C(2)

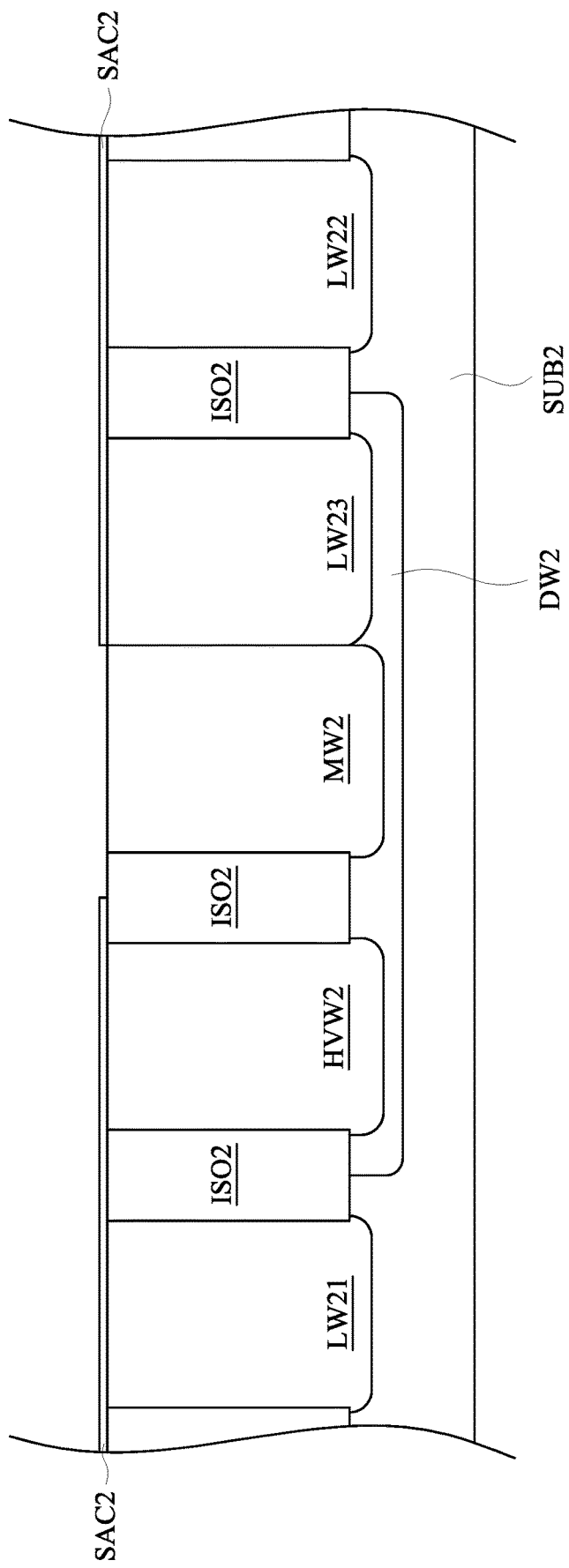
Fig. 2C(3)

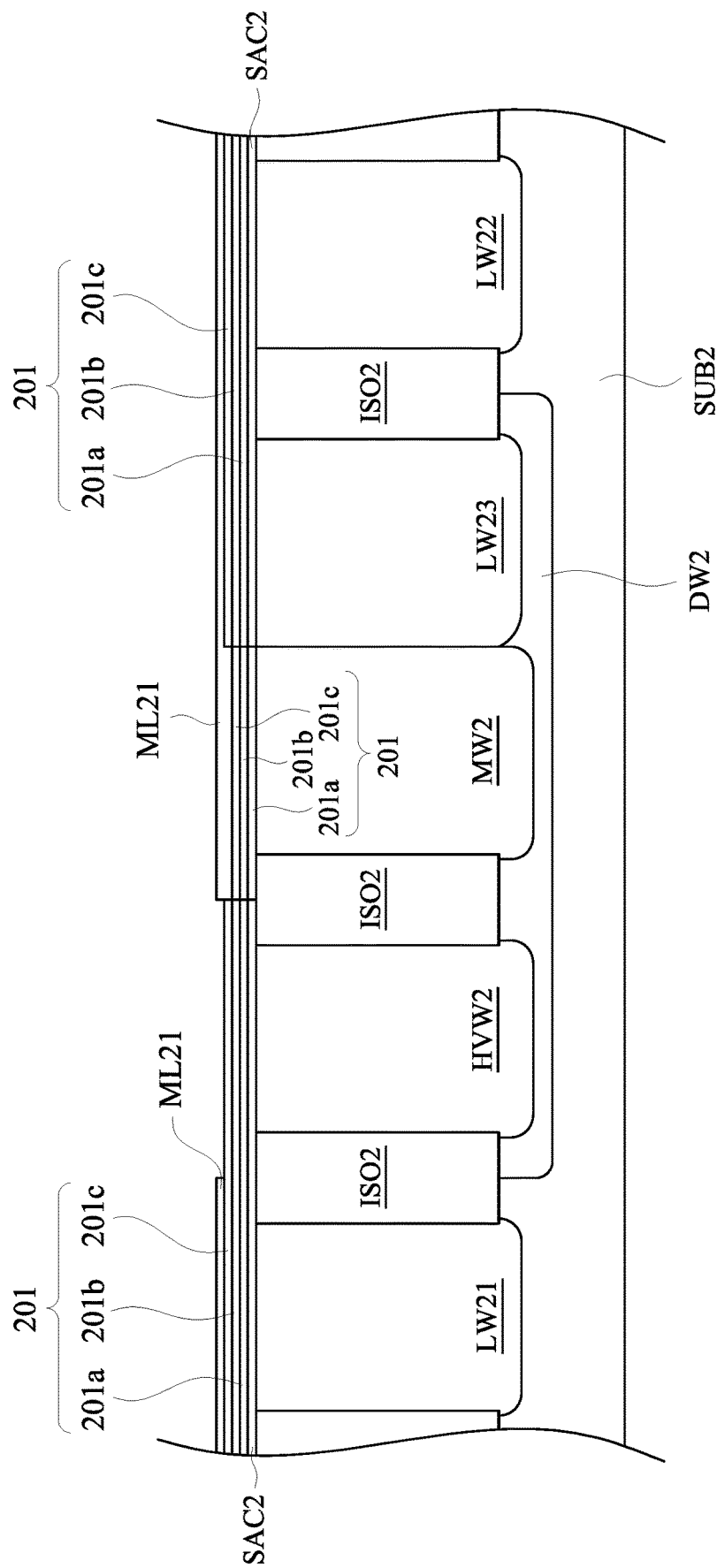
Fig. 2E(1)

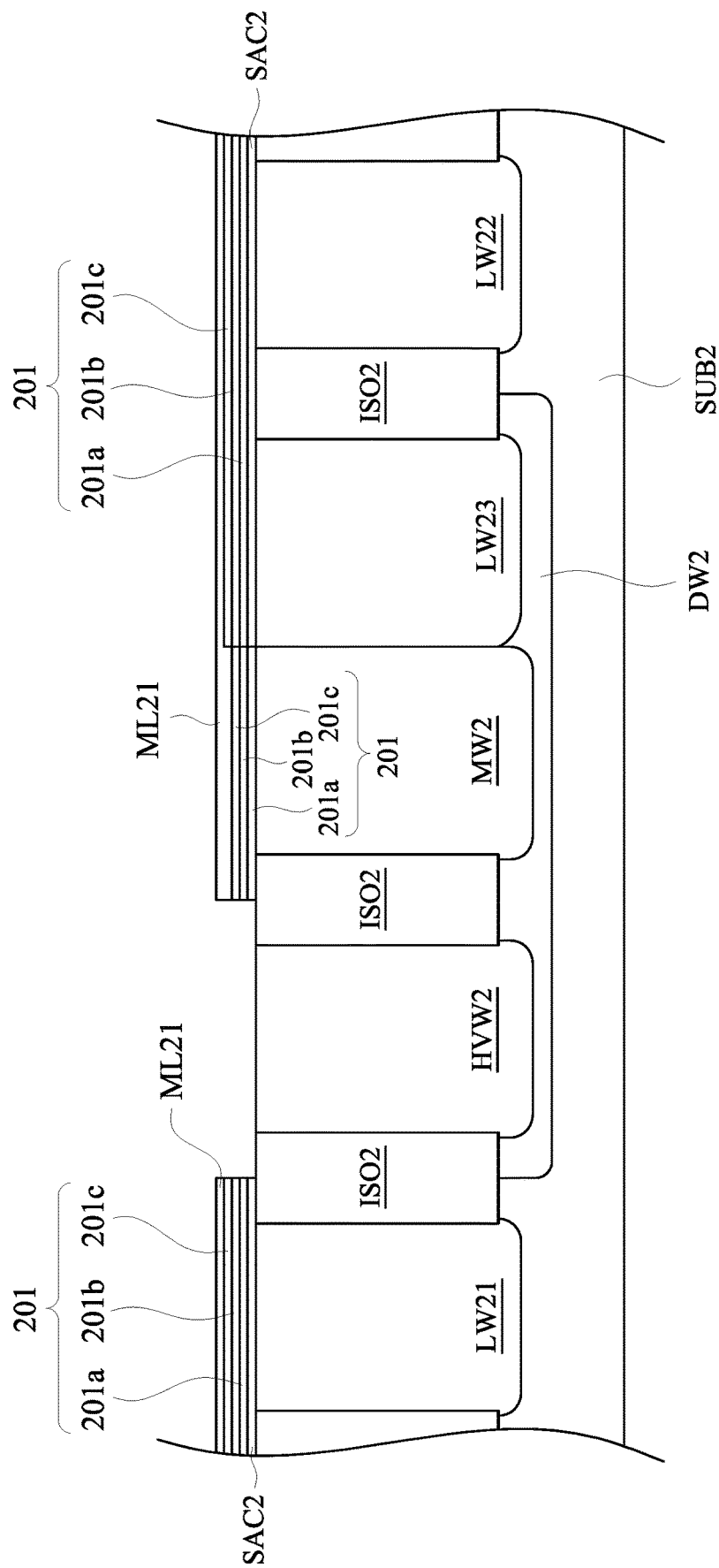
Fig. 2E(2)

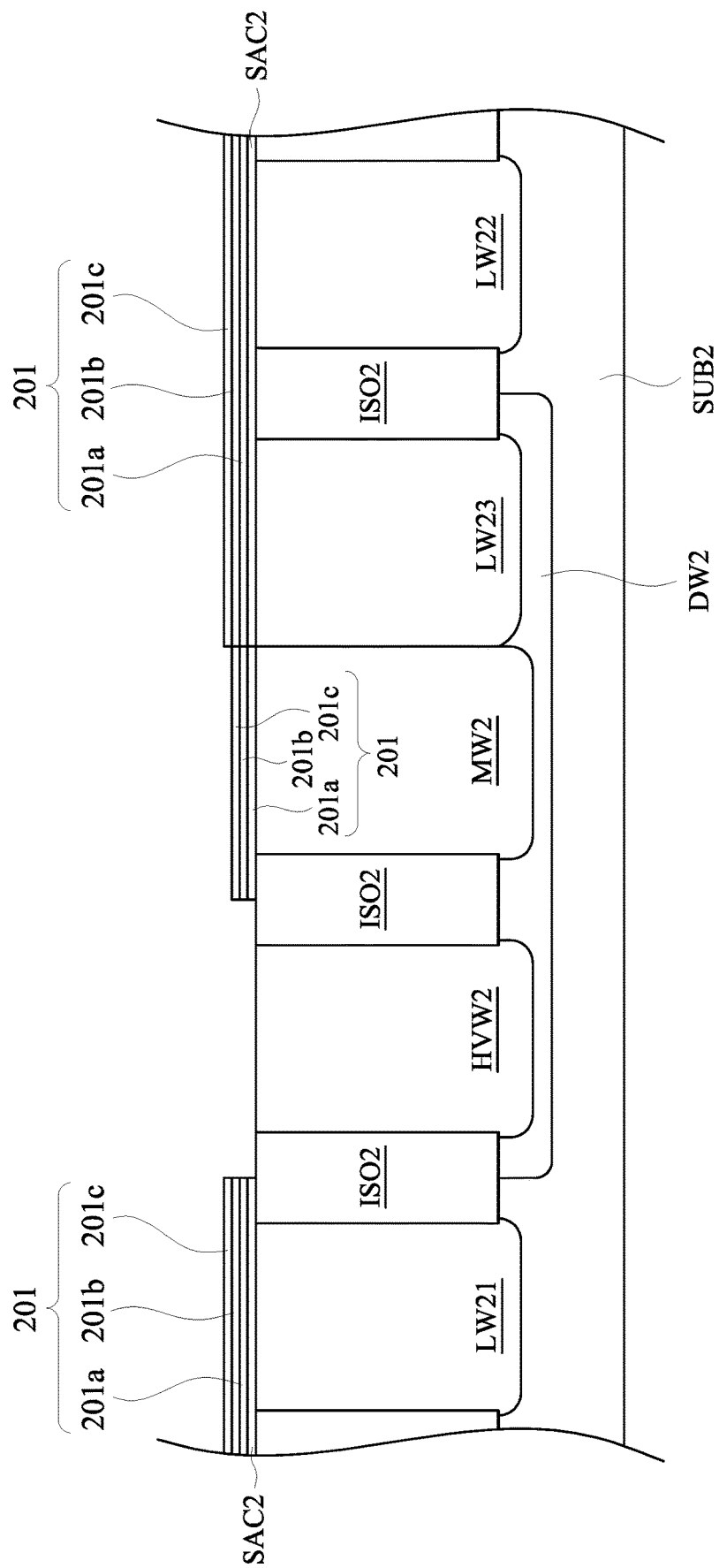
Fig. 2E(3)

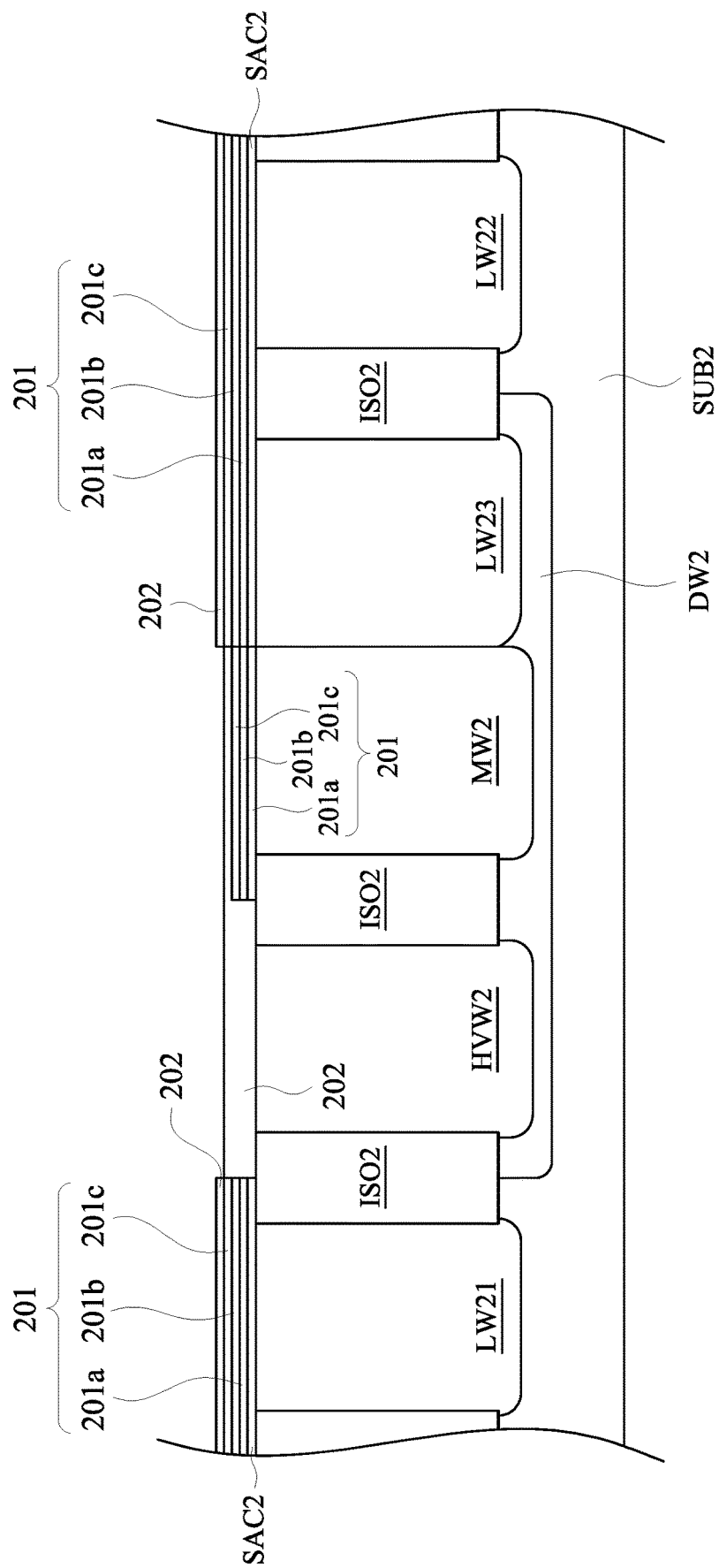
Fig. 2E(4)

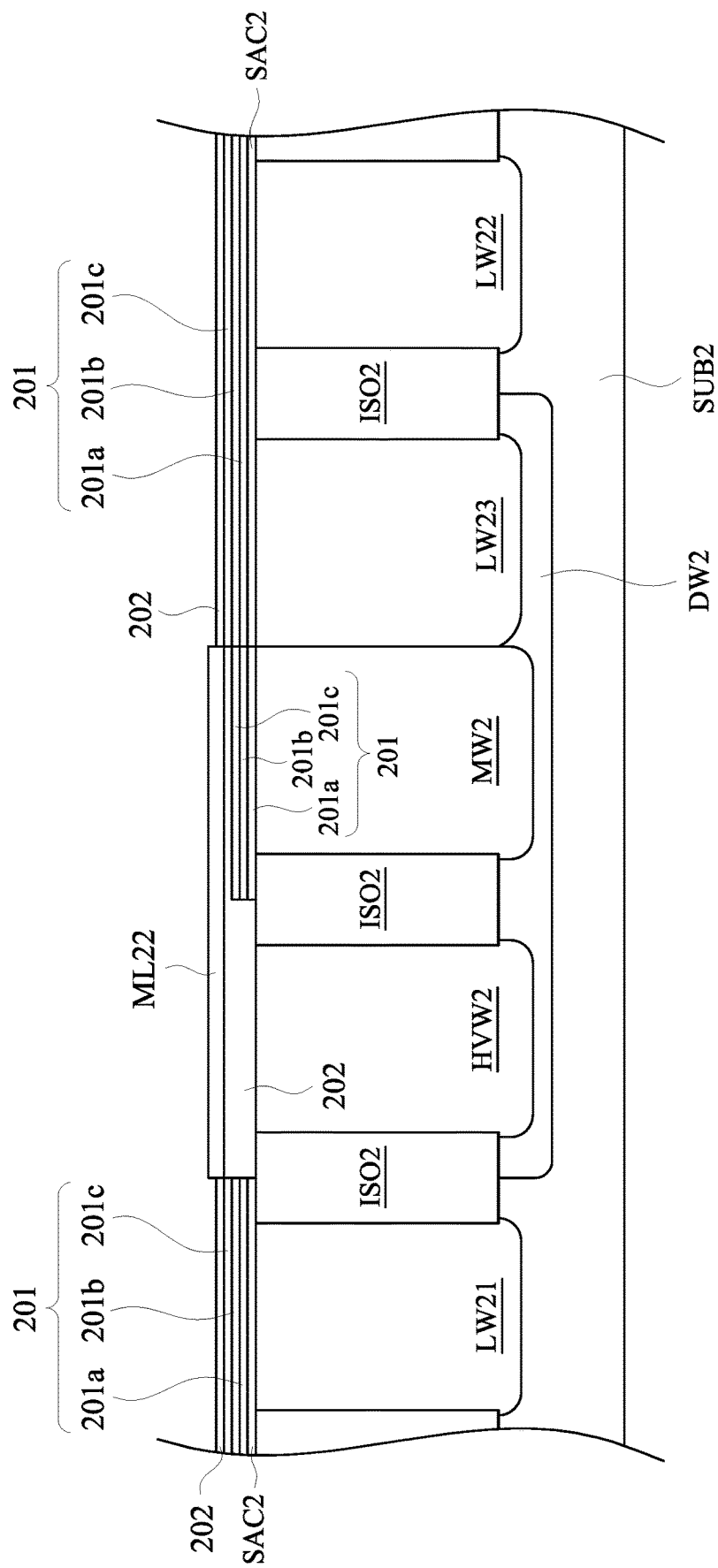
Fig. 2E(5)

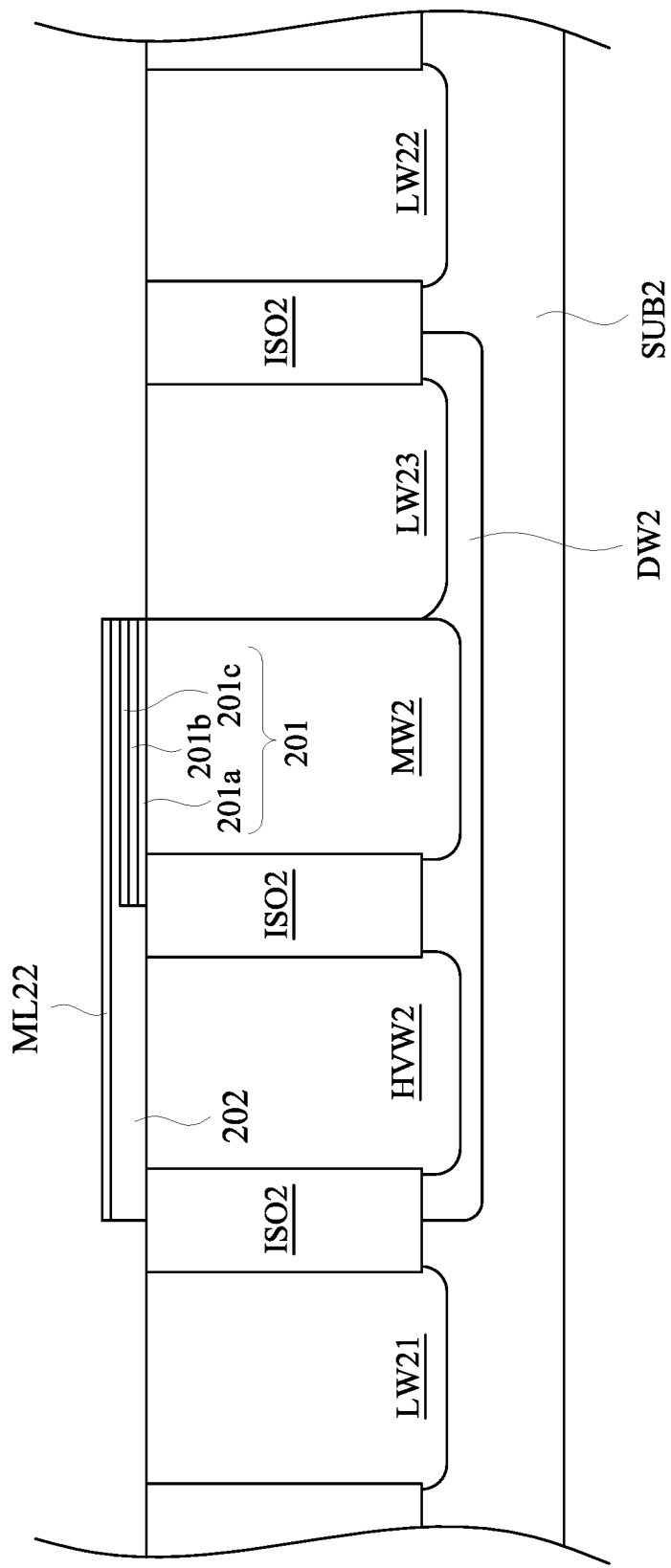
Fig. 2E(6)

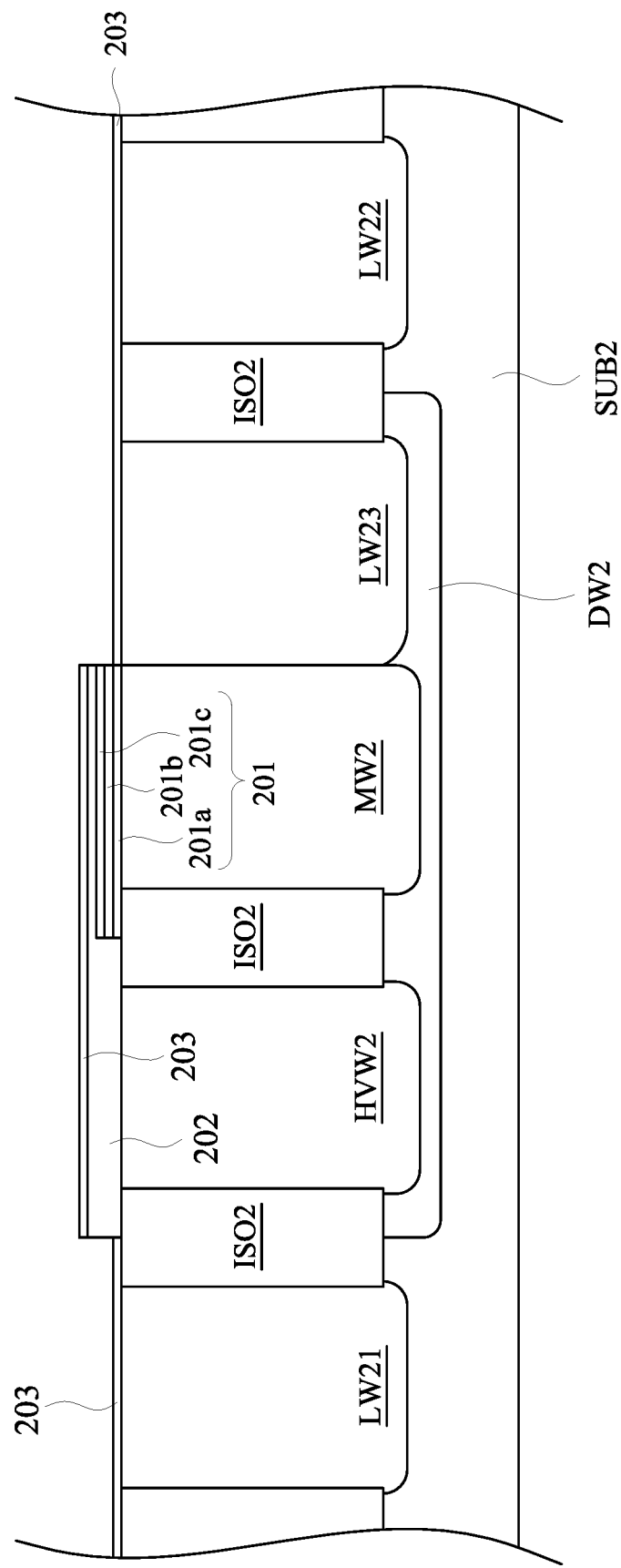
Fig. 2E(7)

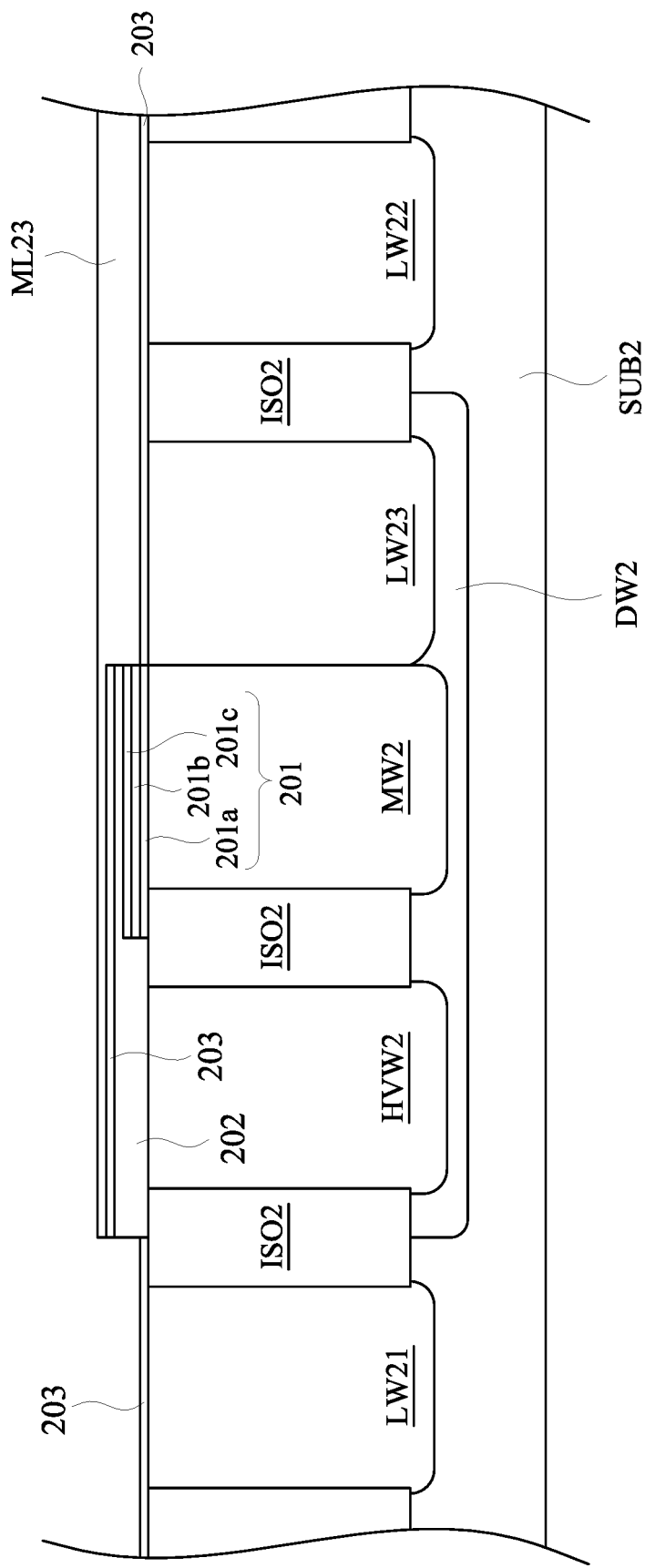
Fig. 2F(1)

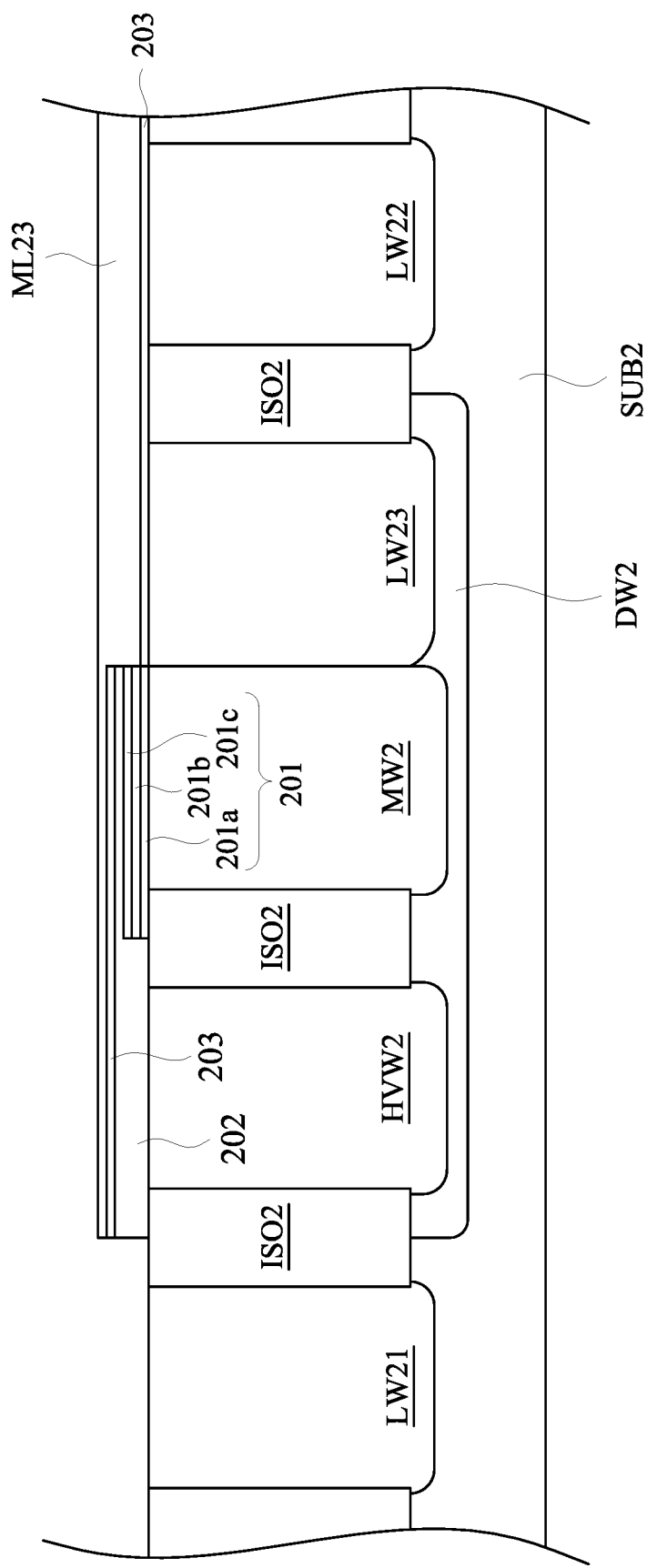
Fig. 2F(2)

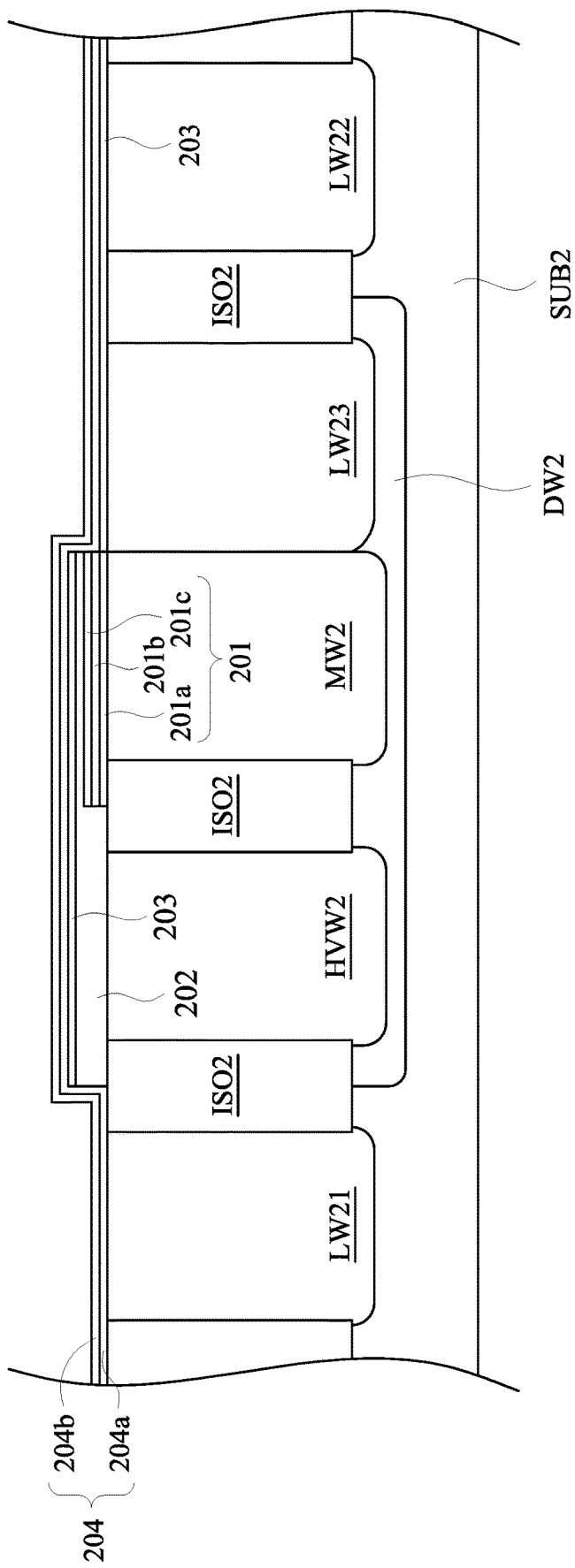
Fig. 2F(3)

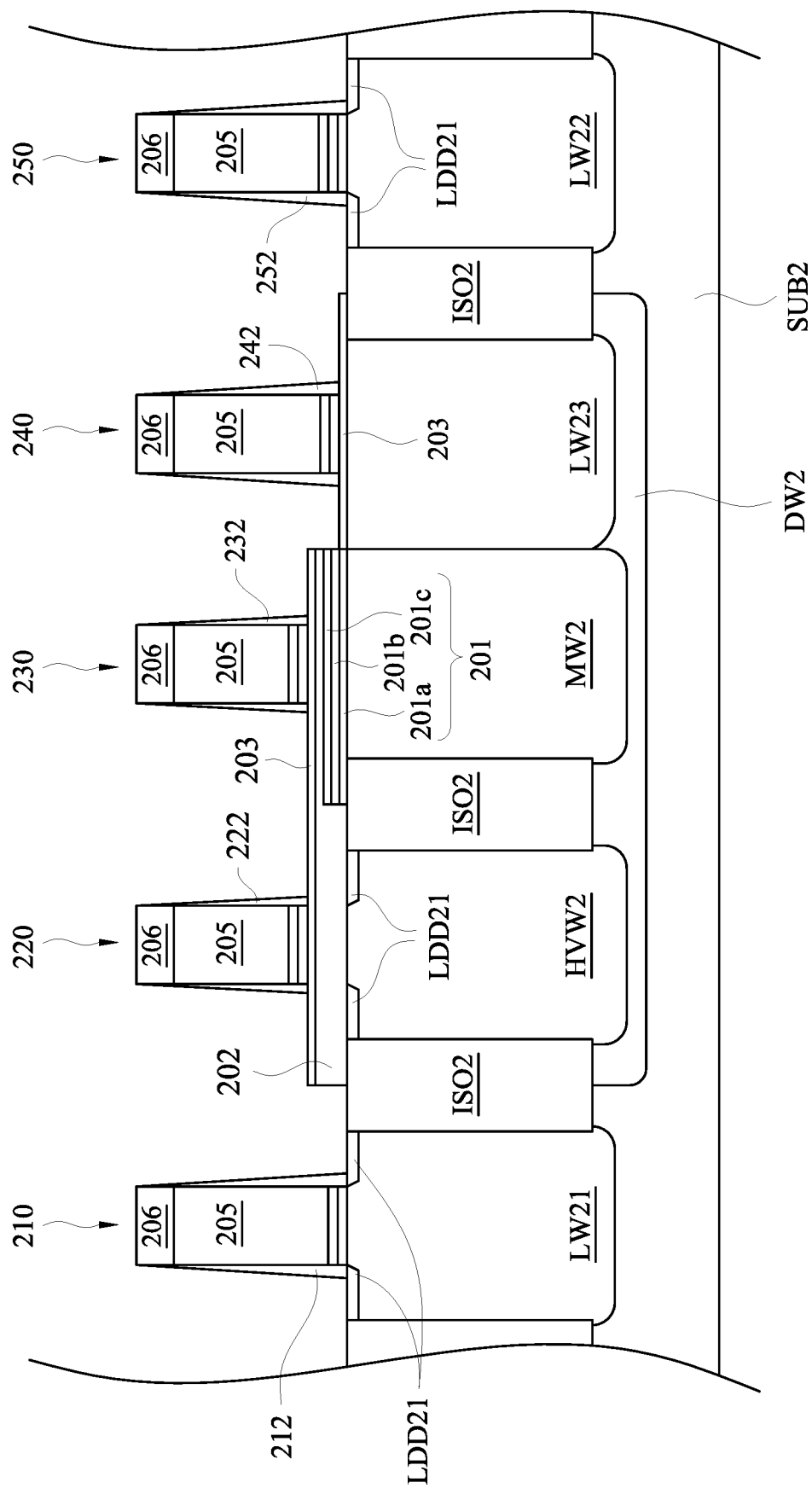
Fig. 2J(1)

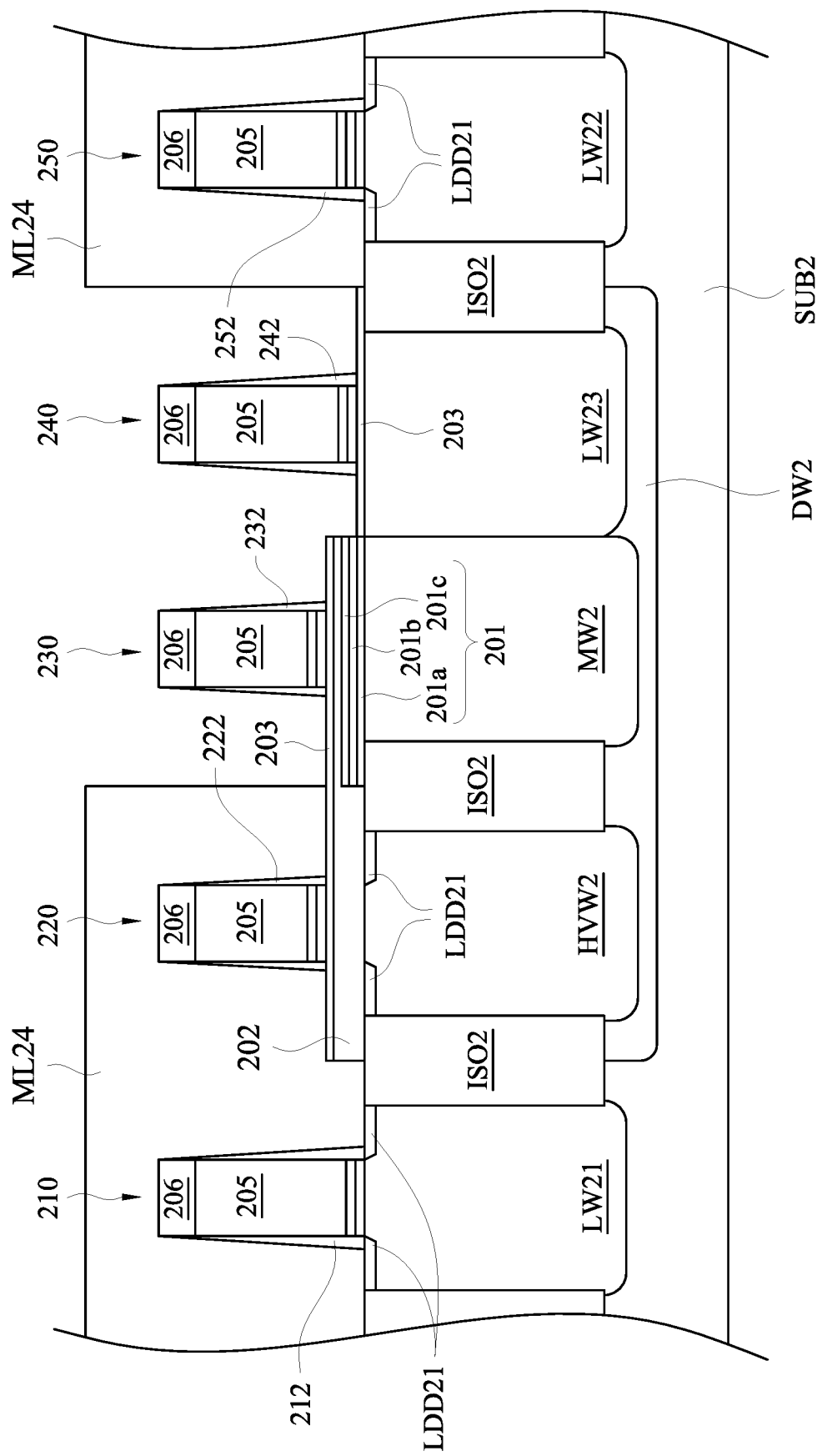
Fig. 2J(2)

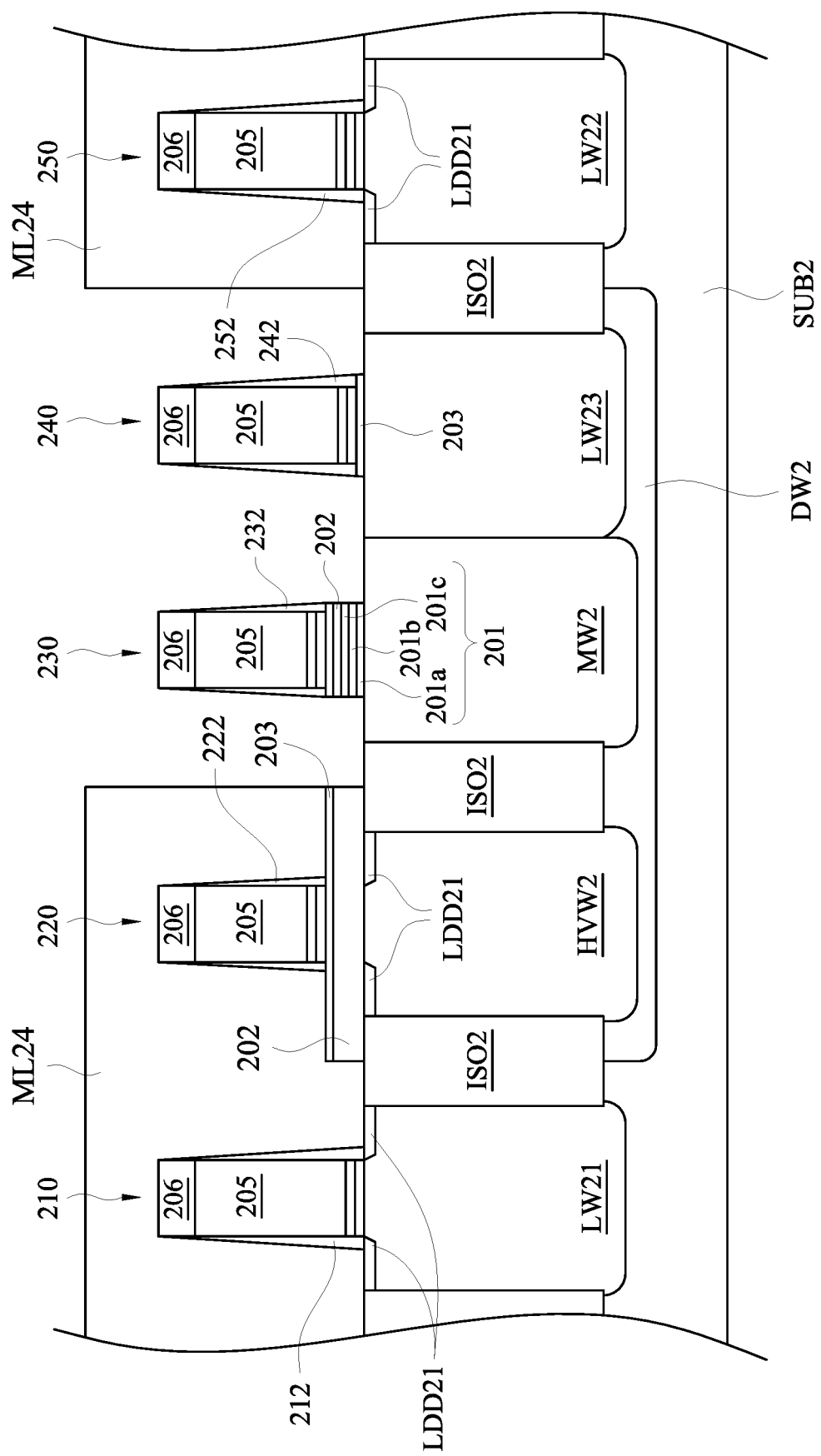
Fig. 2J(3)

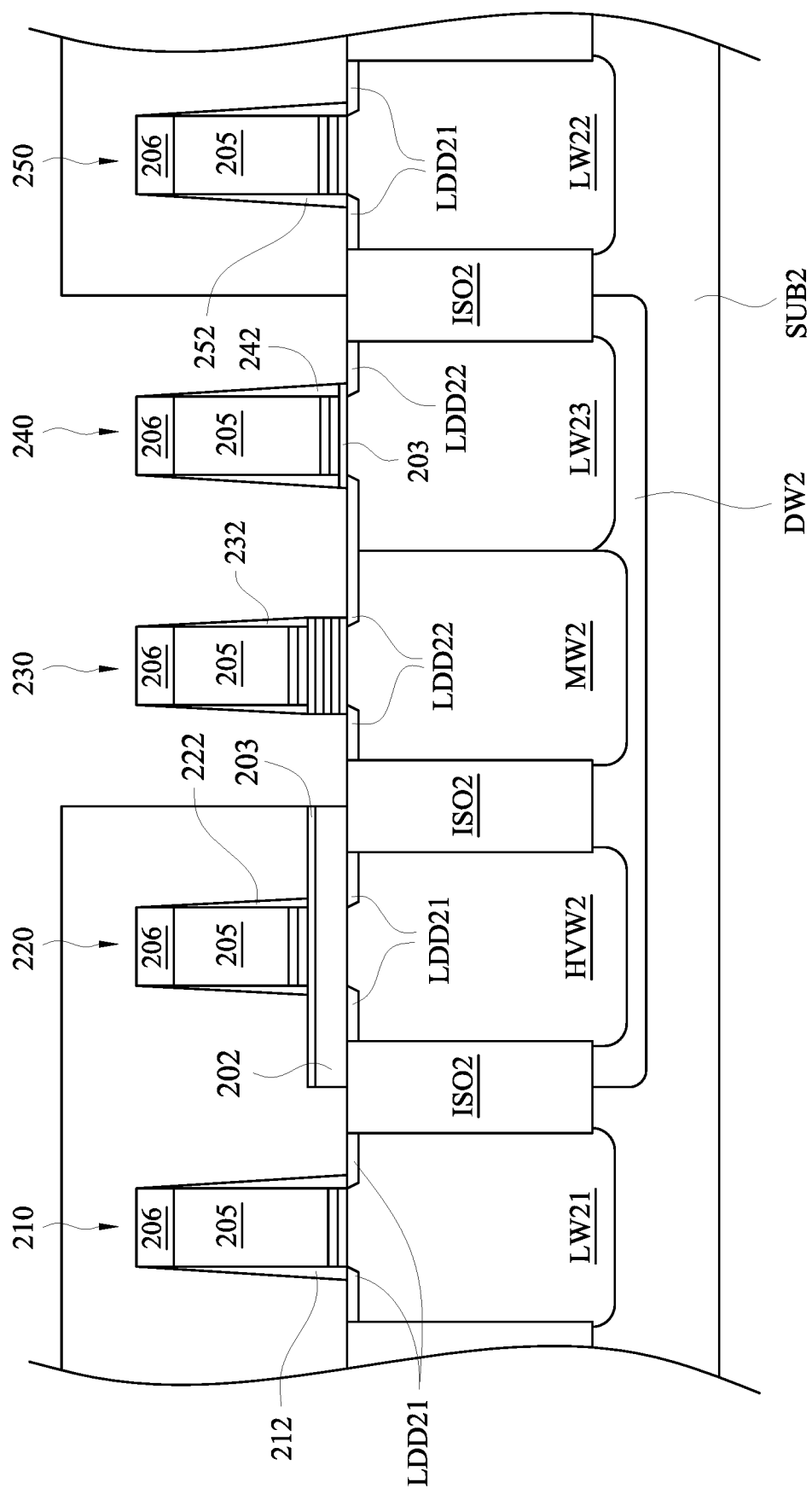
Fig. 2J(4)

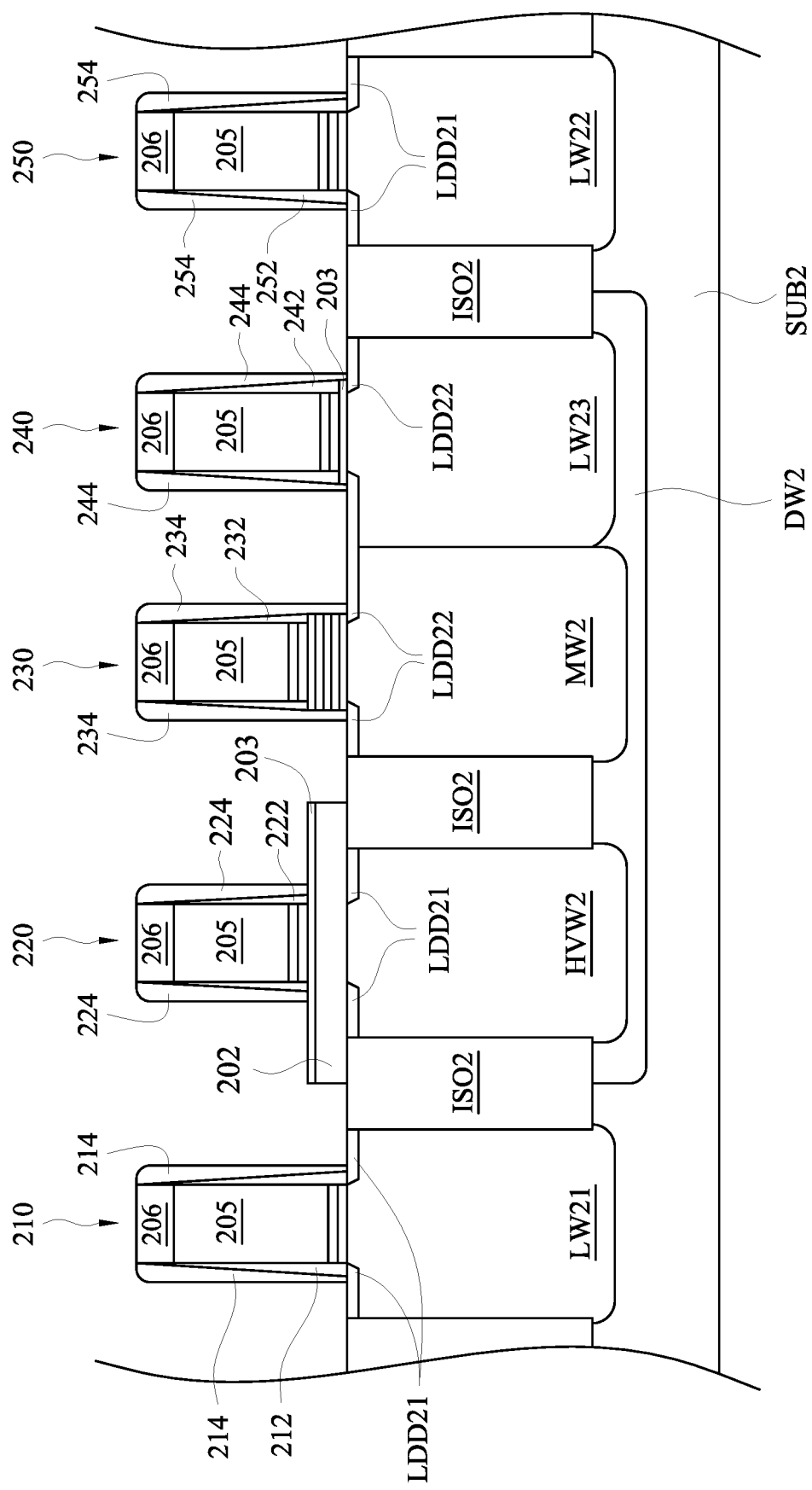
Fig. 2J(5)

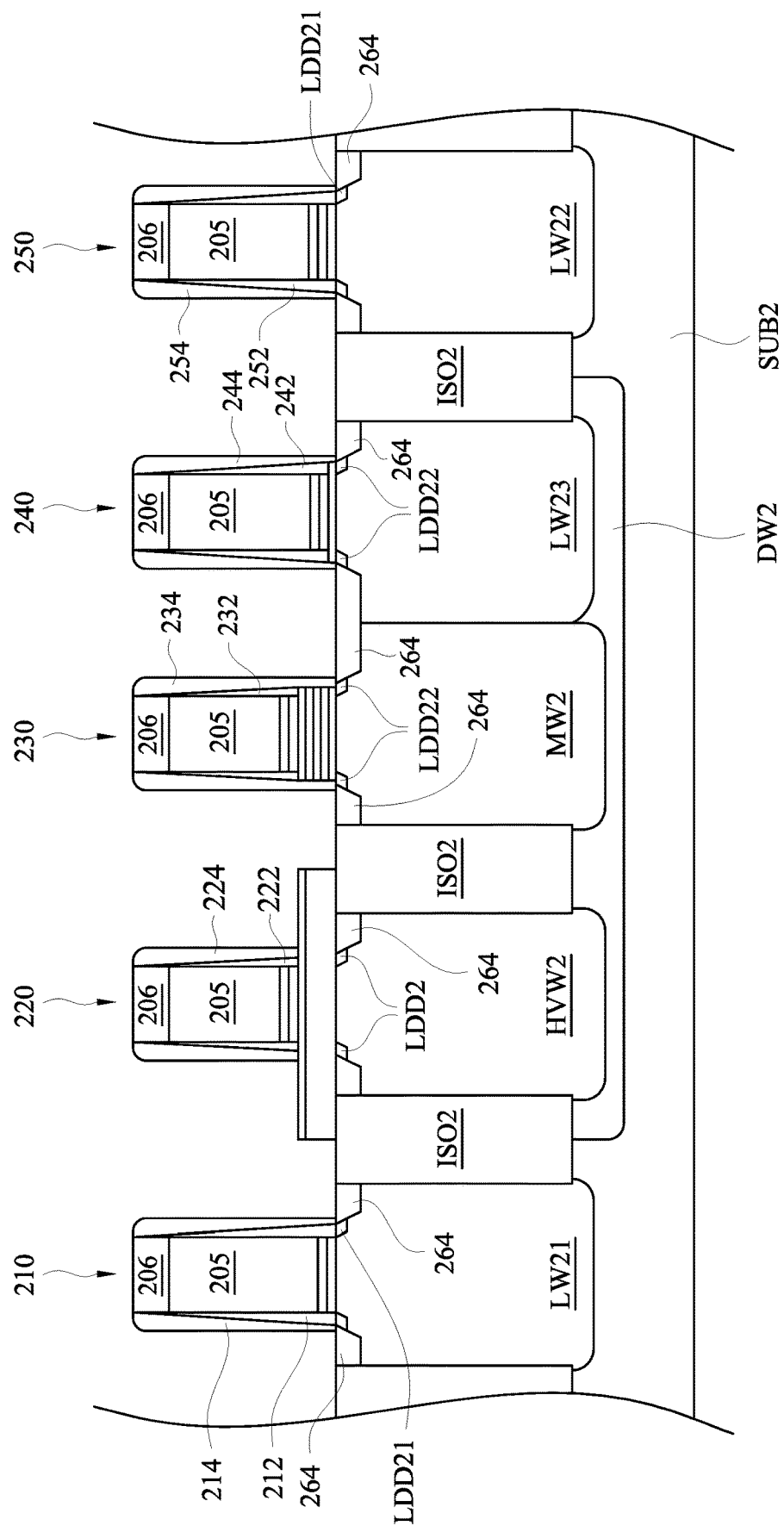
Fig. 2J(6)

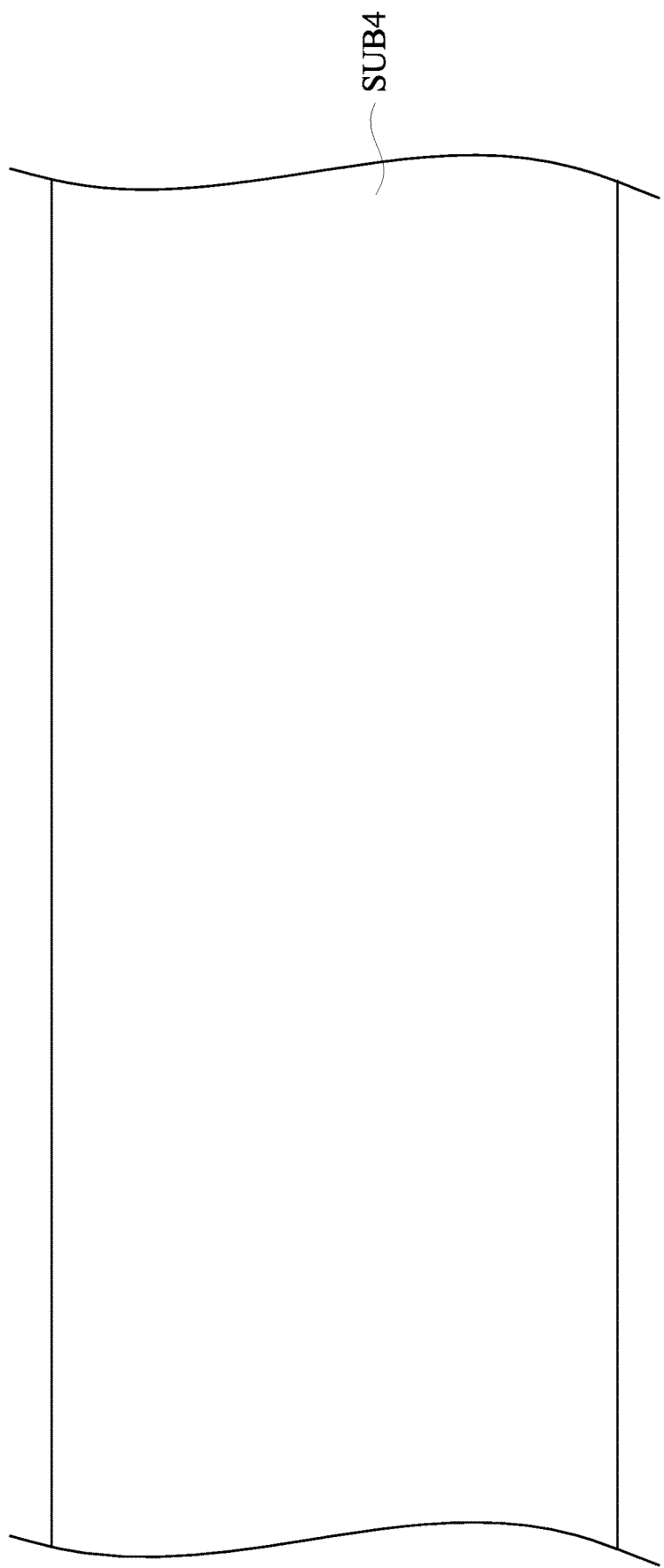

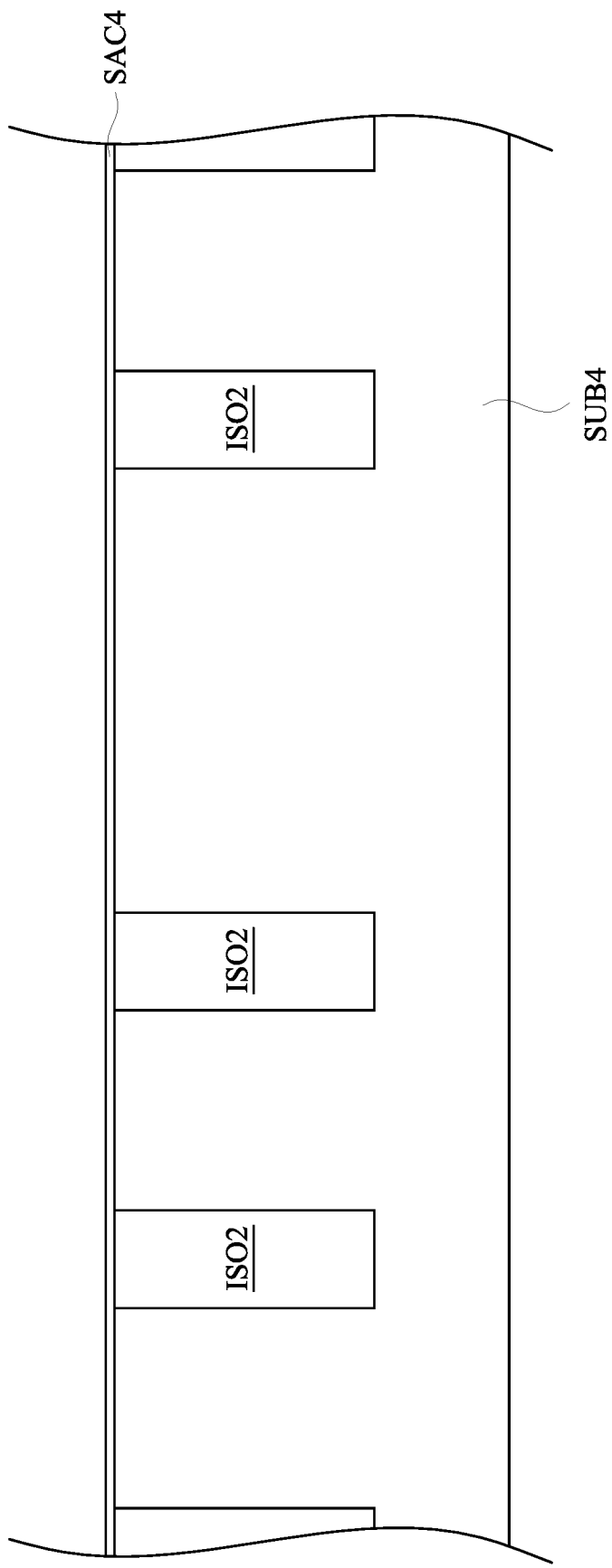
Fig. 4C(1)

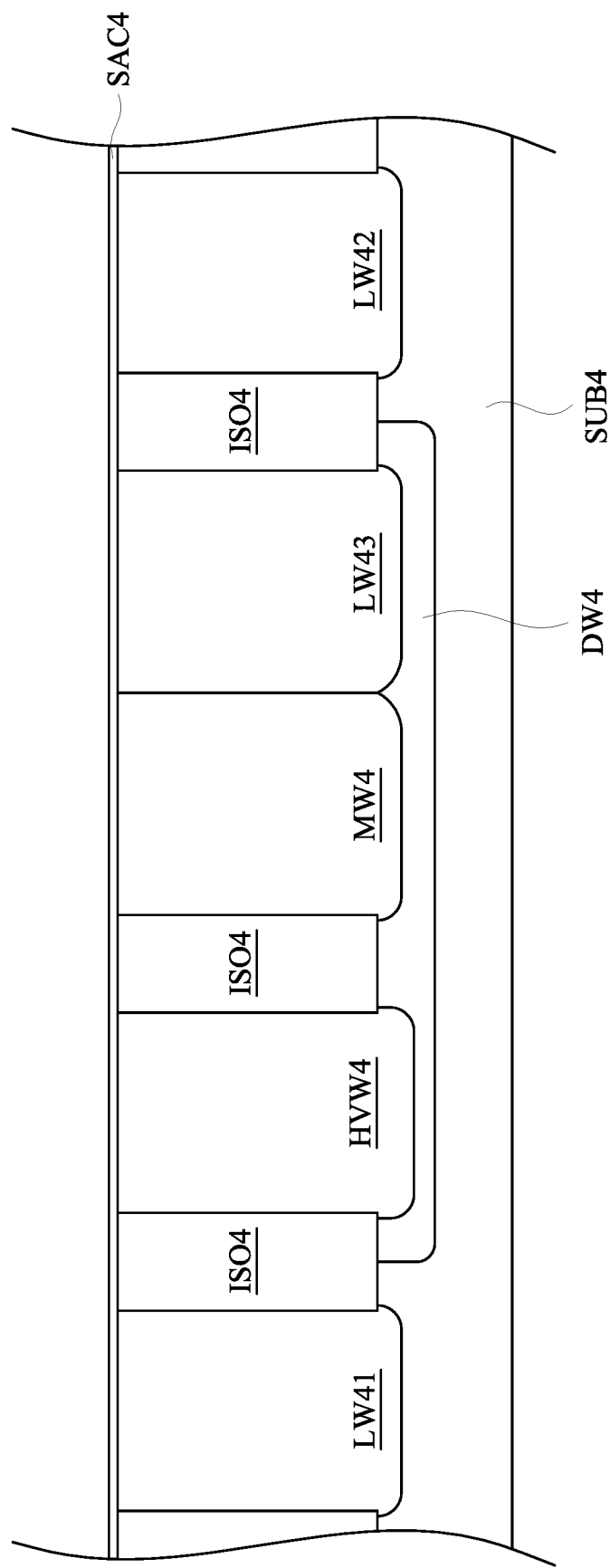
Fig. 4C(2)

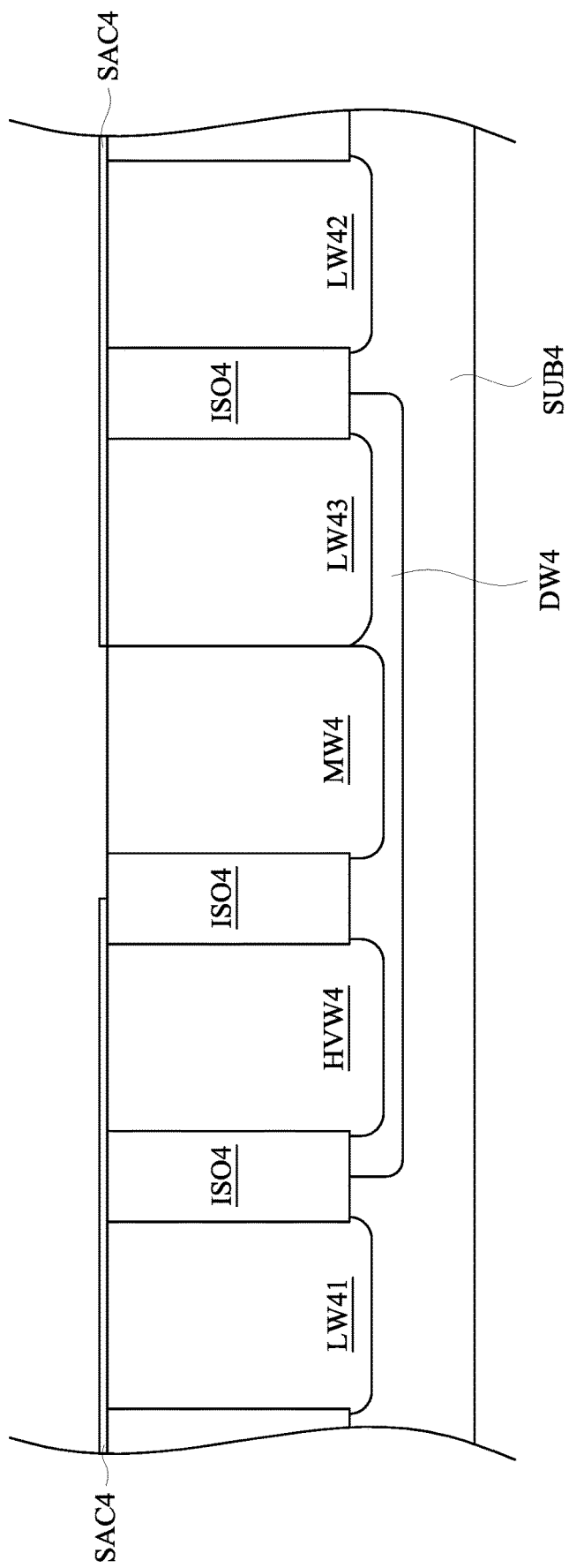
Fig. 4C(3)

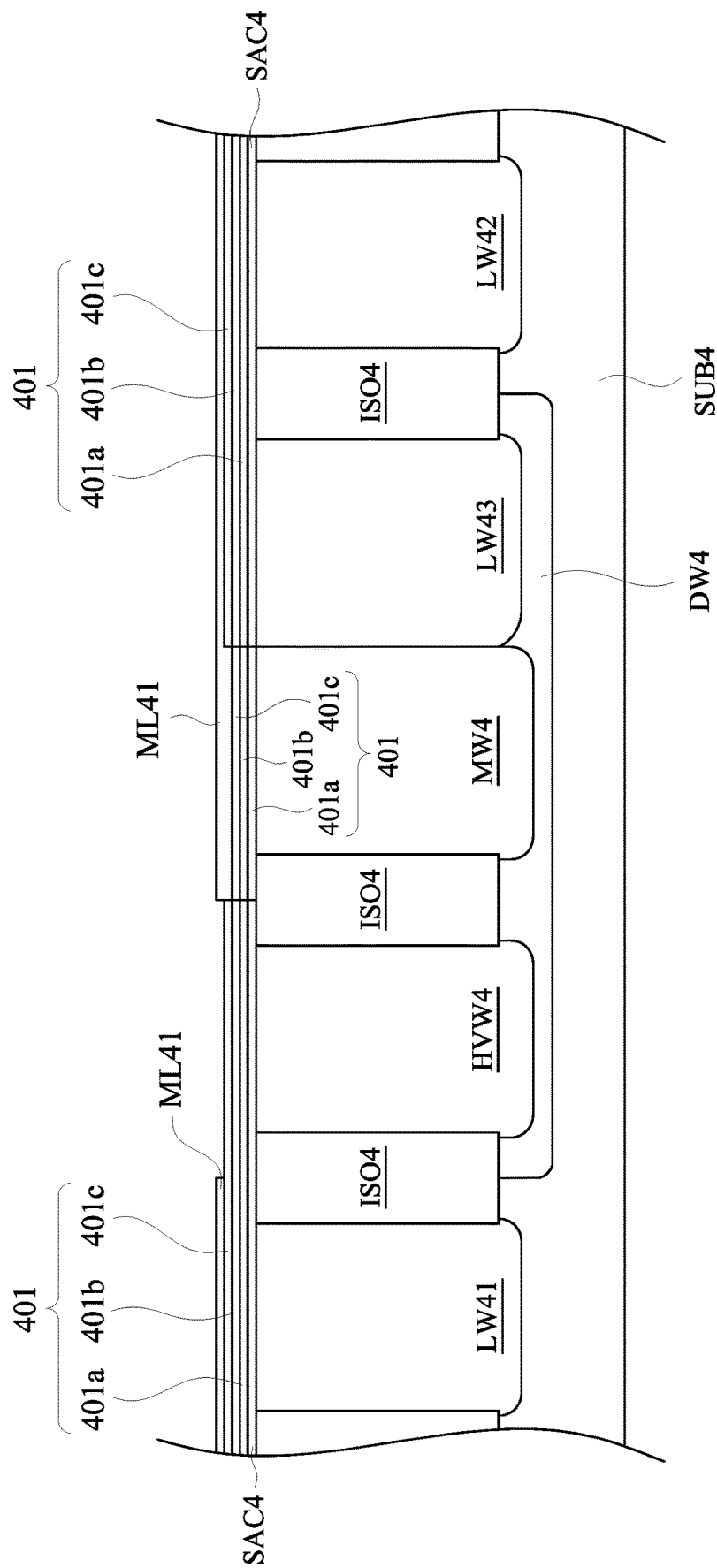
Fig. 4E(1)

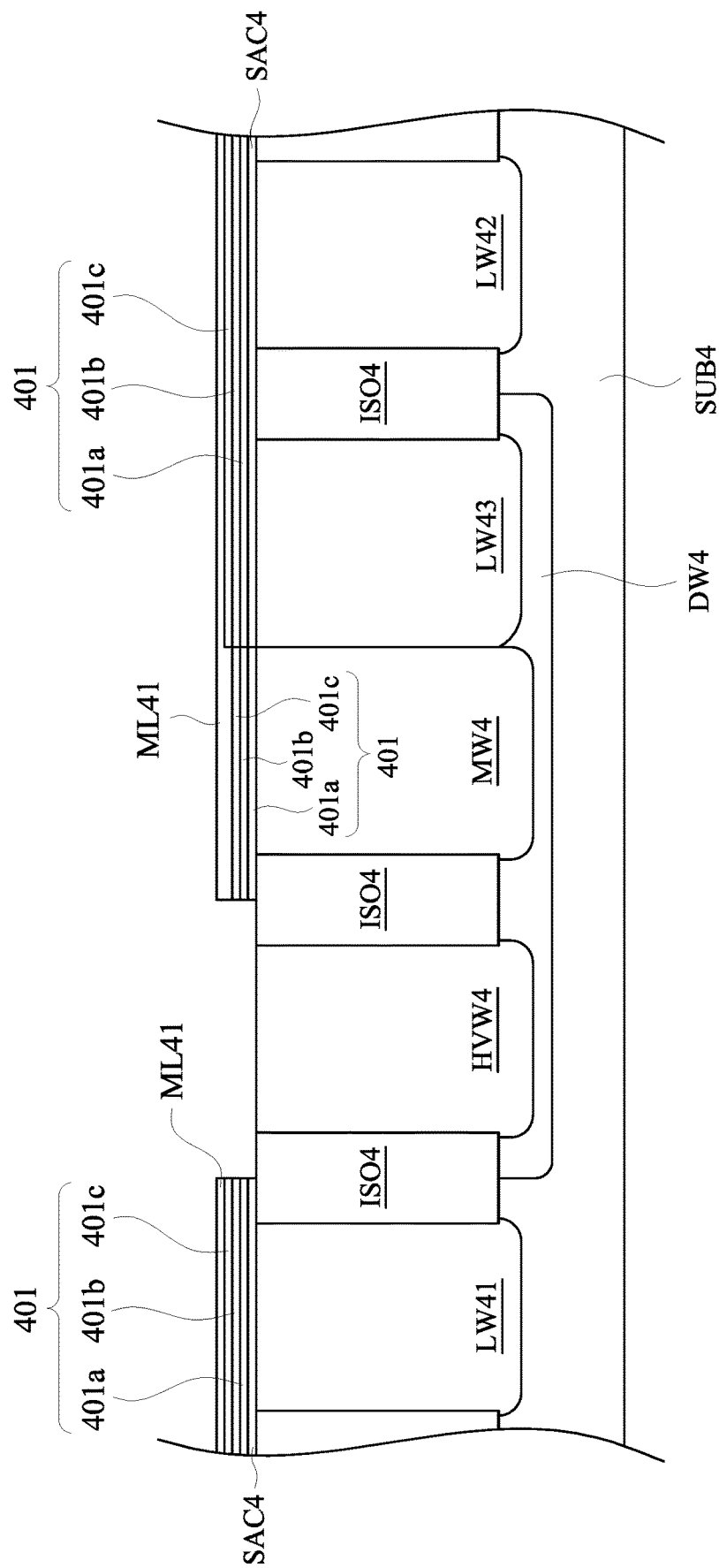
Fig. 4E(2)

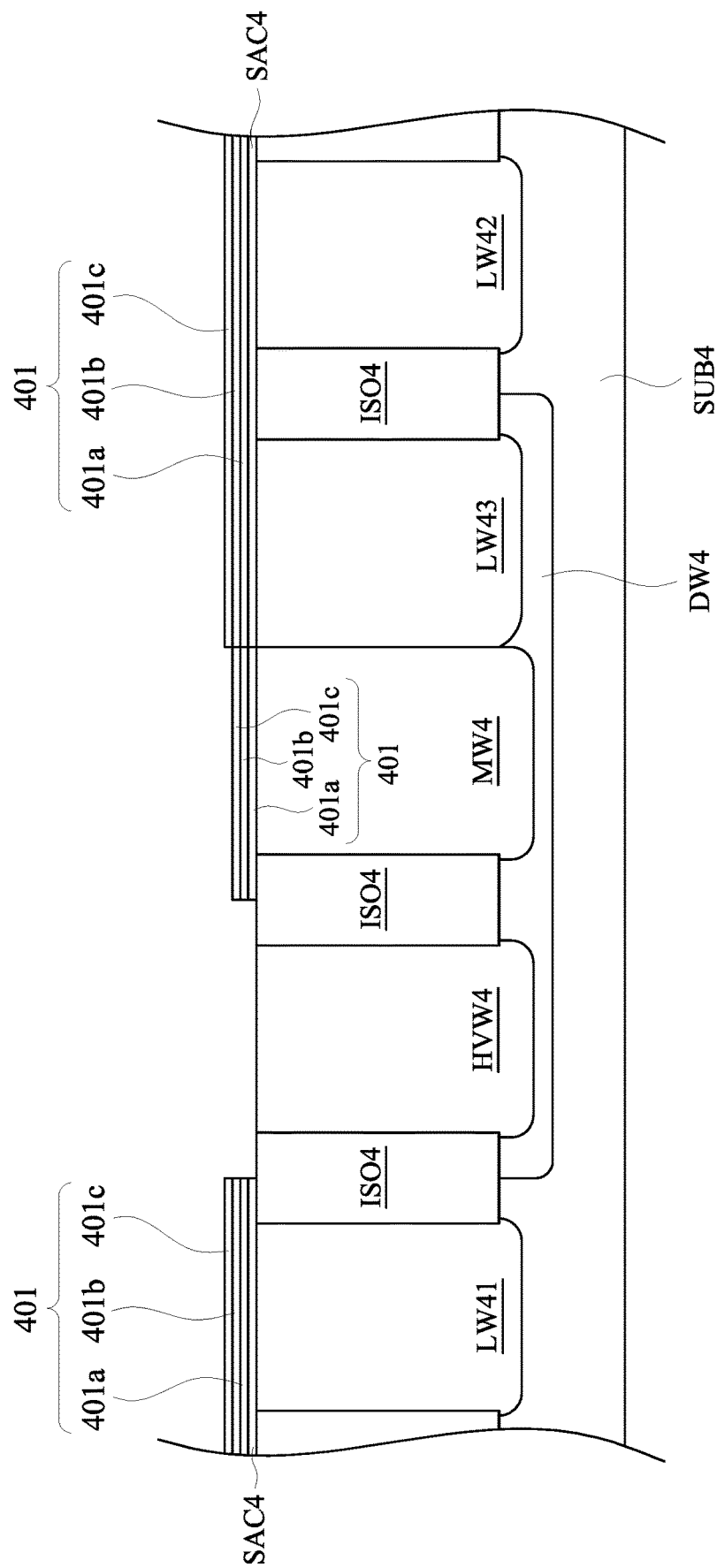
Fig. 4E(3)

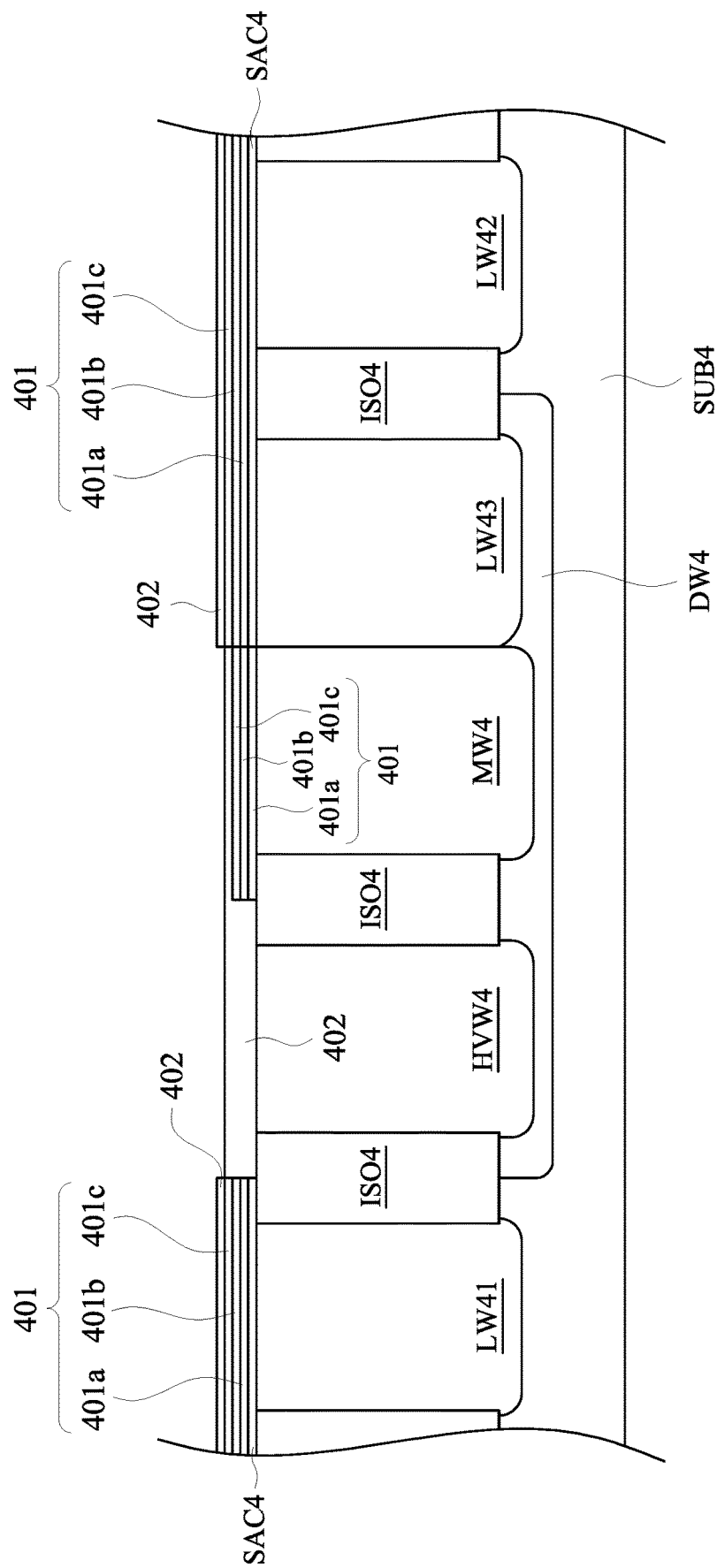
Fig. 4E(4)

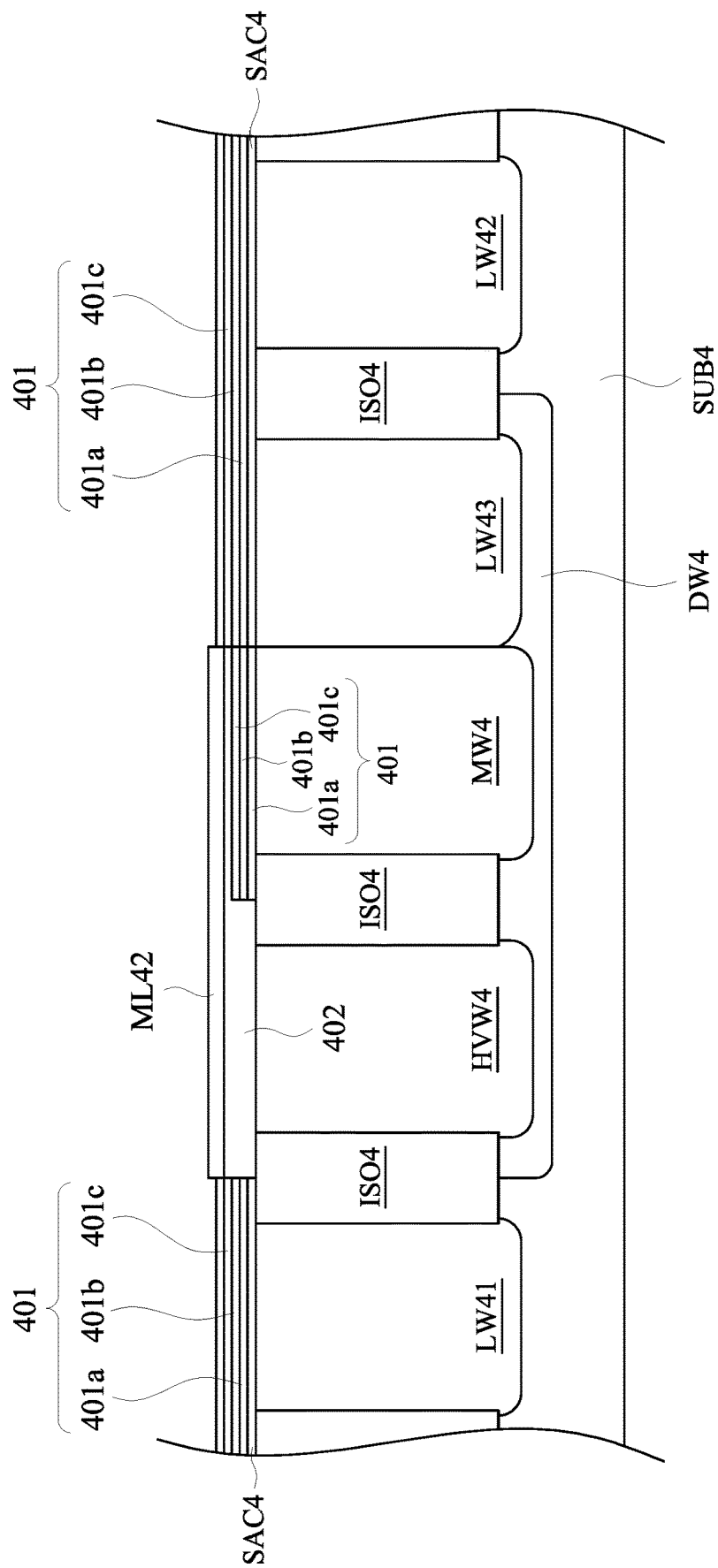
Fig. 4E(5)

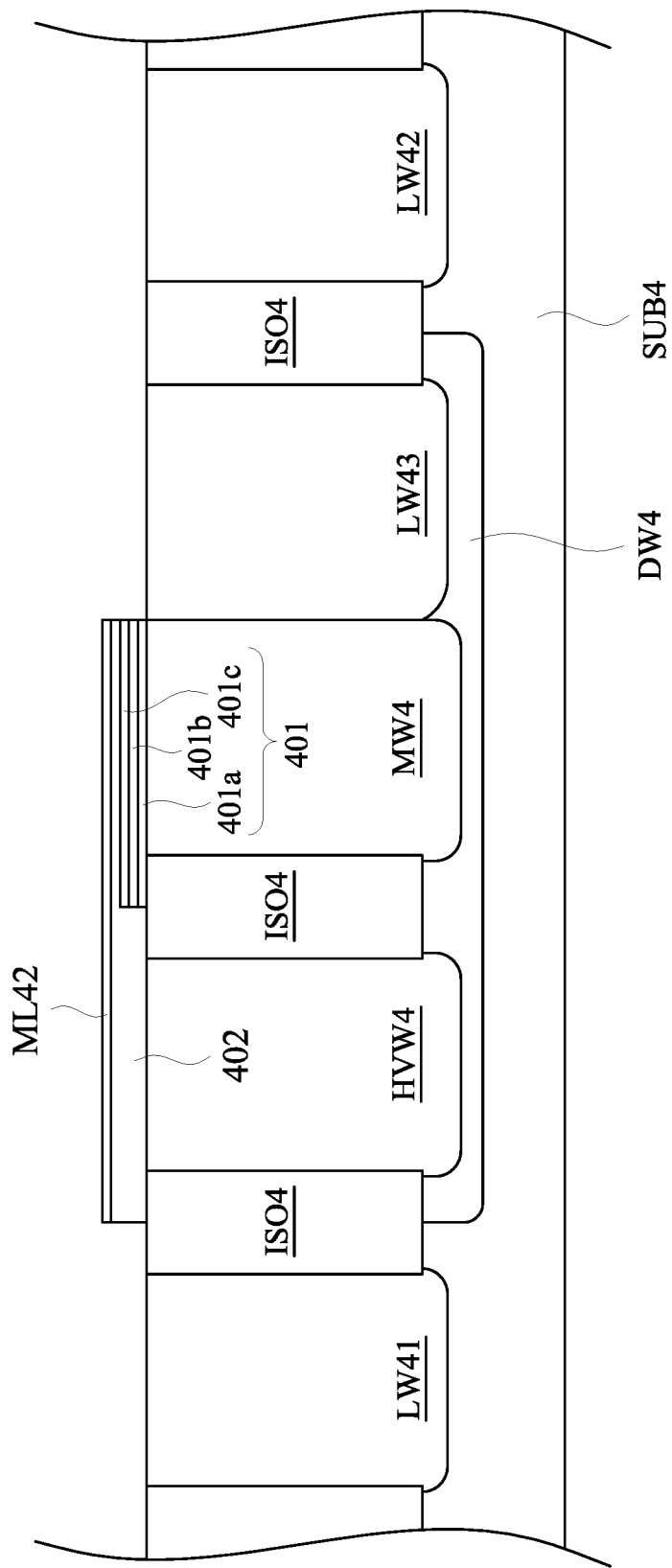
Fig. 4E(6)

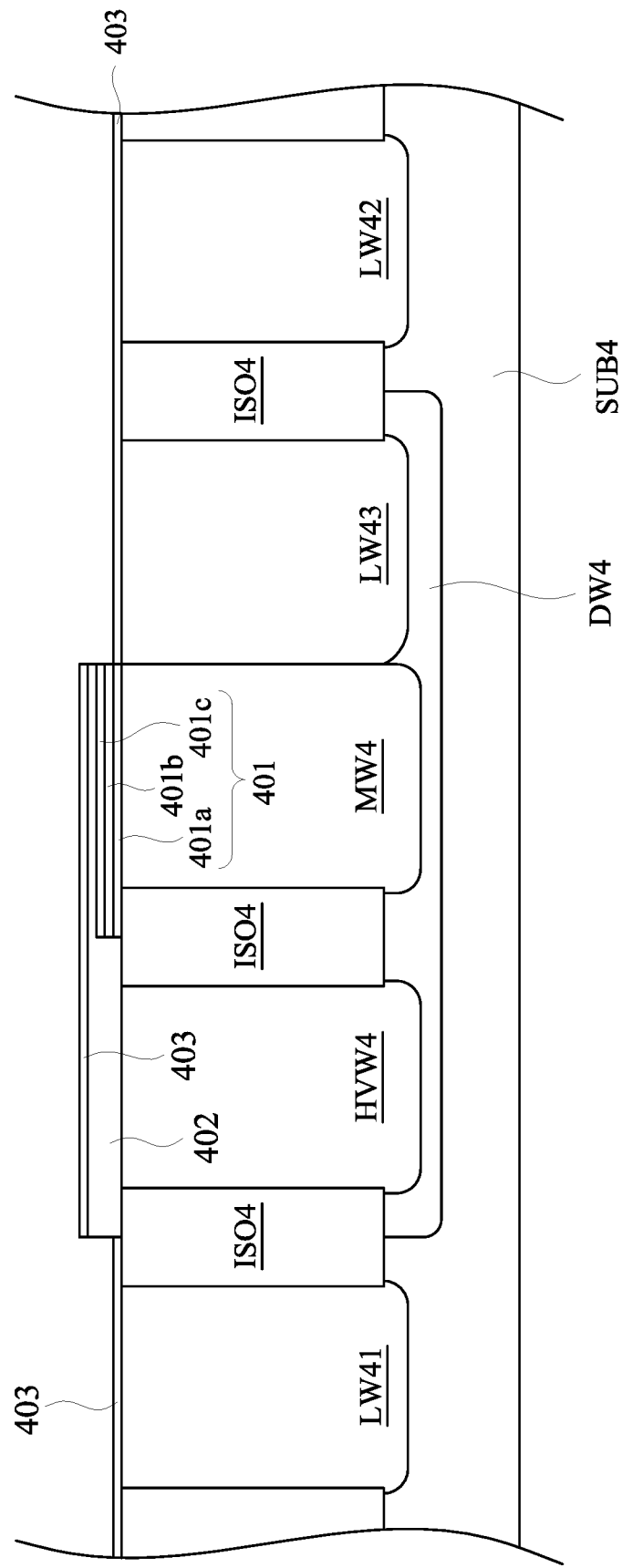
Fig. 4E(7)

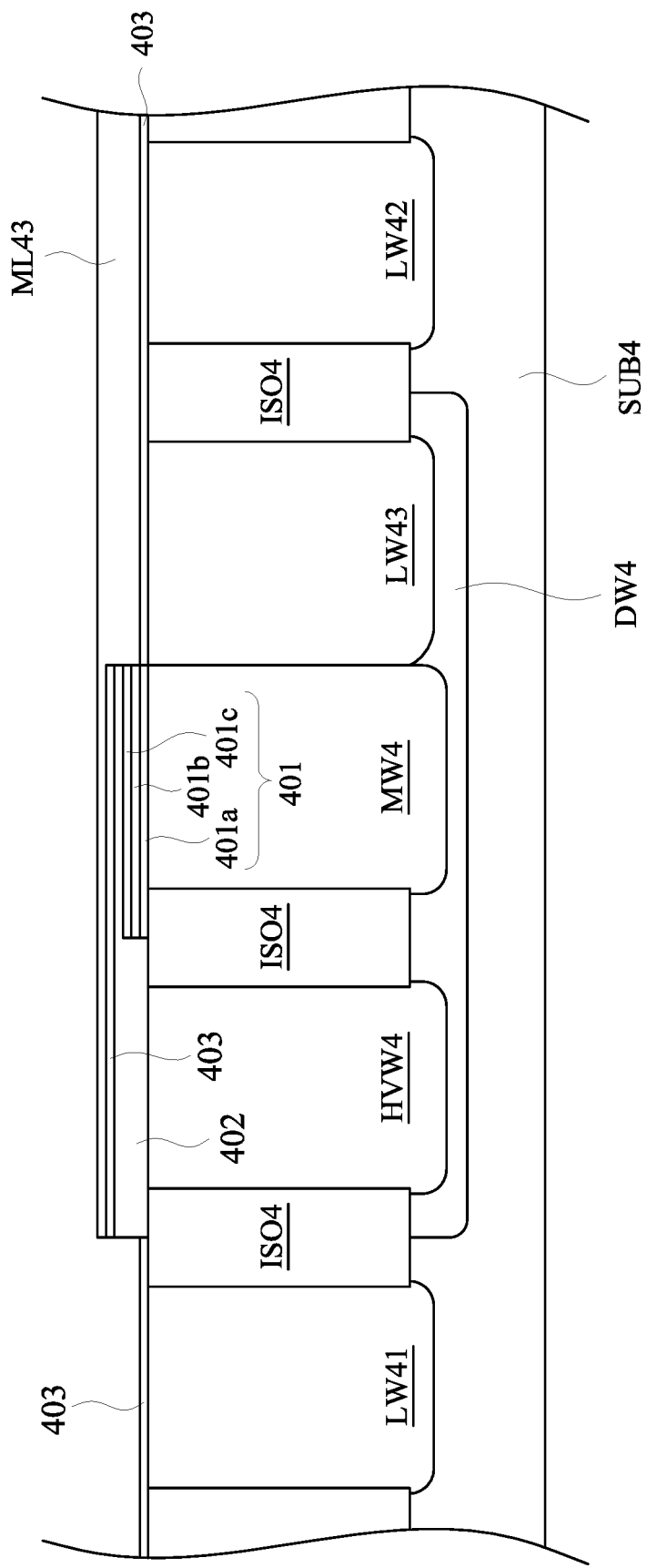
Fig. 4F(1)

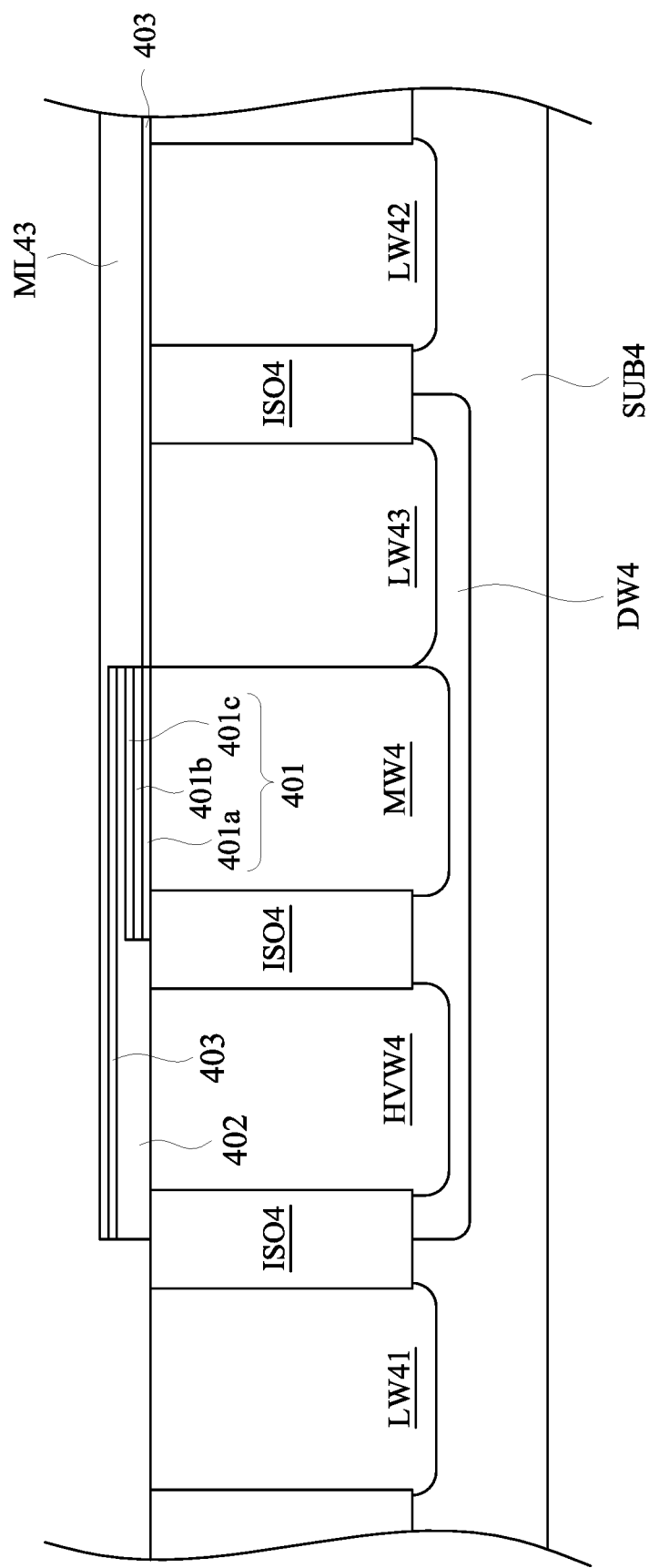
Fig. 4F(2)

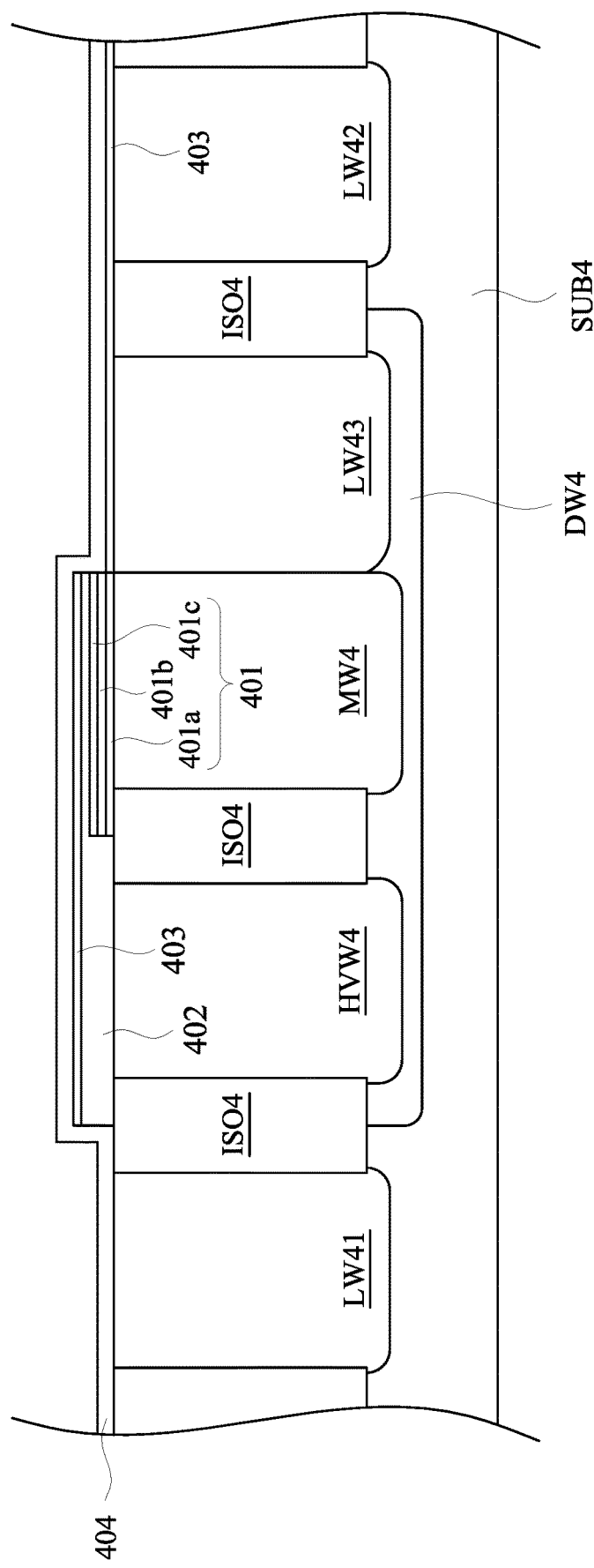
Fig. 4F(3)

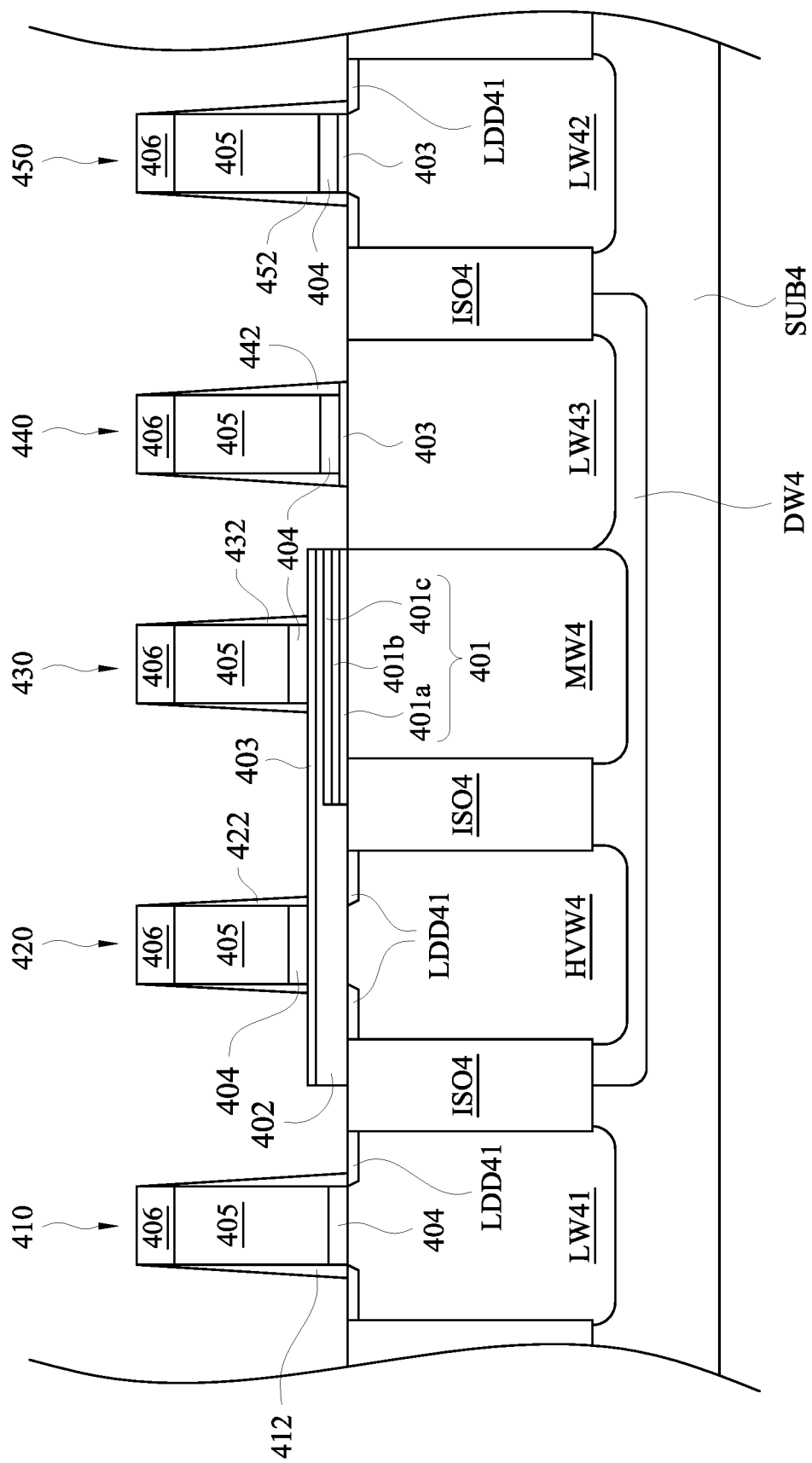
Fig. 4J(1)

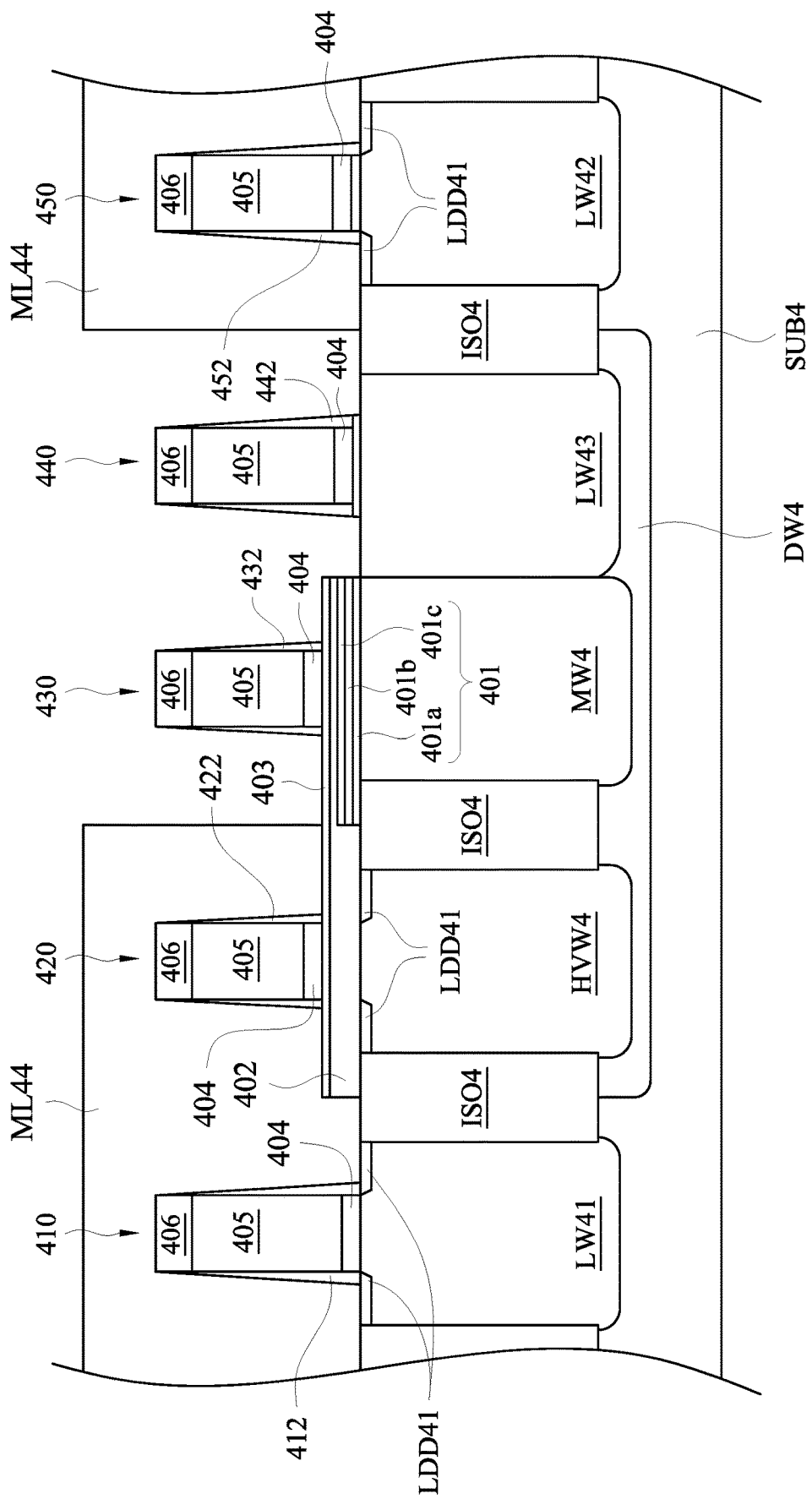
Fig. 4J(2)

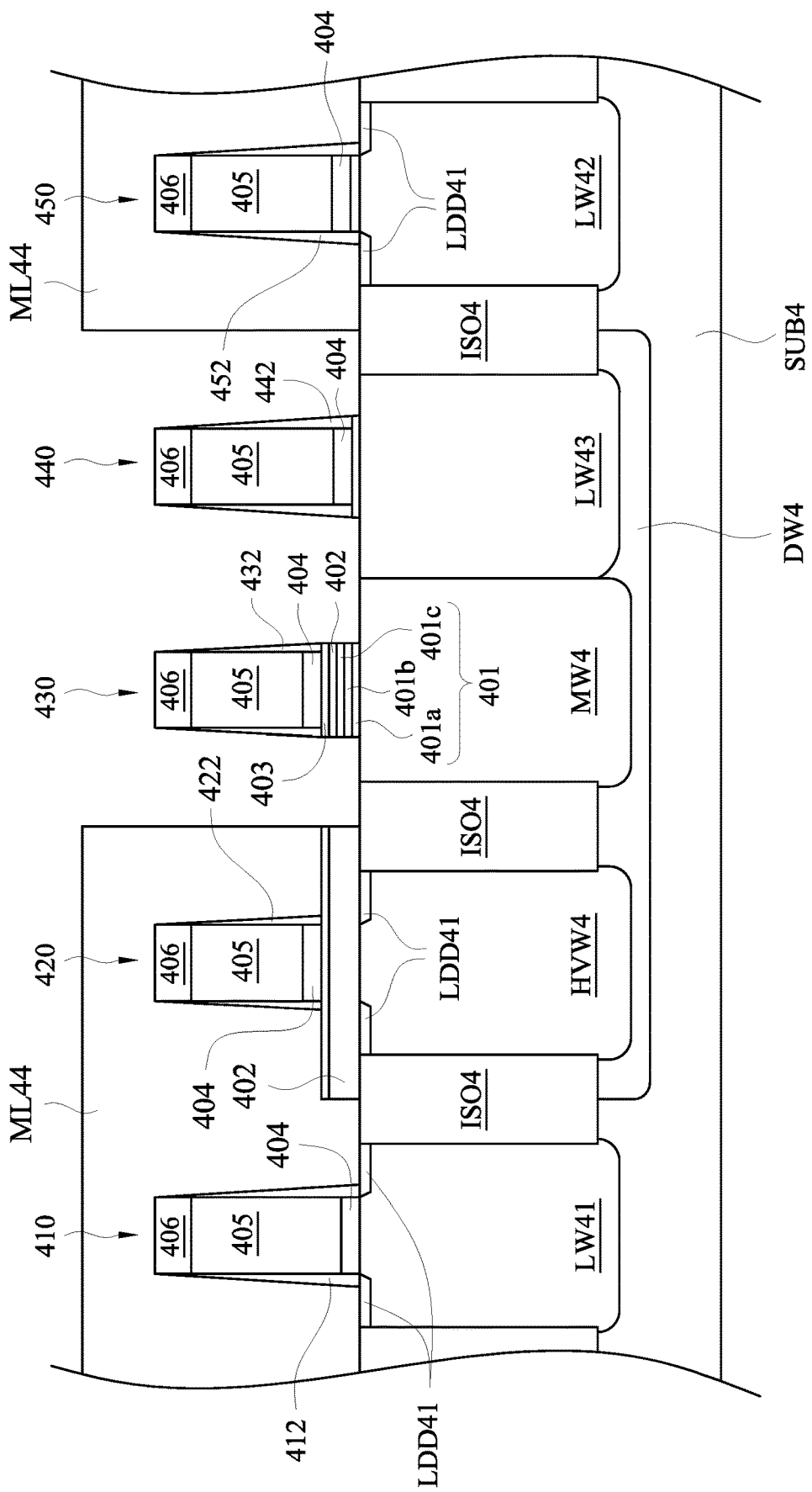
Fig. 4J(3)

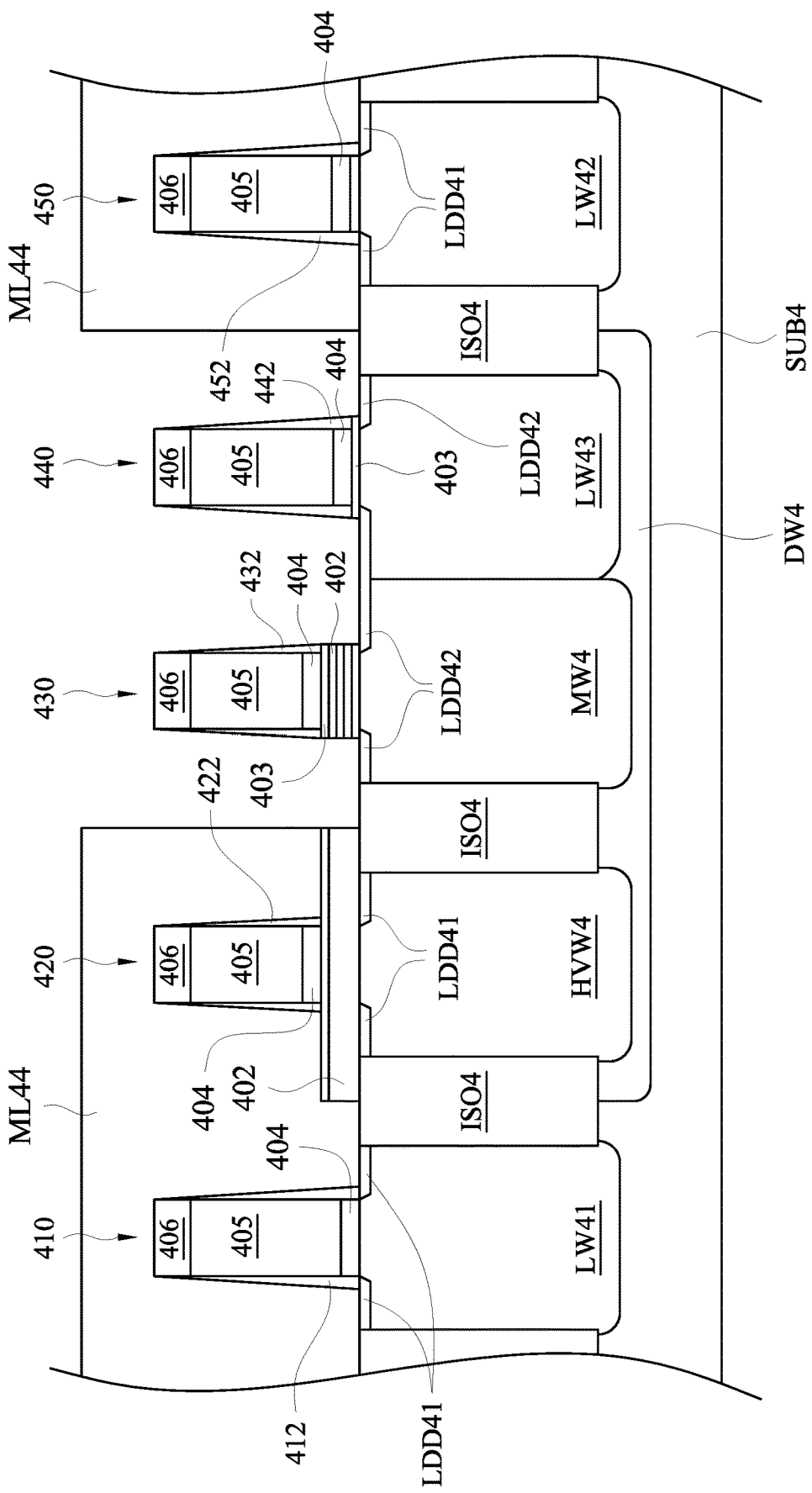
Fig. 4J(4)

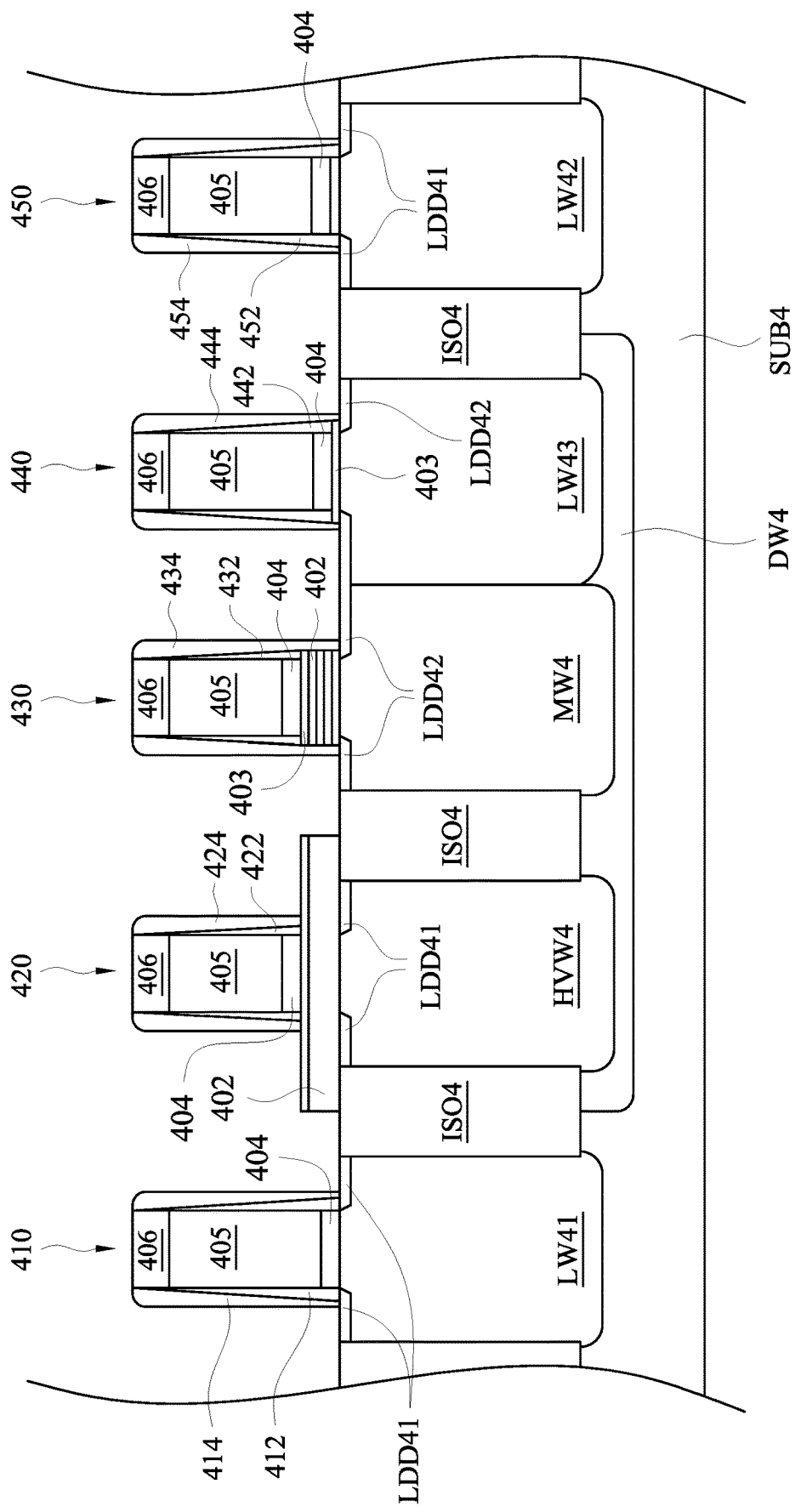
Fig. 4J(5)

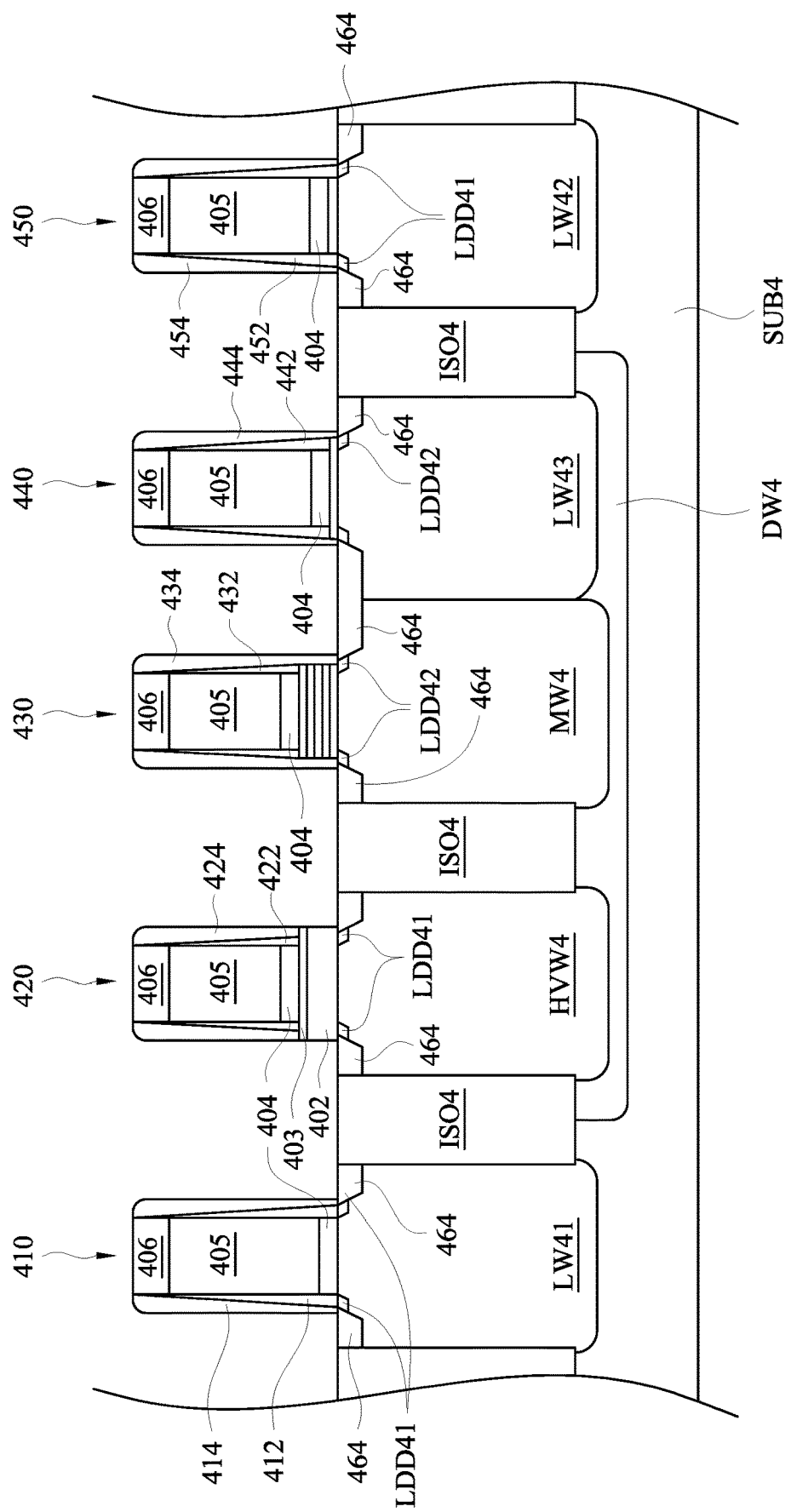
Fig. 4J(6)

MEMORY DEVICE

PRIORITY CLAIM AND CROSS-REFERENCE

This application is a divisional application of U.S. patent application Ser. No. 15/652,310, filed Jul. 18, 2017, now U.S. Pat. No. 10,510,765, issued Dec. 17, 2019, which is herein incorporated by reference in its entirety.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Flash technology has enabled designers to create cost effective and high performance programmable SOC (system on chip) solutions through the use of split-gate flash memory cells. The aggressive scaling of memory cells enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
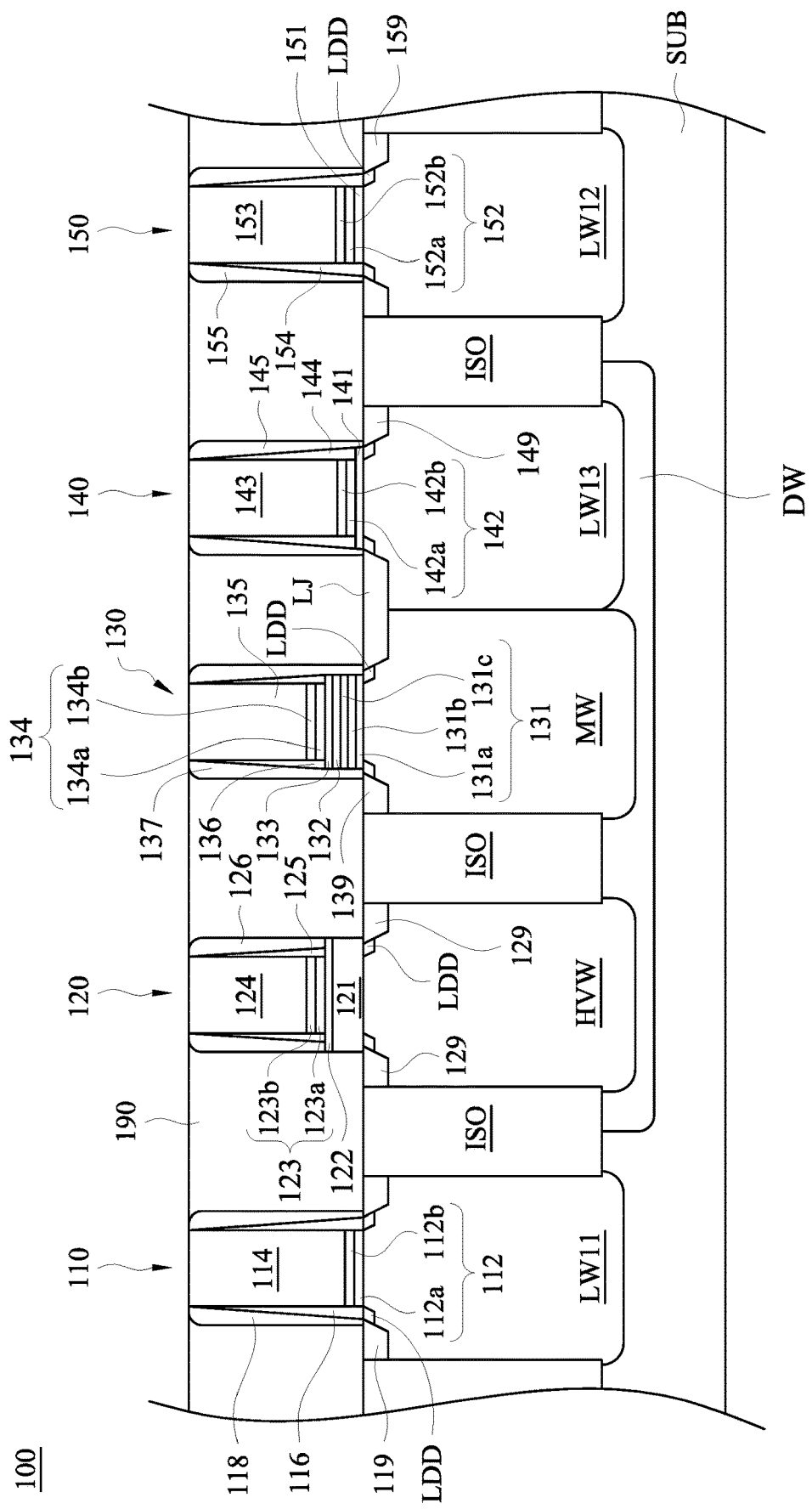
FIG. 1 is a schematic cross-sectional view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a memory device and a method for fabricating the same. The memory device includes plural logic well regions and a memory well region. Plural logic transistors are disposed on the logic well regions, and a storage transistor is disposed on the memory well region. Each of the logic transistors and storage transistor includes a high-k metal gate structure, thereby decreasing a number of masks used in the method for fabricating the memory device. The method for fabricating the memory device is performed through a high-k first process or a high-k last process.

Referring to FIG. 1, FIG. 1 is a schematic cross-sectional view of a memory device 100 in accordance with some embodiments of the present disclosure. The memory device 100 includes a semiconductor substrate SUB, plural logic well regions LW11, LW12 and LW13, a memory well region MW, plural isolation structures ISO, plural logic transistors 110, 140 and 150, and a storage transistor 130. In some embodiments, the memory device 100 is illustrated as a 2T memory unit, but embodiments of the present disclosure are not limited thereto. In some embodiments, the memory device 100 may include 1T memory unit, 1.5T memory unit, or other suitable memory unit. Further, the memory device 100 includes a high-voltage well region HVW for a high-voltage device. For example, a high-voltage transistor 120 for a high-voltage pump is disposed on the high-voltage well region HVW.

The logic well regions LW11, LW12, LW13, the memory well region MW and the high-voltage well region HVW are disposed in the semiconductor substrate SUB. In some embodiments, a deep well region DW is disposed in the semiconductor substrate SUB, and the logic well region LW13, the memory well region MW and the high-voltage well region HVW is disposed in the deep well region DW. In some embodiments, the logic well region LW11, the logic well region LW13, the high-voltage well region HVW and the memory well region MW are p-type doped wells, and the logic well region LW12 is an n-type doped well.

In some embodiments, the semiconductor substrate SUB may be a semiconductor material and may include structures including a graded layer or a buried oxide, for example. In some exemplary examples, the semiconductor substrate SUB includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate SUB. Alternatively, the semiconductor substrate SUB may be an active layer of a semiconductor-on-insulator (SOI) substrate or a multi-layered structure such as a silicon-germanium layer formed on a bulk silicon layer.

The logic transistors 110 and 150 are disposed on the logic well region LW11 and the logic well region LW12. The logic transistors 110 and 150 are formed for logic devices, such as I/O devices or core devices.

The logic transistor 110 includes a high-k dielectric layer 112, a metal gate electrode 114, sidewall structures 116, spacers 118 and sources/drains 119. The high-k dielectric layer 112 is disposed on the logic well region LW11, and the metal gate electrode 114 is disposed on the high-k dielectric layer 112, thereby forming a high-k metal gate structure.

The high-k dielectric layer 112 may include plural layers 112*a* and 112*b*. The high-k dielectric layer 112 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

In some embodiments, two lightly-doped regions LDD are disposed between the high-k metal gate structure and the source/drain 119. The lightly-doped regions LDD are doped with a concentration smaller than that of the source/drain 119.

The logic transistor 150 includes a dielectric layer 151, a high-k dielectric layer 152, a metal gate electrode 153, sidewall structures 154, spacers 155 and sources/drains 159. The dielectric layer 151 is disposed on the logic well region LW12, the high-k dielectric layer 152 is disposed on the dielectric layer 151, and the metal gate electrode 153 is disposed on the high-k dielectric layer 152, thereby forming a high-k metal gate structure. In some embodiments, the dielectric layer 151 is an oxide layer, but embodiments of the present disclosure are not limited thereto.

The high-k dielectric layer 152 may include plural layers 152*a* and 152*b*. The high-k dielectric layer 152 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

In some embodiments, two lightly-doped regions LDD are disposed between the high-k metal gate structure and the source/drain 159. The lightly-doped regions LDD are doped with a concentration smaller than that of the source/drain 159.

The high-voltage transistor 120 is disposed on the high-voltage well region HVW. The high-voltage transistor 120 includes plural dielectric layers 121 and 122, a high-k dielectric layer 123, a metal gate electrode 124, sidewall structures 125, spacers 126 and sources/drains 129. The dielectric layers 121 and 122 are disposed on the high-voltage well region HVW, the high-k dielectric layer 123 is disposed on the dielectric layer 122, and the metal gate electrode 124 is disposed on the high-k dielectric layer 123, thereby forming a high-k metal gate structure. In some embodiments, the dielectric layers 121 and 122 are oxide layers, but embodiments of the present disclosure are not limited thereto.

The high-k dielectric layer 123 may include plural layers 123*a* and 123*b*. The high-k dielectric layer 123 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

In some embodiments, two lightly-doped regions LDD are disposed between the high-k metal gate structure and the source/drain 129. The lightly-doped regions LDD are doped with a concentration smaller than that of the source/drain 129.

The storage transistor 130 and the logic transistor 140 are disposed on the memory well region MW and the logic well region LW13. In this embodiment, the storage transistor 130 is considered as a control gate of the memory device 100, and the logic transistor 140 is considered as a select gate of the memory device 100. Therefore, the storage transistor 130 and the logic transistor 140 share a link junction LJ.

The logic transistor 140 includes a dielectric layer 141, a high-k dielectric layer 142, a metal gate electrode 143, sidewall structures 144, spacers 145, a portion of the link junction LJ, and a common source 149. The dielectric layer 141 is disposed on the logic well region LW13, the high-k dielectric layer 142 is disposed on the dielectric layer 141, and the metal gate electrode 143 is disposed on the high-k dielectric layer 142, thereby forming a high-k metal gate structure. In some embodiments, the dielectric layer 141 is an oxide layer, but embodiments of the present disclosure are not limited thereto.

The high-k dielectric layer 142 may include plural layers 142*a* and 142*b*. The high-k dielectric layer 142 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

In some embodiments, two lightly-doped regions LDD are disposed between the high-k metal gate structure, the portion of the link junction LJ and the common source 149. The lightly-doped regions LDD are doped with a concentration smaller than that of the source/drain 149.

The storage transistor 130 includes a charge storage structure 131, plural dielectric layers 132 and 133, a high-k dielectric layer 134, a metal gate electrode 135, sidewall structures 136, spacers 137, another portion the link junction LJ and a drain bitline 139. The dielectric layers 132 and 133 are disposed on the charge storage structure 131, the high-k dielectric layer 134 is disposed on the charge storage structure 131, and the metal gate electrode 135 is disposed on the high-k dielectric layer 134, thereby forming a high-k metal gate structure on the charge storage structure 131.

The high-k dielectric layer 134 may include plural layers 134a and 134b. The high-k dielectric layer 134 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

The charge storage structure 131 includes an oxide layer 131a, a charge storage layer 131b and a diffusion block layer 131c. In some embodiments, the charge storage layer 131b is a nitride layer for storing charges, and the diffusion block layer 131c is an oxide layer preventing inter-diffusion between the charge storage layer 131b and the high-k dielectric layer 134. The charge storage structure 131 can be referred to as an ONO (Oxide-Nitride-Oxide) structure. In some embodiments, the dielectric layers 132 and 133 are formed by oxide, thereby preventing inter-diffusion between the charge storage layer 131b and the high-k dielectric layer 134.

In some embodiments, two lightly-doped regions LDD are disposed between the high-k metal gate structure, the portion of the link junction LJ and the drain bitline 139. The lightly-doped regions LDD are doped with a concentration smaller than that of the source/drain 139.

Figure 2A:
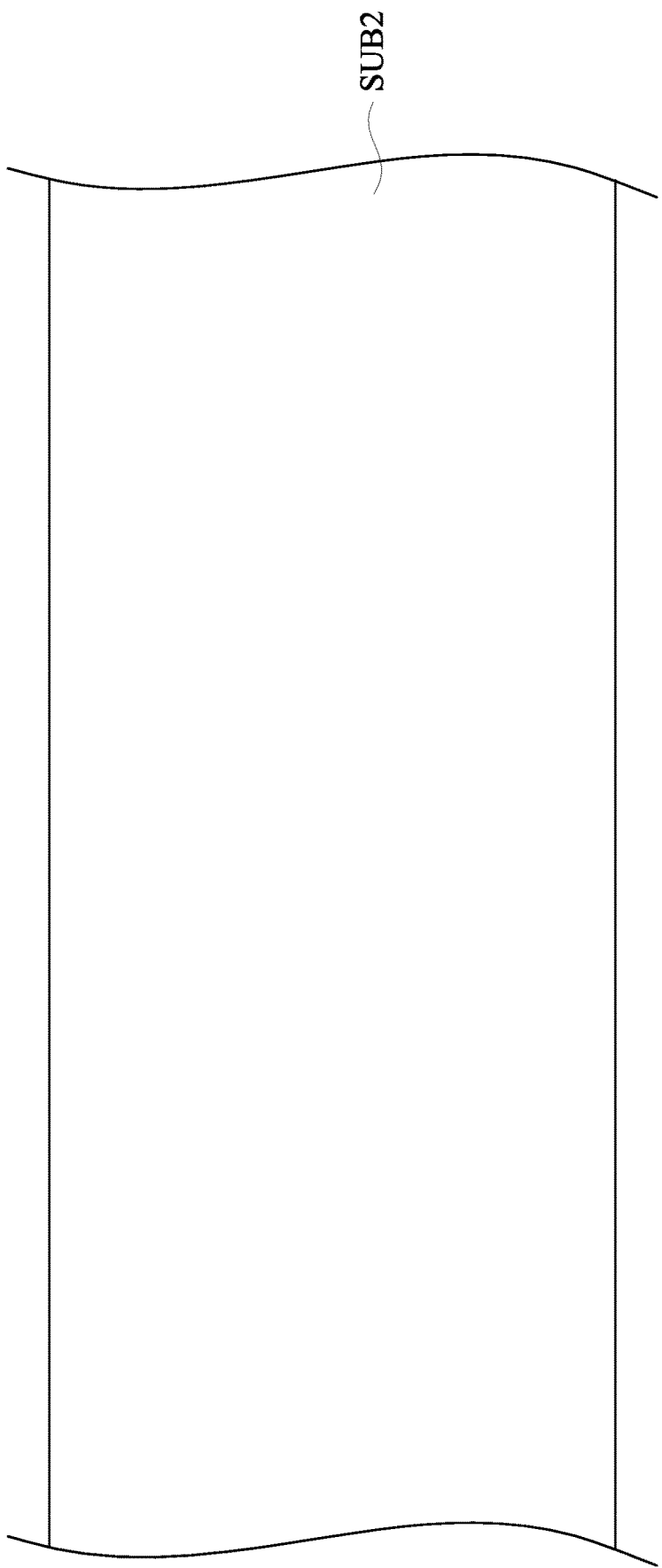
FIG. 2A to FIG. 2N are cross-sectional views of intermediate stages showing a method for fabricating a memory device in accordance with some embodiments of the present disclosure.
Figure 2D:
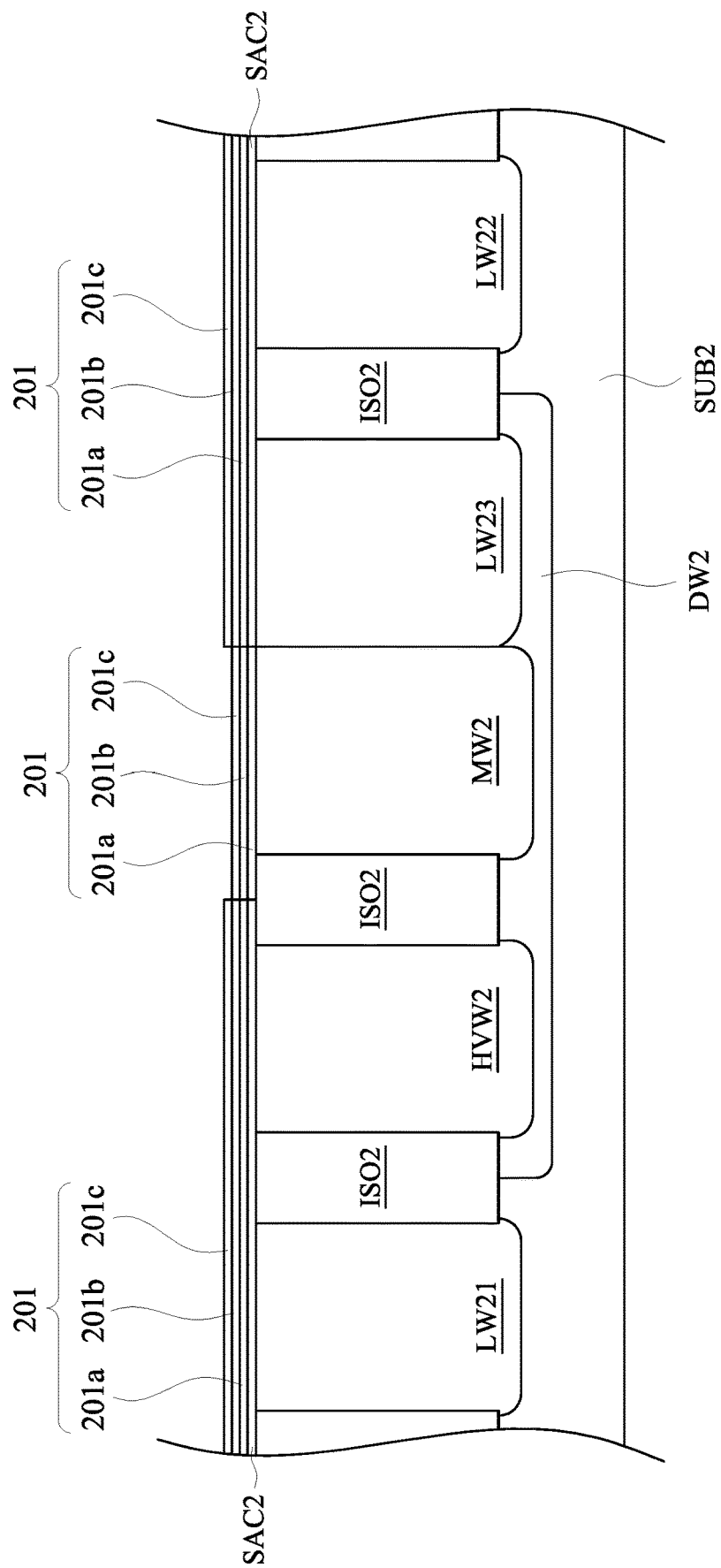
Figure 2G:
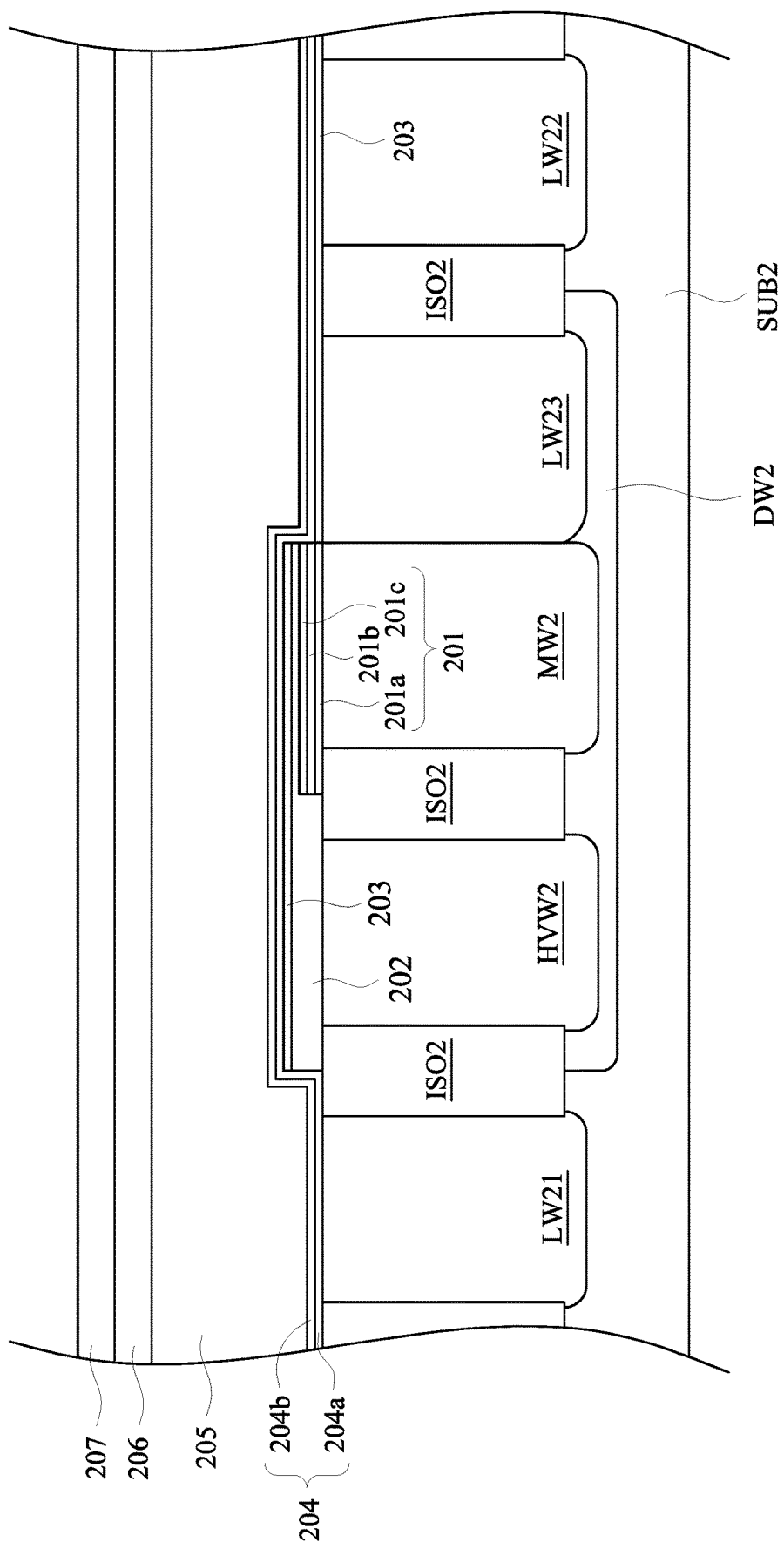
Figure 2H:
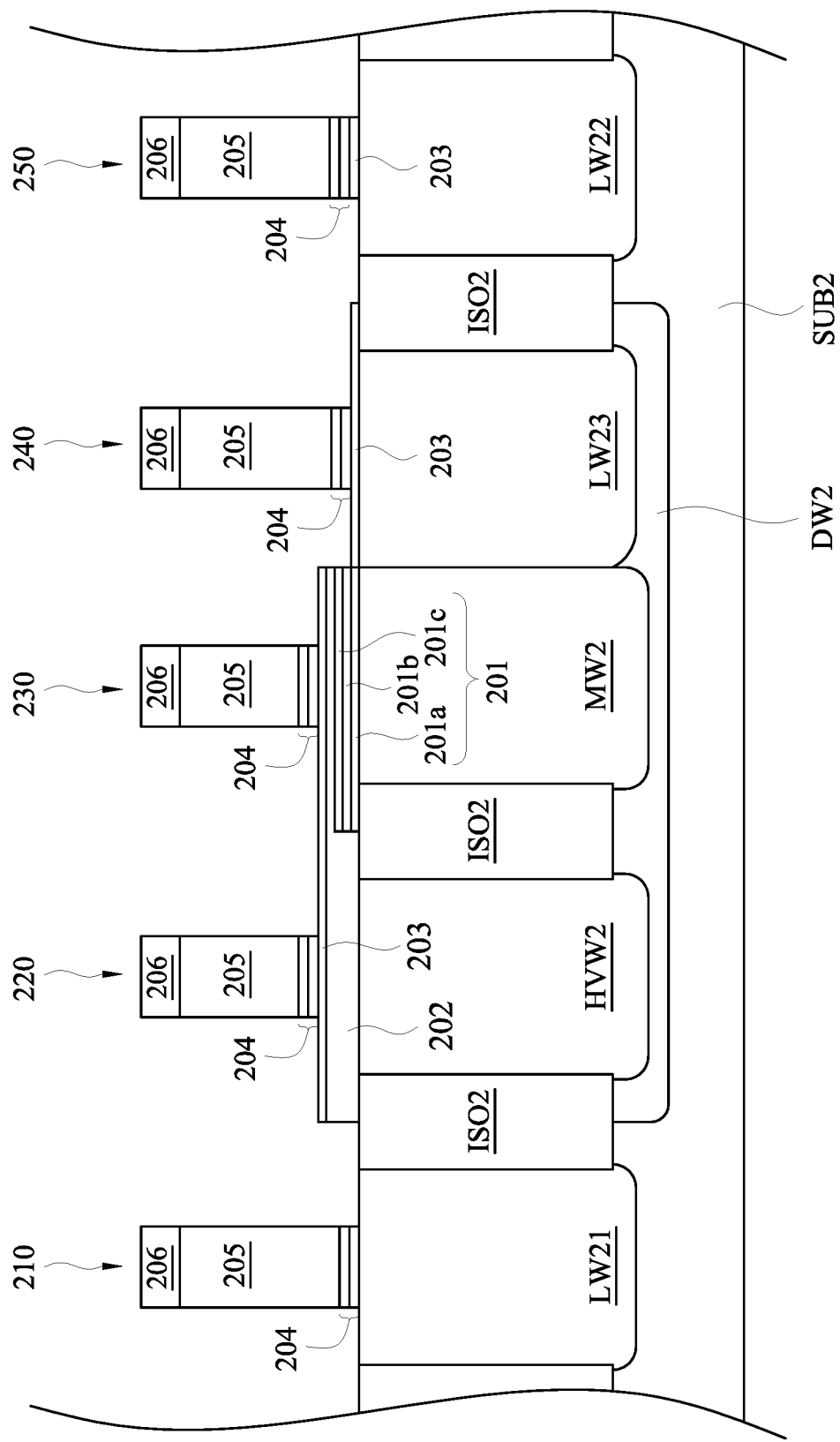
Figure 2I:
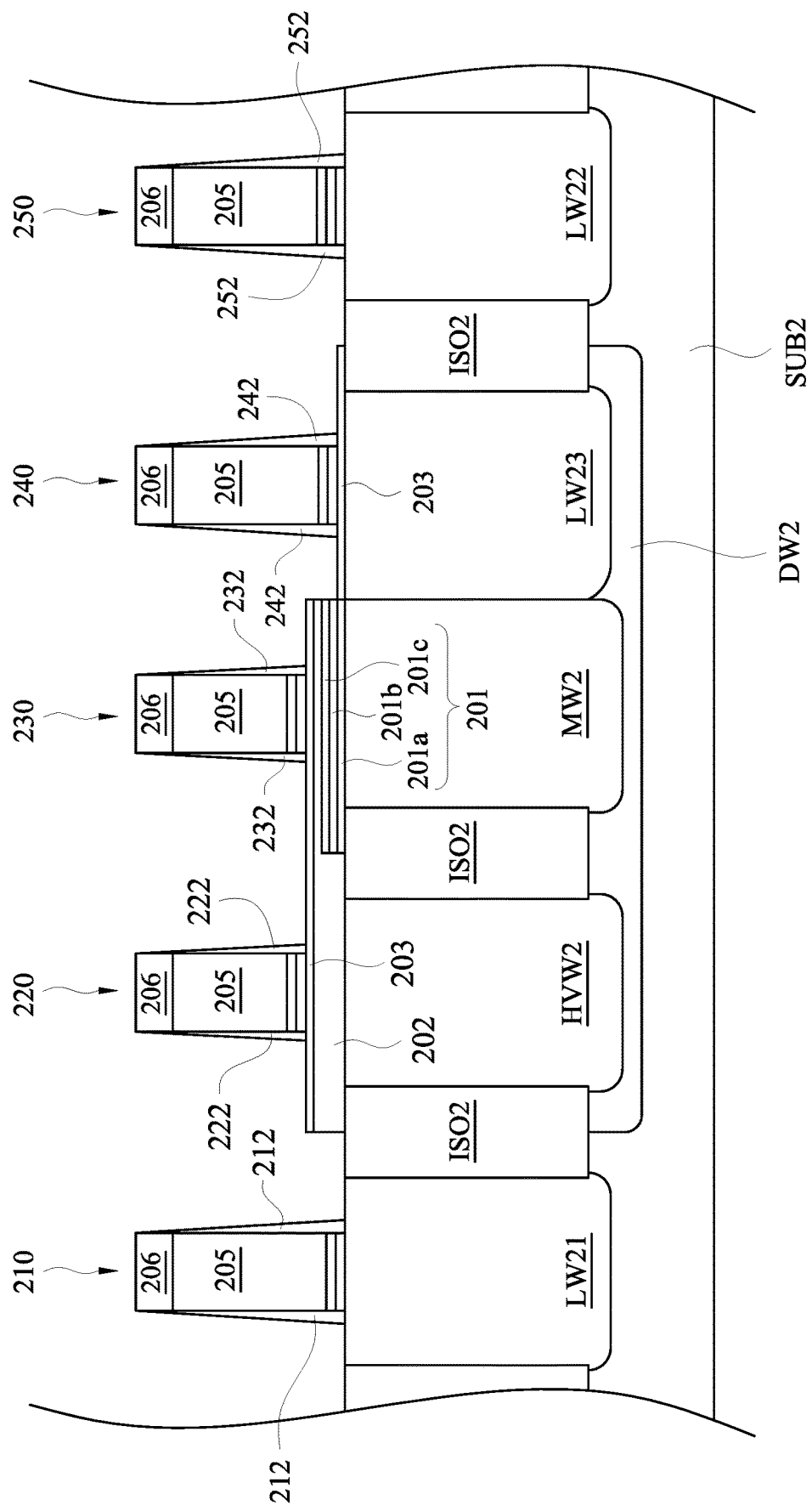
Figure 2K:
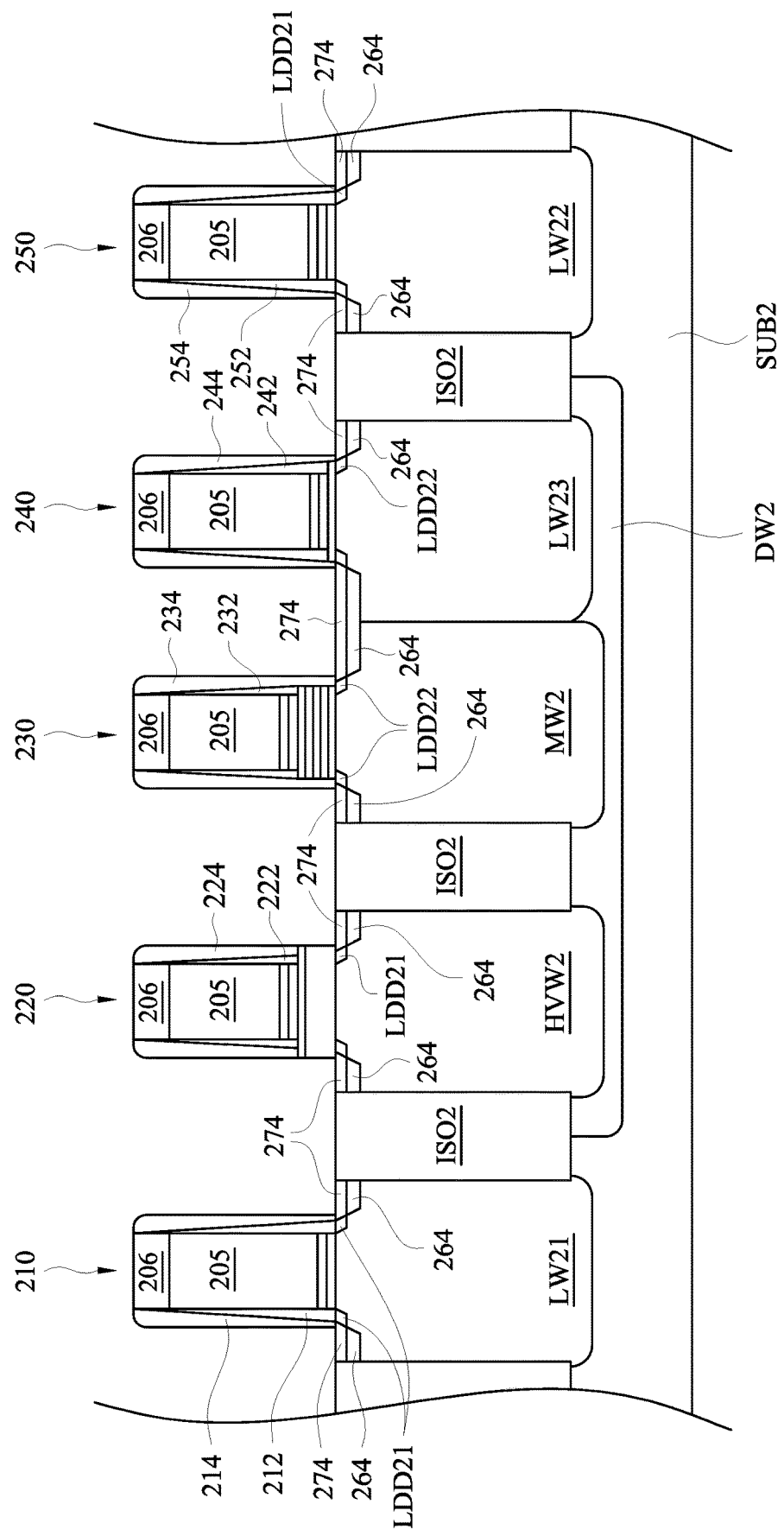
Figure 2L:
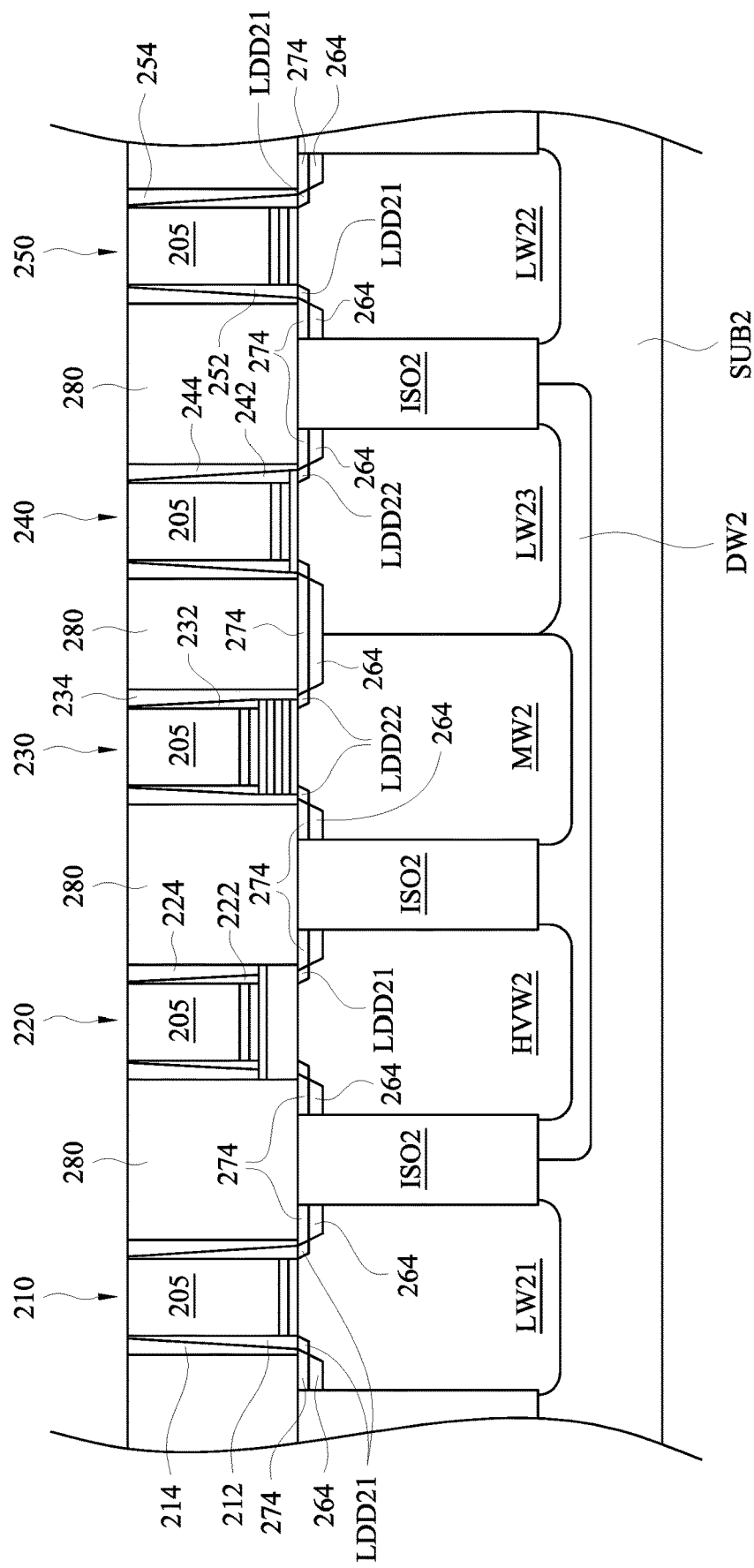
Figure 2M:
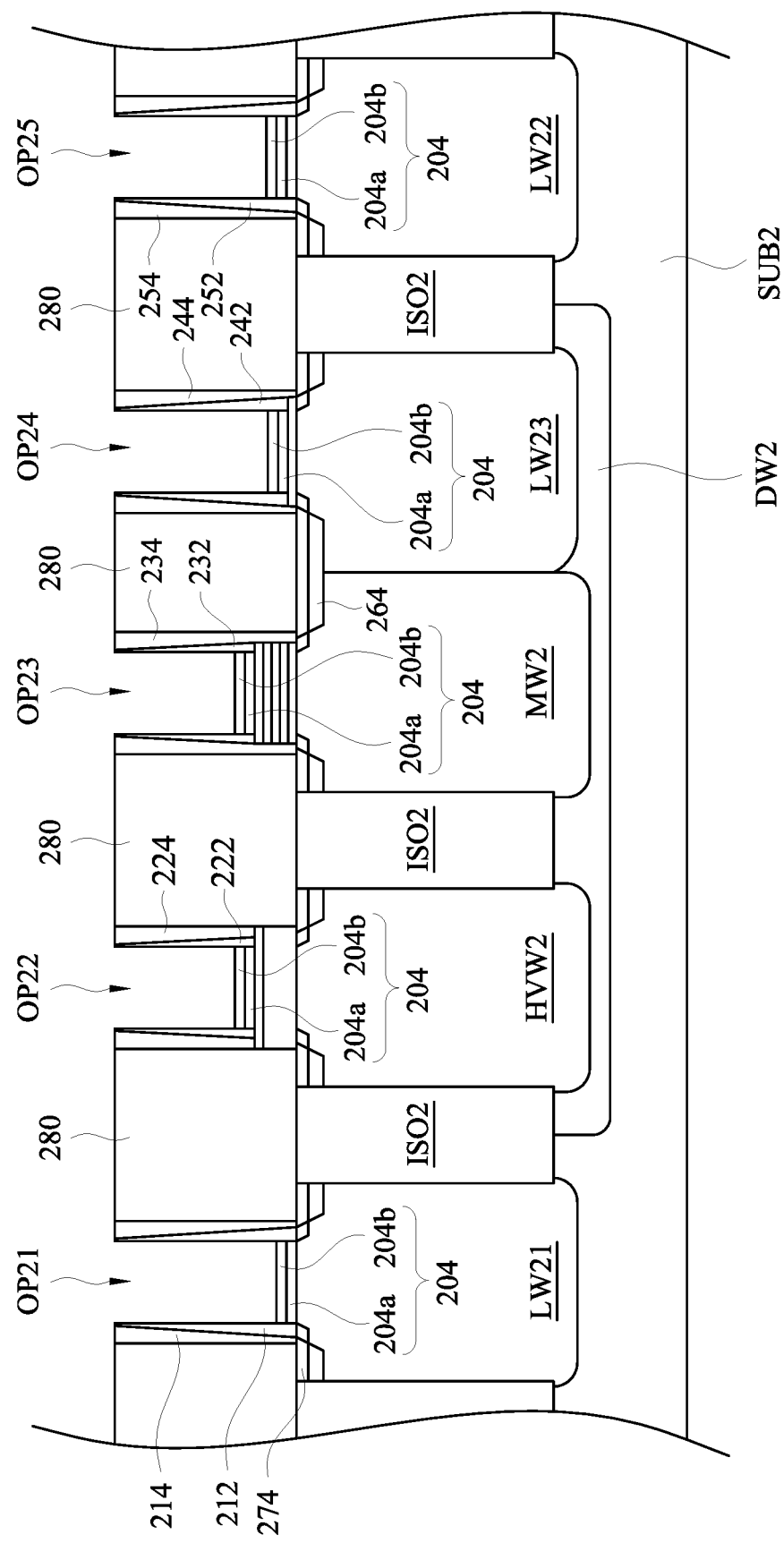
Figure 2N:
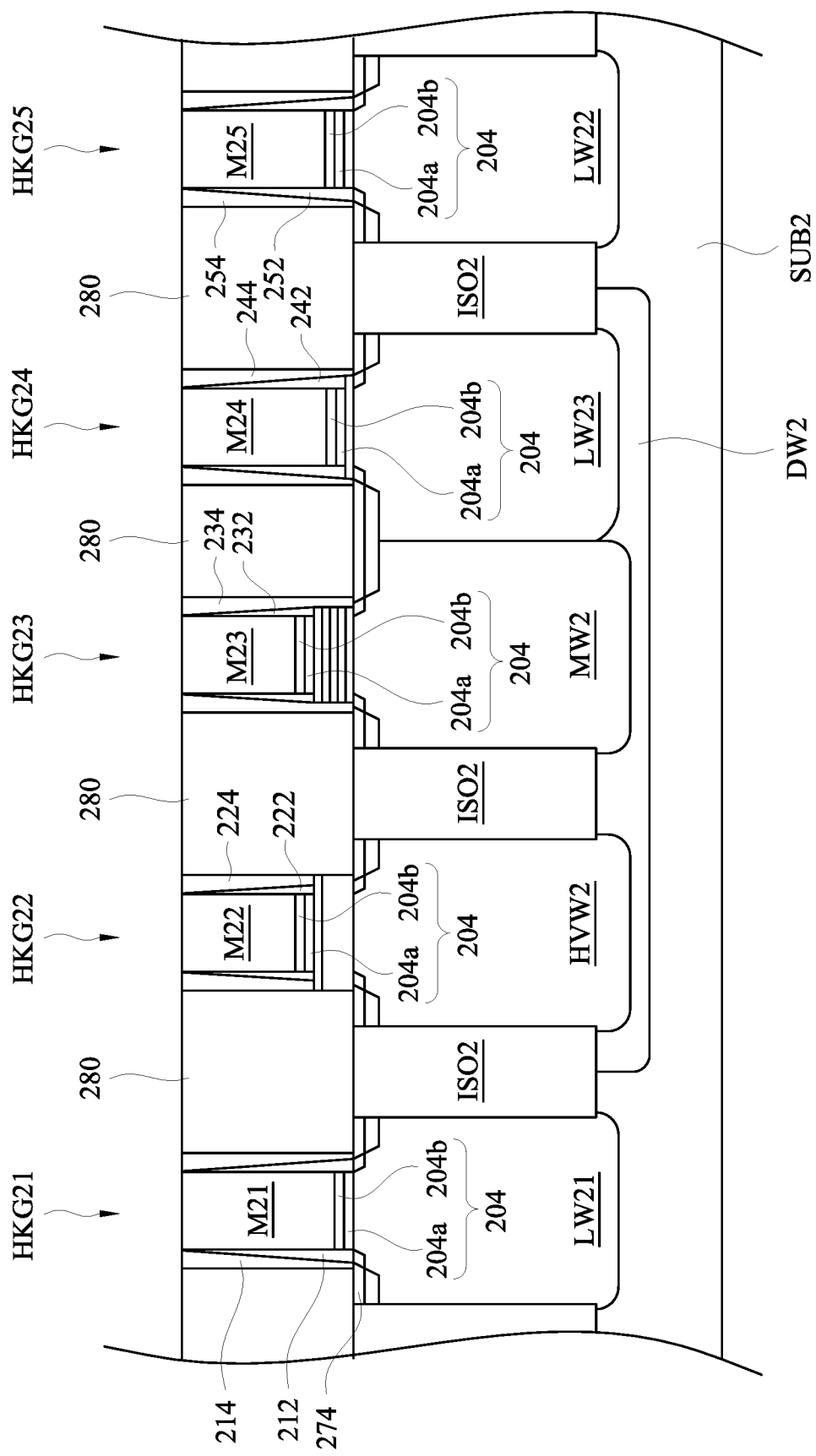

Referring to FIG. 2A to FIG. 2N, FIG. 2A to FIG. 2N are cross-sectional views of intermediate stages showing a method for fabricating a memory device in accordance with some embodiments of the present disclosure. At first, a semiconductor substrate SUB2 is provided as shown in FIG. 2A. In some embodiments, the semiconductor substrate SUB2 may be a semiconductor material and may include structures including a graded layer or a buried oxide, for example. In some exemplary examples, the semiconductor substrate SUB2 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate SUB2. Alternatively, the semiconductor substrate SUB2 may be an active layer of a semiconductor-on-insulator (SOI) substrate or a multi-layered structure such as a silicon-germanium layer formed on a bulk silicon layer.

Then, plural isolation structures ISO2 are formed in the semiconductor substrate SUB2, as shown in FIG. 2B. In some embodiments, the isolation structures ISO2 are shallow trench isolation structures, but embodiments of the present disclosure are not limited thereto.

Thereafter, a sacrifice layer SAC2 is formed on the semiconductor substrate SUB2 as shown in FIG. 2C(1), and a deep well region DW2, a logic well region LW21, a logic well region LW22, a memory well region MW2, a logic well region LW23 and a high-voltage well region HVW2 are formed by using the sacrifice layer SAC2 as show in FIG. 2C(2). In some embodiments, the logic well region LW21, the memory well region MW2, the logic well region LW23 and the high-voltage well region HVW2 are formed by doping with a p-type dopant, and the logic well region LW22 is formed by doping with an n-type dopant.

Then, a portion of the sacrifice layer SAC2 is removed to expose a portion of the memory well region MW2 adjacent to the logic well region LW23, as shown in FIG. 2C(3).

In some embodiments, the device shown in FIG. 2C(3) is prepared for a 2T memory unit, but embodiments of the present disclosure are not limited thereto. In some embodiments, the device may be modified for 1T memory unit, 1.5T memory unit, or other suitable memory unit.

Then, a charge storage structure 201 is formed to cover the sacrifice layer SAC2 and the exposed portion of the memory well region MW2, as shown in FIG. 2D. In some embodiments, the charge storage structure 201 includes an oxide layer 201a, a charge storage layer 201b and a diffusion block layer 201c. In some embodiments, the charge storage layer 201b is a nitride layer for storing charges, and the diffusion block layer 201c is an oxide layer preventing inter-diffusion. In some embodiments, the oxide layer 201a, the charge storage layer 201b and the diffusion block layer 201c are sequentially deposited on the semiconductor substrate SUB2.

Thereafter, as shown in FIG. 2E(1), a mask layer ML21 is formed to cover a portion of the charge storage structure 201 which is formed on the logic well region LW21, the memory well region MW2, the logic well region LW22 and the logic well region LW23, and another portion of the charge storage structure 201 which is formed on the high-voltage well region HVW2 is not covered by the mask layer ML21.

Then, the portion of the charge storage structure 201 formed on the high-voltage well region HVW2 is removed, and the high-voltage well region HVW2 is exposed, as shown in FIG. 2E(2).

Thereafter, the mask layer ML21 is removed as shown in FIG. 2E(3).

Then, an oxide layer 202 is formed on the high-voltage well region HVW2 and the charge storage structure 201, as shown in FIG. 2E(4). In some embodiments, the oxide layer 202 is formed by a thermal oxidation process, but embodiments of the present disclosure are not limited thereto.

Thereafter, a mask layer ML22 is formed to cover the oxide layer 202 located on the memory well region MW2 and the high-voltage well region HVW2, as show in FIG. 2E(5).

Then, the oxide layer 202 and the charge storage structure 201 located on the logic well region LW21, the logic well region LW22 and the logic well region LW23 are removed to expose the logic well region LW21, the logic well region LW22 and the logic well region LW23, as shown in FIG. 2E(6).

Thereafter, the mask layer ML22 is removed and an oxide layer 203 is formed to cover the logic well region LW21, the logic well region LW22 and the logic well region LW23 and the oxide layer 202, as shown in FIG. 2E(7).

Then, a mask ML23 is formed to cover a portion of the oxide layer 203 located on the high-voltage well region HVW2, the memory well region MW2, the logic well region LW22 and a logic well region LW23, as shown in FIG. 2F(1). It is noted that another portion of oxide layer 203 located on the logic well region LW21 is not covered by the mask ML23.

Thereafter, the portion of oxide layer 203 located on the logic well region LW21 is removed to expose the logic well region LW21, as shown in FIG. 2F(2).

Then, the mask layer ML23 is removed, and a high-k dielectric layer 204 is formed to cover the exposed logic well region LW21 and the remaining oxide layer 203, as shown in FIG. 2F(3). In some embodiments, the high-k dielectric layer 204 may include plural layers 204a and 204b deposited on the exposed logic well region LW21 and the remaining oxide layer 203. The high-k dielectric layer 204 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Thereafter, a dummy gate layer 205, a gate mask layer 206 and an anti-reflective layer 207 are formed to cover the high-k dielectric layer 204, as shown in FIG. 2G. In some embodiments, the dummy gate layer 205, the gate mask layer 206 and the anti-reflective layer 207 are sequentially deposited on the high-k dielectric layer 204, and the gate mask layer 206 is a hard mask layer.

Then, the oxide layer 203, the high-k dielectric layer 204, the dummy gate layer 205, the gate mask layer 206 and the anti-reflective layer 207 are etched to form plural dummy gate structures 210, 220, 230, 240 and 250, as shown in FIG. 2H. Each of the dummy gate structures 210, 220, 230, 240 and 250 includes a remaining portion of the high-k dielectric layer 204, a remaining portion of the dummy gate layer 205 and a remaining portion of the gate mask layer 206.

Thereafter, plural sidewall structures 212, 222, 232, 242 and 252 are formed on the dummy gate structures 210, 220, 230, 240 and 250, respectively, as shown in FIG. 2I. In some embodiments, the sidewall structures 212, 222, 232, 242 and 252 are dielectric layers, for example, oxide layers.

Then, plural light-doped regions LDD21 are formed in the logic well region LW21, the logic well region LW22 and the high-voltage well region HVW2, by doping the logic well region LW21, the logic well region LW22 and the high-voltage well region HVW2 as shown in FIG. 2J(1). In some embodiments, a mask layer (not shown) covering the memory well region MW2, the logic well region LW23 and the charge storage structure 201 is used for the formation of the light-doped regions LDD21.

Thereafter, the mask layer is removed, and another mask layer ML24 is formed to cover the logic well regions LW21, LW22 and the dummy gate structures 210, 250 located on the logic well regions LW21, LW22 (also referred to as logic dummy gate structures), as shown in FIG. 2J(2). In this embodiment, because a high-voltage well region HVW2 is provided for a high-voltage device, the mask layer ML24 further covers the high-voltage well region HVW2 and the dummy gate structure 220.

Then, a portion of the storage structure 201, a portion of the oxide layers 202 and 203 are removed to expose the memory well region MW2 and the logic well region LW23, as shown in FIG. 2J(3).

Thereafter, plural light-doped regions LDD22 are formed in the logic well region LW23 and the memory well region MW2 by doping the logic well region LW23 and the memory well region MW2, as shown in FIG. 2J(4). For example, the light-doped regions LDD22 are formed by doping regions adjacent to the dummy gate structure 230 (also referred to as memory dummy gate structure).

Then, plural spacers 214, 224, 234, 244 and 254 are formed on the sidewall structures 212, 222, 232, 242 and 252 of the dummy gate structures 210, 220, 230, 240 and 250, as shown in FIG. 2J(5). In some embodiments, the spacers 214, 224, 234, 244 and 254 are dielectric layers, for example, oxide layers.

Thereafter, plural sources/drains 264 are formed in the logic well region LW21, the logic well region LW22, the logic well region LW23, the high-voltage well region HVW2 and the memory well region MW2, a shown in FIG. 2J(6). In some embodiments, a concentration of dopant of each of the sources/drains 264 is greater than that of each of the lightly-doped regions LDD21 and LDD22. In some embodiments, silicide layers 274 are formed on the sources/drains 264 for contact landing as shown in FIG. 2K.

Then, the hard mask layers 206 is removed and plural dielectric layers 280 are formed between the dummy gate structures 210, 220, 230, 240 and 250 as show in FIG. 2L. For example, the hard mask layers 206 are removed at first, and then the dielectric layers 280 are formed. In some embodiments, the dielectric layers 280 are formed to provide a flat surface for a subsequent planarization process.

Thereafter, the dummy gate layers 205 of the dummy gate structures 210, 220, 230, 240 and 250 are removed to form plural openings OP21, OP22, OP23, OP24 and OP25, and to expose the high-k dielectric layers 204, as show in FIG. 2M.

Then, metal gate electrodes M21, M22, M23, M24 and M25 are formed in the openings OP21, OP22, OP23, OP24 and OP25 to form plural high-k metal gate structures HKG21, HKG22, HKG23, HKG24 and HKG25, as shown in FIG. 2N. In some embodiments, because a dopant type of the logic well region LW22 is different from that of each of the logic well region LW21, the logic well region LW23, the high-voltage well region HVW2 and the memory well region MW2, the metal gate electrode M25 is different from the metal gate electrodes M21, M22, M23 and M24. In some embodiments, a planarization process, for example a chemical-mechanical planarization (CMP) process is used to form the metal gate electrodes M21, M22, M23, M24 and M25.

It can be understood that, in the above method of fabricating a memory device, the transistors disposed on the logic well region LW21, the logic well region LW22, the logic well region LW23, the high-voltage well region HVW2 and the memory well region MW2 are formed to include the high-k metal gate structures HKG21, HKG22, HKG23, HKG24 and HKG25, and a number of masks used to fabricate the memory device can be decreased accordingly.

Figure 3:
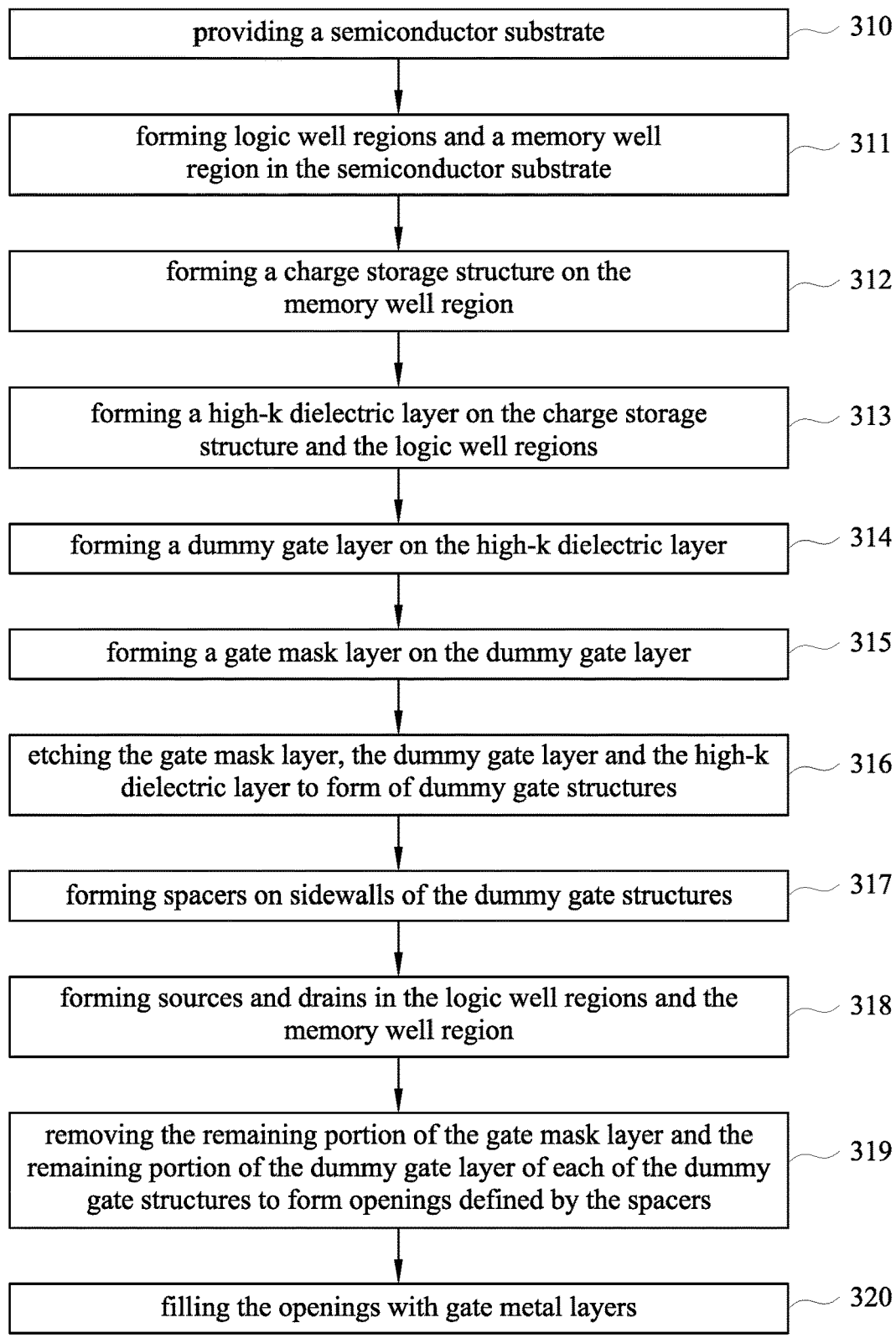
FIG. 3 is a flow chart showing a method for fabricating a memory device in accordance with embodiments of the present disclosure.

Referring to FIG. 3, FIG. 3 is a flow chart showing a method 300 for fabricating a memory device in accordance with embodiments of the present disclosure. The method 300 begins at operation 310. In operation 310, the semiconductor substrate SUB2 is provided as shown in FIG. 2A. Then, in operation 311, the logic well regions LW21 and LW22 and the memory well region MW2 are formed in the semiconductor substrate SUB2, as shown in FIG. 2B to FIG. 2C(3). In some embodiment, the memory device is a 2T memory unit, a memory well region MW2 is formed in the semiconductor substrate SUB2. Further, a high-voltage well region HVW2 may be formed in the semiconductor substrate SUB2 for a high-voltage device.

Thereafter, in operation 312, the charge storage structure 201 is formed on the memory well region MW2, as shown in FIG. 2D to FIG. 2E(6). Then, in operation 313, the high-k dielectric layer 204 is formed on the charge storage structure 201 and the logic well regions LW21, LW22 and LW23, as shown in FIG. 2F(3). In some embodiments, oxide layers 202 and 203 can be formed before operation 313, as shown in FIG. 2E(7) to FIG. 2F(2). Thereafter, in operations 314 and 315, the dummy gate layer 205 and the gate mask layer 206 are formed on the high-k dielectric layer 204, as shown in FIG. 2G. Then, in operation 316, the gate mask layer 206, the dummy gate layer 205 and the high-k dielectric layer 204 are etched to form the dummy gate structures 210, 230 and 250 as shown in FIG. 2H. In some embodiments, the dummy gate structure 220 for the high-voltage well region HVW2 is formed. In some embodiments, because the memory device is a 2T memory unit, the dummy gate structure 240 is formed for the logic well region LW23.

In operation 317, the spacers 214, 224, 234, 244 and 254 are formed on sidewalls of the dummy gate structures 210, 220, 230, 240 and 250 as shown in FIG. 2J(5). In some embodiments, the lightly-doped regions LDD21 and LDD22 can be formed before operation 317, as shown in FIG. 2I to FIG. 2J(4).

In operation 318, the sources/drains 264 are formed in the logic well regions LW21 and LW22 and the memory well region MW2, as shown in FIG. 2J(6) to FIG. 2K. In some embodiments, the sources/drains 264 are further formed in the logic region LW23 and the high-voltage well region HVW2. In some embodiments, the silicide layers 274 are formed on the sources/drains 264 for contact landing.

In operation 319, the remaining portion of the gate mask layer 206 and the remaining portion of the dummy gate layer 205 of each of the dummy gate structures 210, 220, 230, 240 and 250 to form the openings OP21, OP22, OP23, OP24 and OP25 defined by the spacers 214, 224, 234, 244 and 254, as shown in FIG. 2L to FIG. 2M.

In operation 320, the openings OP21, OP22, OP23, OP24 and OP25 are filled with the metal gate electrodes M21, M22, M23, M24 and M25 as shown in FIG. 2N.

It can be understood that, the method 300 for fabricating a memory device can be modified for fabricating other suitable memory device including 1T memory unit or 1.5T memory unit.

Figure 4B:
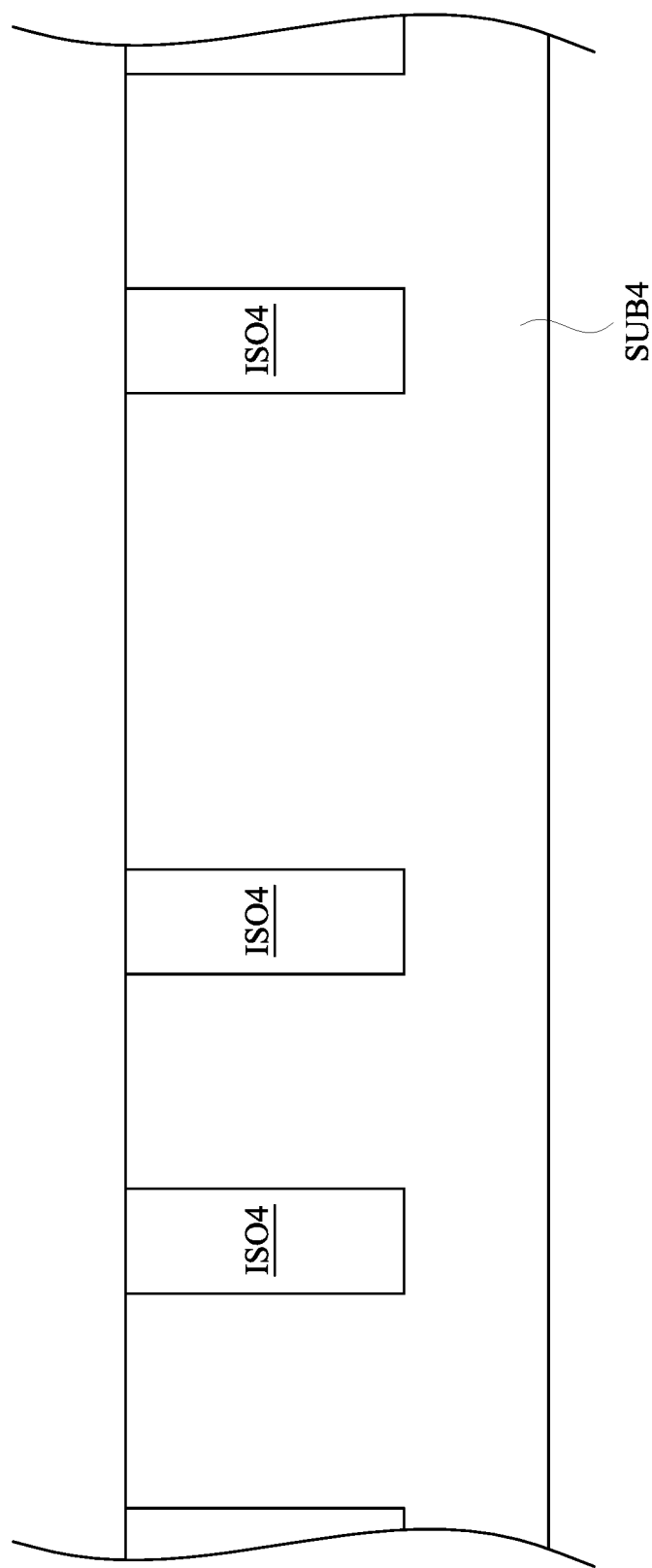
FIG. 4A to FIG. 4N are cross-sectional views of intermediate stages showing a method for fabricating a memory device in accordance with some embodiments of the present disclosure.
Figure 4D:
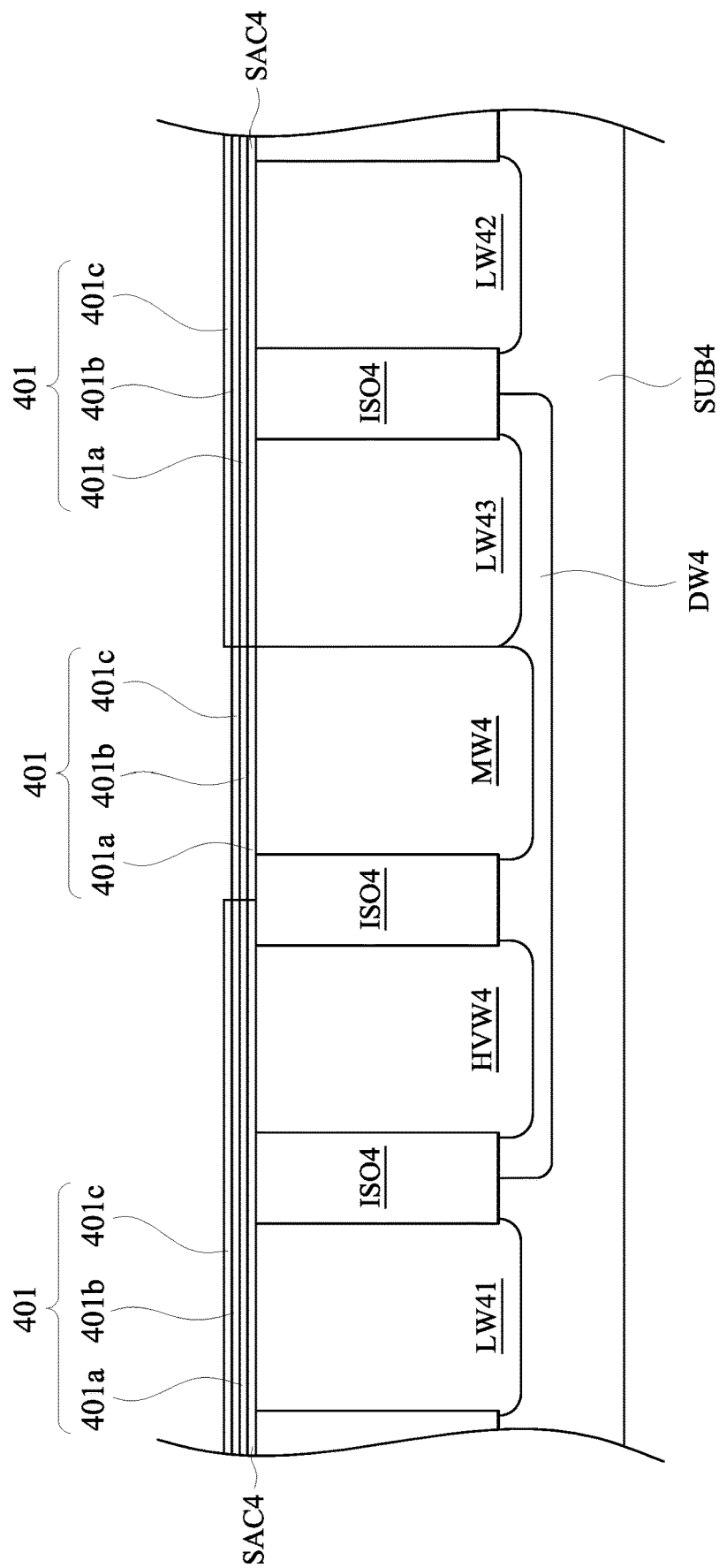
Figure 4G:
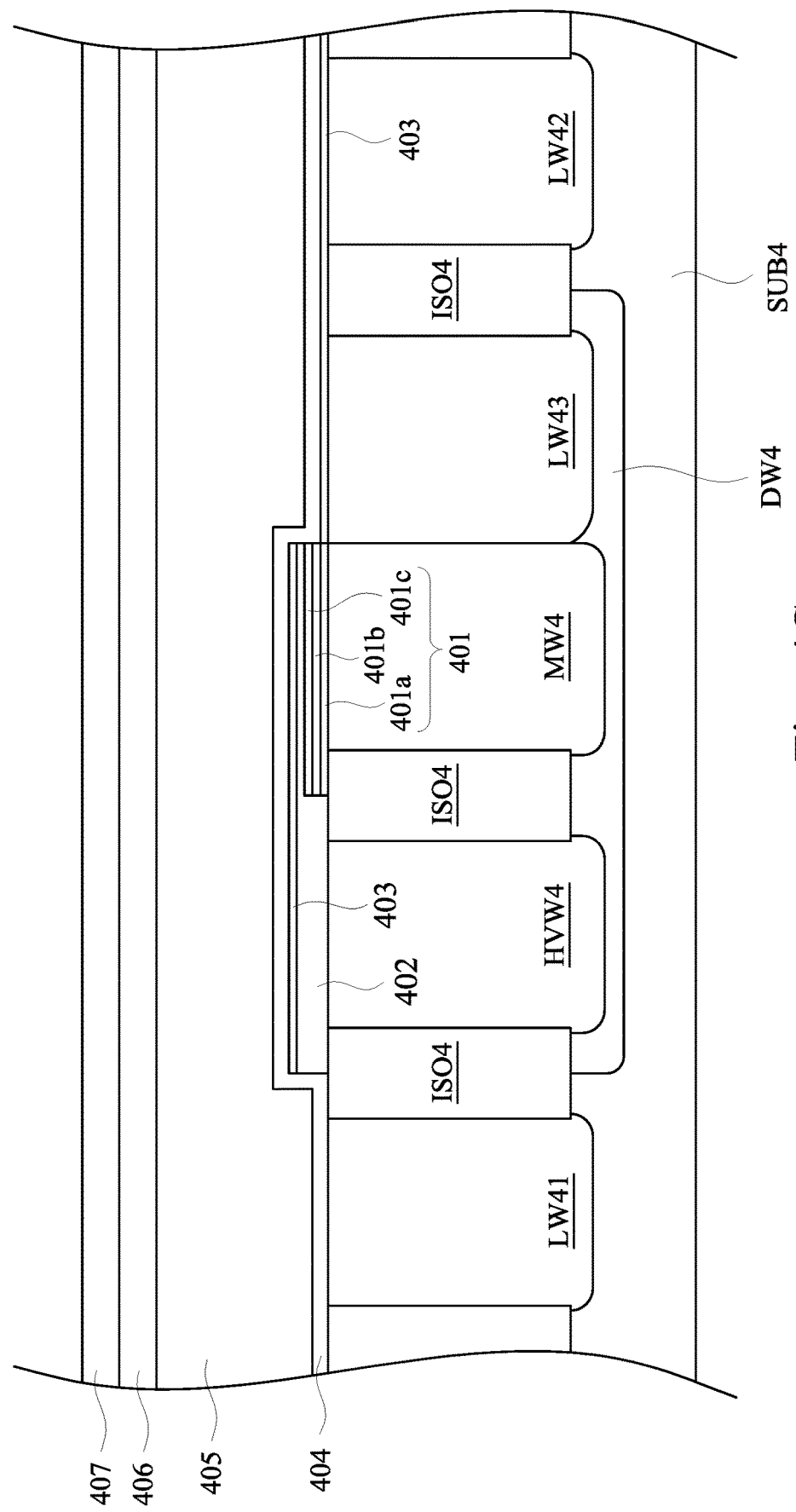
Figure 4H:
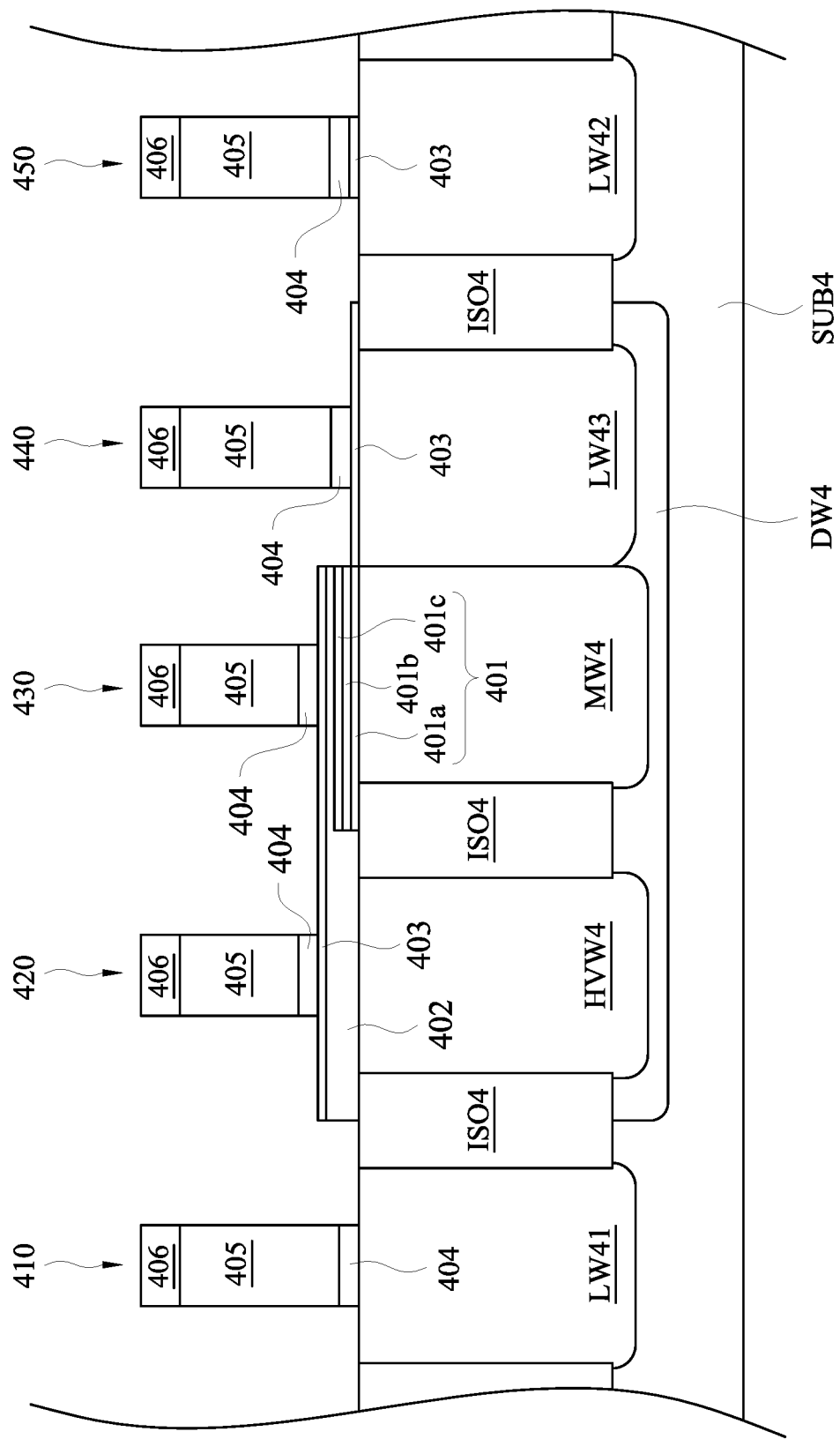
Figure 4I:
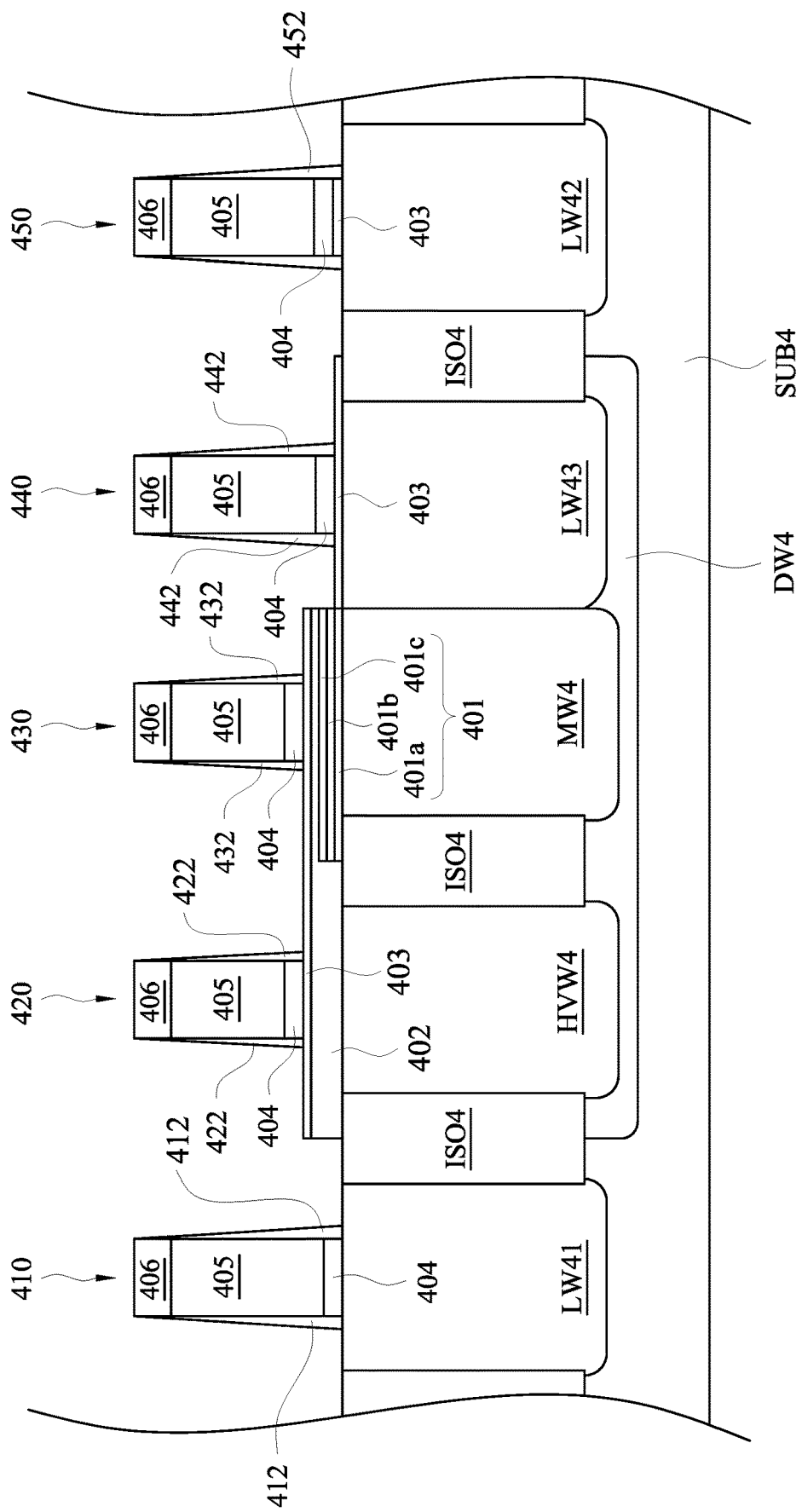
Figure 4K:
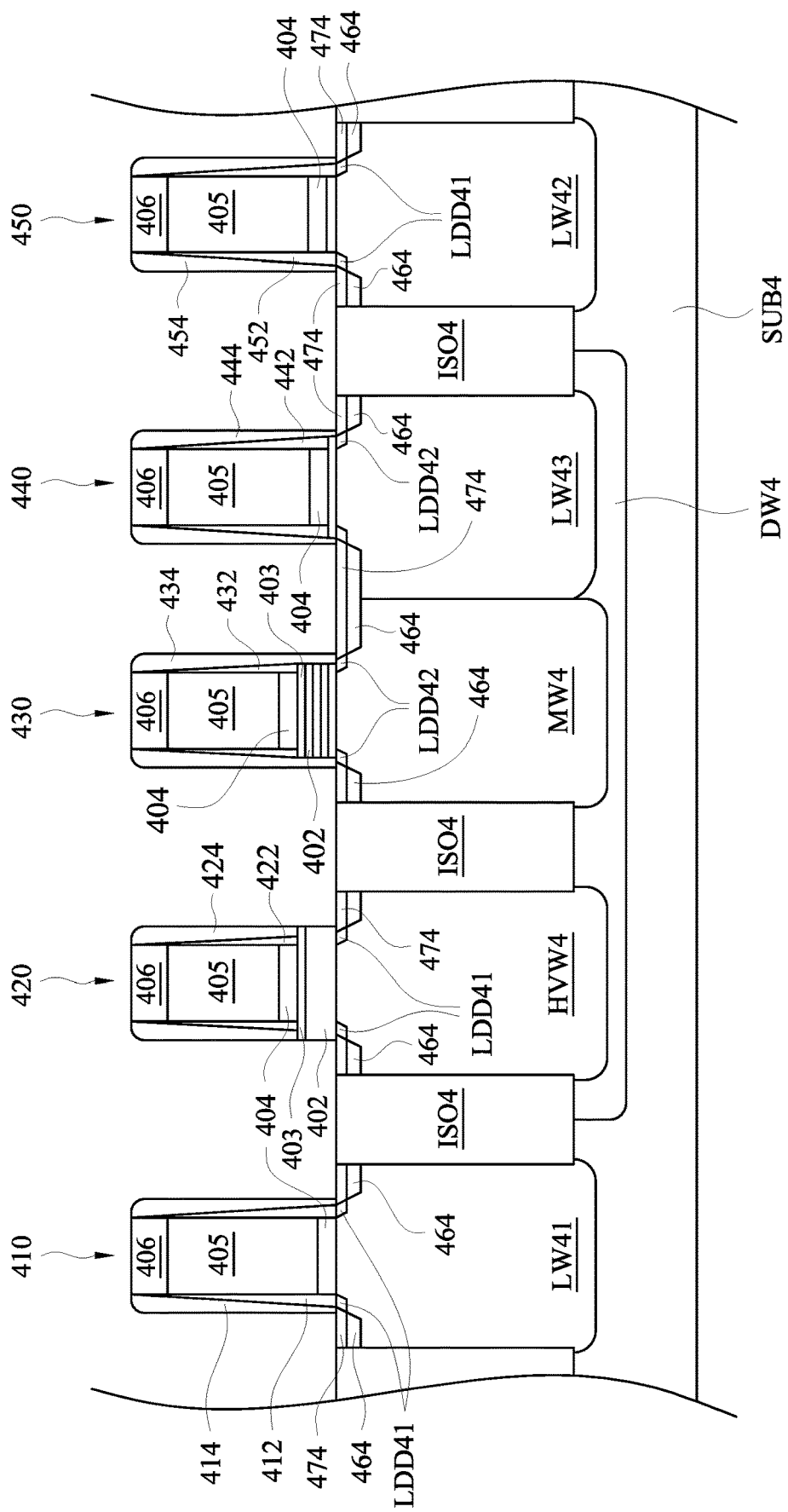
Figure 4L:
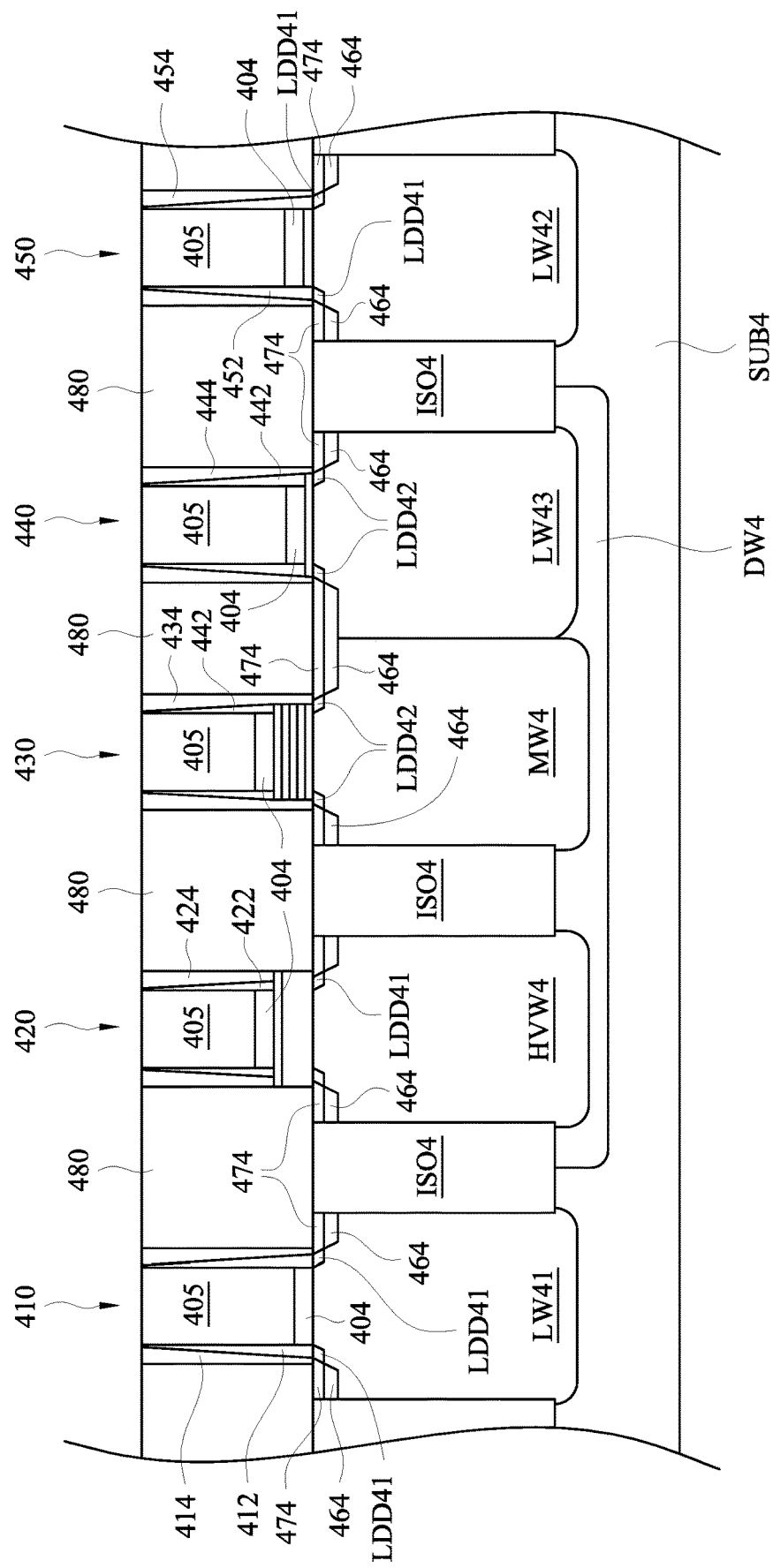
Figure 4M:
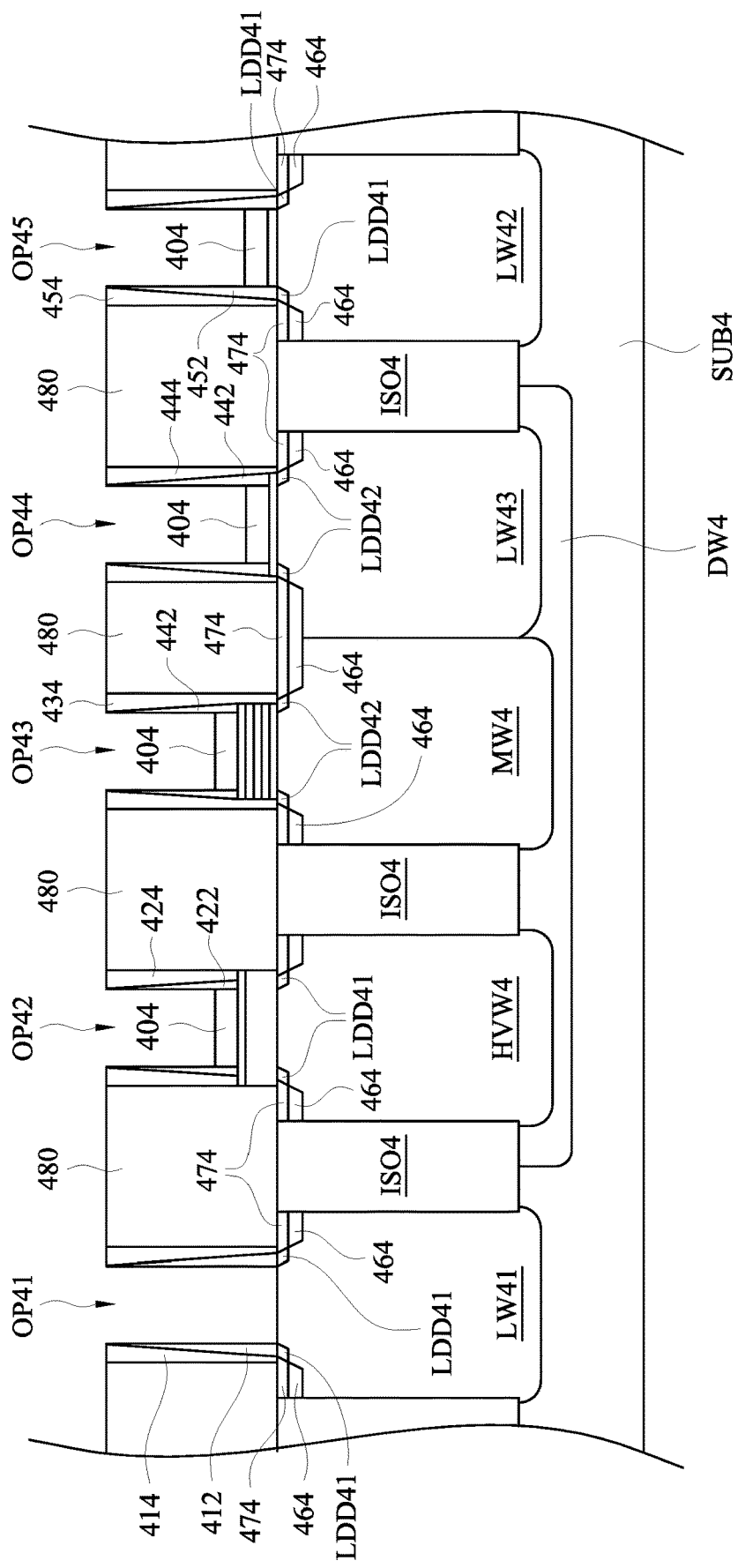
Figure 4N:
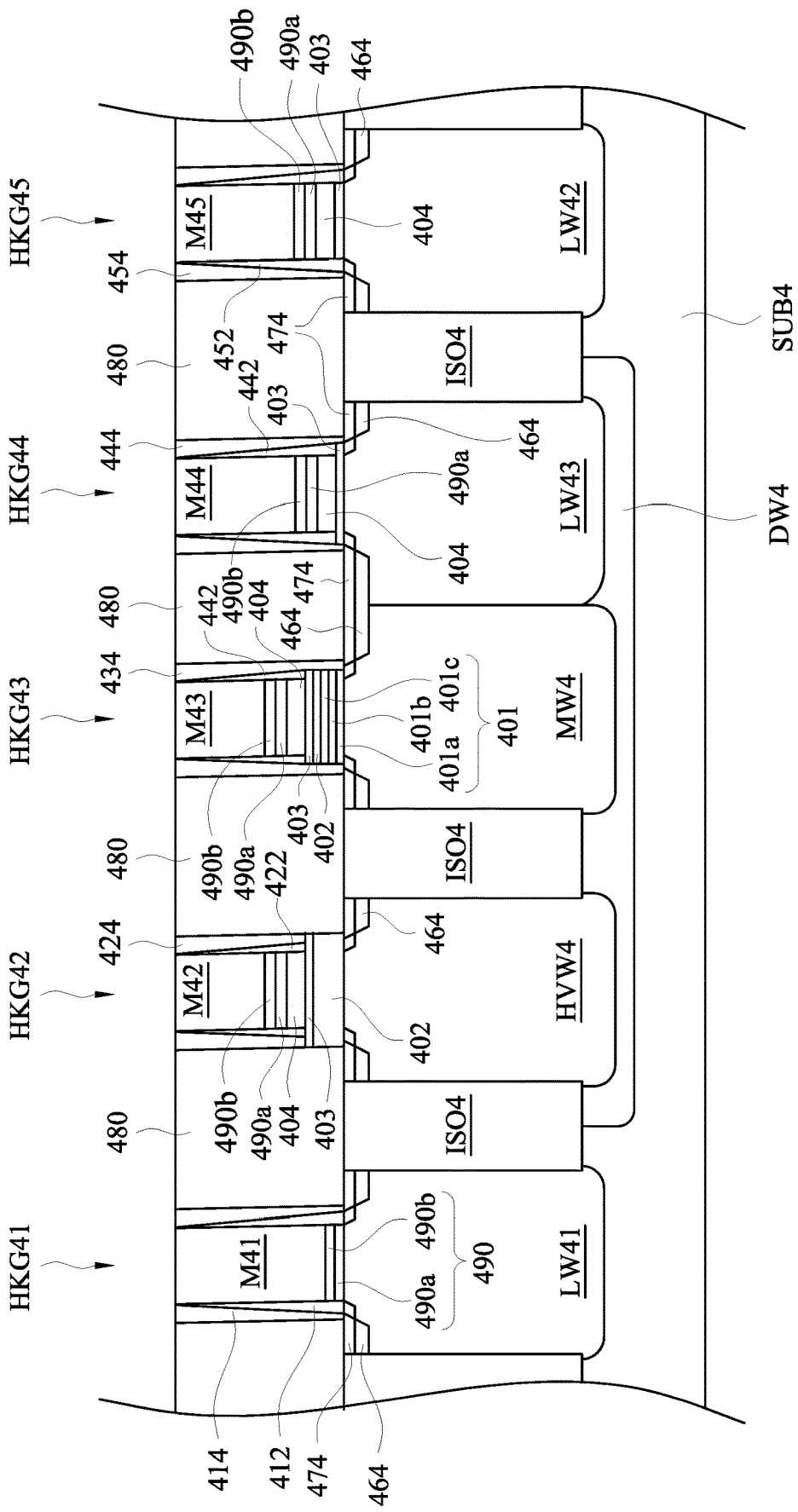

Referring to FIG. 4A to FIG. 4N, FIG. 4A to FIG. 4N are cross-sectional views of intermediate stages showing a method for fabricating a memory device in accordance with some embodiments of the present disclosure. At first, a semiconductor substrate SUB4 is provided as shown in FIG. 4A. In some embodiments, the semiconductor substrate SUB4 may be a semiconductor material and may include structures including a graded layer or a buried oxide, for example. In some exemplary examples, the semiconductor substrate SUB4 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate SUB4. Alternatively, the semiconductor substrate SUB4 may be an active layer of a semiconductor-on-insulator (SOI) substrate or a multi-layered structure such as a silicon-germanium layer formed on a bulk silicon layer.

Then, plural isolation structures ISO4 are formed in the semiconductor substrate SUB4, as shown in FIG. 4B. In some embodiments, the isolation structures ISO4 are shallow trench isolation structures, but embodiments of the present disclosure are not limited thereto.

Thereafter, a sacrifice layer SAC4 is formed on the semiconductor substrate SUB2 as shown in FIG. 4C(1), and a deep well region DW4, a logic well region LW41, a logic well region LW42, a memory well region MW4, a logic well region LW43 and a high-voltage well region HVW4 are formed by using the sacrifice layer SAC4 as show in FIG. 4C(2). In some embodiments, the logic well region LW41, the memory well region MW4, the logic well region LW43 and the high-voltage well region HVW4 are formed by doping with a p-type dopant, and the logic well region LW42 is formed by doping with an n-type dopant.

"Then, a portion of the sacrifice layer SAC4 is removed to expose a portion of the memory well region MW4 adjacent to the logic well region LW43, as shown in FIG. 4C(3)."

In some embodiments, the device shown in FIG. 4C(3) is prepared for a 2T memory unit, but embodiments of the present disclosure are not limited thereto. In some embodiments, the device may be modified for 1T memory unit, 1.5T memory unit, or other suitable memory unit.

Then, a charge storage structure 401 is formed to cover the sacrifice layer SAC4 and the exposed portion of the memory well region MW4, as shown in FIG. 4D. In some embodiments, the charge storage structure 401 includes an oxide layer 401$a$, a charge storage layer 401$b$ and a diffusion block layer 401$c$. In some embodiments, the charge storage layer 401$b$ is a nitride layer for storing charges, and the diffusion block layer 401$c$ is an oxide layer preventing inter-diffusion. In some embodiments, the oxide layer 401$a$, the charge storage layer 401$b$ and the diffusion block layer 401$c$ are sequentially deposited on the semiconductor substrate SUB4.

Thereafter, as shown in FIG. 4E(1), a mask layer ML41 is formed to cover a portion of the charge storage structure 401 which is formed on the logic well region LW41, the memory well region MW4, the logic well region LW42 and the logic well region LW43, and another portion of the charge storage structure 401 which is formed on the high-voltage well region HVW4 is not covered by the mask layer ML41.

Then, the portion of the charge storage structure 401 formed on the high-voltage well region HVW4 is removed, and the high-voltage well region HVW4 is exposed, as shown in FIG. 4E(2).

Thereafter, the mask layer ML41 is removed as shown in FIG. 4E(3).

Then, an oxide layer 402 is formed on the high-voltage well region HVW4 and the charge storage structure 401, as shown in FIG. 4E(4). In some embodiments, the oxide layer 402 is formed by a thermal oxidation process, but embodiments of the present disclosure are not limited thereto.

Thereafter, a mask layer ML42 is formed to cover the oxide layer 402 located on the memory well region MW4 and the high-voltage well region HVW4, as show in FIG. 4E(5).

Then, the oxide layer 402 and the charge storage structure 401 located on the logic well region LW41, the logic well region LW42 and the logic well region LW43 are removed to expose the logic well region LW41, the logic well region LW42 and the logic well region LW43, as shown in FIG. 4E(6).

Thereafter, the mask layer ML42 is removed and an oxide layer 403 is formed to cover the logic well region LW41, the logic well region LW42 and the logic well region LW43 and the oxide layer 402, as shown in FIG. 4E(7).

Then, a mask ML43 is formed to cover a portion of the oxide layer 403 located on the high-voltage well region HVW4, the memory well region MW4, the logic well region LW42 and a logic well region LW43, as shown in FIG.

4F(1). It is noted that another portion of oxide layer 403 located on the logic well region LW41 is not covered by the mask ML43.

Thereafter, the portion of oxide layer 403 located on the logic well region LW41 is removed to expose the logic well region LW41, as shown in FIG. 4F(2).

Then, the mask layer ML43 is removed, and a dummy dielectric layer 404 is formed to cover the exposed logic well region LW41 and the remaining oxide layer 403, as shown in FIG. 4F(3). In some embodiments, the dummy dielectric layer 404 is an oxide layer. In some embodiments, the dummy dielectric layer 404 is a silicon oxide layer.

Thereafter, a dummy gate layer 405, a gate mask layer 406 and an anti-reflective layer 407 are formed to cover the dummy dielectric layer 404, as shown in FIG. 4G. In some embodiments, the dummy gate layer 405, the gate mask layer 406 and the anti-reflective layer 407 are sequentially deposited on the dummy dielectric layer 404, and the gate mask layer 406 is a hard mask layer.

Then, the oxide layer 403, the dummy dielectric layer 404, the dummy gate layer 405, the gate mask layer 406 and the anti-reflective layer 407 are etched to form plural dummy gate structures 410, 420, 430, 440 and 450, as shown in FIG. 4H. Each of the dummy gate structures 410, 420, 430, 440 and 450 includes a remaining portion of the dummy dielectric layer 404, a remaining portion of the dummy gate layer 405 and a remaining portion of the gate mask layer 406.

Thereafter, plural sidewall structures 412, 422, 432, 442 and 452 are formed on the dummy gate structures 410, 420, 430, 440 and 450, respectively, as shown in FIG. 4I. In some embodiments, the sidewall structures 412, 422, 432, 442 and 452 are dielectric layers, for example, oxide layers.

Then, plural light-doped regions LDD41 are formed in the logic well region LW41, the logic well region LW42 and the high-voltage well region HVW4, by doping the logic well region LW41, the logic well region LW42 and the high-voltage well region HVW4 as shown in FIG. 4J(1). In some embodiments, a mask layer (not shown) covering the memory well region MW4, the logic well region LW43 and the charge storage structure 401 is used for the formation of the light-doped regions LDD41.

Thereafter, the mask layer is removed, and another mask layer ML44 is formed to cover the logic well regions LW41, LW42 and the dummy gate structures 410, 450 located on the logic well regions LW41, LW42 (also referred to as logic dummy gate structures), as shown in FIG. 4J(2). In this embodiment, because a high-voltage well region HVW4 is provided for a high-voltage device, the mask layer ML44 further covers the high-voltage well region HVW4 and the dummy gate structure 420.

Then, a portion of the storage structure 401, a portion of the oxide layers 402 and 403 are removed to expose the memory well region MW4 and the logic well region LW43, as shown in FIG. 4J(3).

Thereafter, plural light-doped regions LDD42 are formed in the logic well region LW43 and the memory well region MW4 by doping the logic well region LW43 and the memory well region MW4, as shown in FIG. 4J(4). For example, the light-doped regions LDD42 are formed by doping regions adjacent to the dummy gate structure 430 (also referred to as memory dummy gate structure).

Then, plural spacers 414, 424, 434, 444 and 454 are formed on the sidewall structures 412, 422, 432, 442 and 452 of the dummy gate structures 410, 420, 430, 440 and 450, as shown in FIG. 4J(5). In some embodiments, the spacers 414, 424, 434, 444 and 454 are dielectric layers, for example, oxide layers.

Thereafter, plural sources/drains 464 are formed in the logic well region LW41, the logic well region LW42, the logic well region LW43, the high-voltage well region HVW4 and the memory well region MW4, a shown in FIG. 4J(6). In some embodiments, a concentration of dopant of each of the sources/drains 464 is greater than that of each of the lightly-doped regions LDD41 and LDD42. In some embodiments, silicide layers 474 are formed on the sources/drains 464 for contact landing, as shown in FIG. 4K.

Then, the hard mask layers 406 is removed and plural dielectric layers 480 are formed between the dummy gate structures 410, 420, 430, 440 and 450 as show in FIG. 4L. For example, the hard mask layers 406 are removed at first, and then the dielectric layers 480 are formed. In some embodiments, the dielectric layers 480 are formed to provide a flat surface for a subsequent planarization process.

Thereafter, the dummy gate layers 405 of the dummy gate structures 410, 420, 430, 440 and 450 are removed to form plural openings OP41, OP42, OP43, OP44 and OP45 as shown in FIG. 4M. In some embodiments, the dielectric layers 404 in the dummy gate structures, 420, 430, 440 and 450 are not removed.

Then, metal gate electrodes M41, M42, M43, M44, M45 and high-k dielectric layers 490 are formed in the openings OP41, OP42, OP43, OP44 and OP45 to form plural high-k metal gate structures HKG41, HKG42, HKG43, HKG44 and HKG45, as shown in FIG. 4N. In some embodiments, because a dopant type of the logic well region LW42 is different from that of each of the logic well region LW41, the logic well region LW43, the high-voltage well region HVW4 and the memory well region MW4, the metal gate electrode M45 is different from the metal gate electrodes M41, M42, M43 and M44. In some embodiments, a planarization process, for example a chemical-mechanical planarization (CMP) process is used to form the metal gate electrodes M41, M42, M43, M44 and M45.

It can be understood that, in the above method of fabricating a memory device, the transistors disposed on the logic well region LW41, the logic well region LW42, the logic well region LW43, the high-voltage well region HVW4 and the memory well region MW4 are formed to include the high-k metal gate structures HKG41, HKG42, HKG43, HKG44 and HKG45, and a number of masks used to fabricate the memory device can be decreased accordingly.

Figure 5:
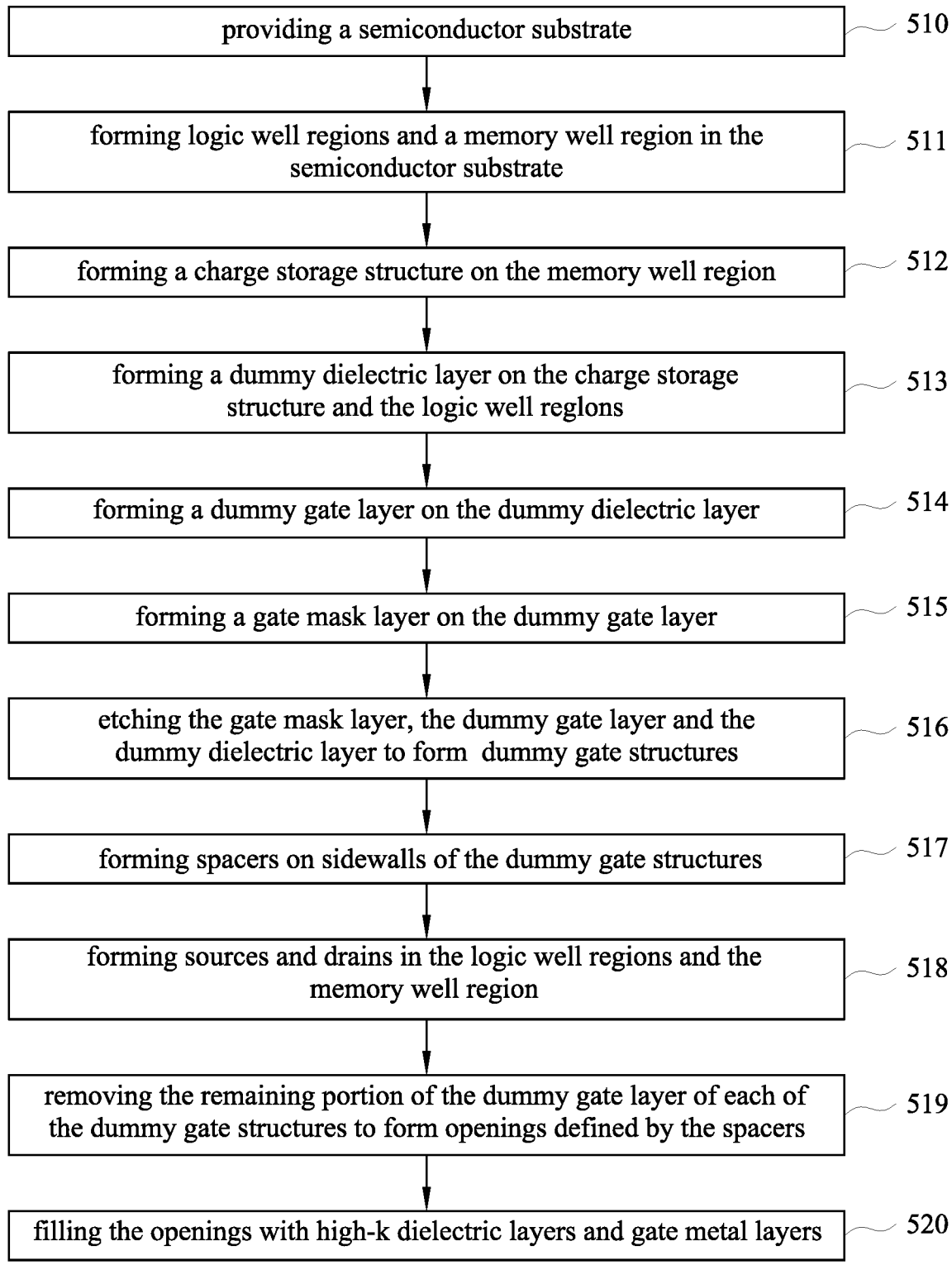
FIG. 5 is a flow chart showing a method for fabricating a memory device in accordance with embodiments of the present disclosure.

Referring to FIG. 5, FIG. 5 is a flow chart showing a method 500 for fabricating a memory device in accordance with embodiments of the present disclosure. The method 500 begins at operation 510. In operation 510, the semiconductor substrate SUB4 is provided as shown in FIG. 4A. Then, in operation 511, the logic well regions LW41 and LW42 and the memory well region MW4 are formed in the semiconductor substrate SUB4, as shown in FIG. 4B to FIG. 4C(3). In some embodiment, the memory device is a 2T memory unit, a memory well region MW4 is formed in the semiconductor substrate SUB4. Further, a high-voltage well region HVW4 may be formed in the semiconductor substrate SUB4 for a high-voltage device.

Thereafter, in operation 512, the charge storage structure 401 is formed on the memory well region MW4, as shown in FIG. 4D to FIG. 4E(6). Then, in operation 513, the dummy dielectric layer 404 is formed on the charge storage structure 401 and the logic well regions LW41, LW42 and LW43, as shown in FIG. 4F(3). In some embodiments, oxide layers 402 and 403 can be formed before operation 513, as shown in FIG. 4E(7) to FIG. 4F(2). Thereafter, in operations 514 and 515, the dummy gate layer 405 and the gate mask layer 406 are formed on the dummy dielectric layer 404, as shown in FIG. 4G. Then, in operation 516, the gate mask layer 406, the dummy gate layer 405 and the dummy dielectric layer 404 are etched to form the dummy gate structures 410, 430 and 450 as shown in FIG. 4H. In some embodiments, the dummy gate structure 420 for the high-voltage well region HVW4 is formed. In some embodiments, because the memory device is a 2T memory unit, the dummy gate structure 440 is formed for the logic well region LW43.

In operation 517, the spacers 414, 424, 434, 444 and 454 are formed on sidewalls of the dummy gate structures 410, 420, 430, 440 and 450 as shown in FIG. 4J(5). In some embodiments, the lightly-doped regions LDD41 and LDD42 can be formed before operation 517, as shown in FIG. 4I to FIG. 4J(4).

In operation 518, the sources/drains 464 are formed in the logic well regions LW41 and LW42 and the memory well region MW4, as shown in FIG. 4J(6) to FIG. 4K. In some embodiments, the sources/drains 464 are further formed in the logic region LW43 and the high-voltage well region HVW4. In some embodiments, the silicide layers 474 are formed on the sources/drains 464 for contact landing.

In operation 519, the remaining portion of the dummy gate layer 405 of each of the dummy gate structures 410, 420, 430, 440 and 450 are removed to form the openings OP41, OP42, OP43, OP44 and OP45 defined by the spacers 414, 424, 434, 444 and 454, as shown in FIG. 4L to FIG. 4M. In some embodiments, the dielectric layer 404 in the dummy gate structure 410 is further removed, but the dielectric layers 404 in the dummy gate structures, 420, 430, 440 and 450 are not removed.

In operation 520, the openings OP41, OP42, OP43, OP44 and OP45 are filled with the metal gate electrodes M41, M42, M43, M44, M45 and the high-k dielectric layers 490, as shown in FIG. 4N.

It can be understood that, the method 500 for fabricating a memory device can be modified for fabricating other suitable memory device including 1T memory unit or 1.5T memory unit.

In accordance with an embodiment of the present disclosure, a memory device includes a semiconductor substrate, a logic transistor, and a storage transistor. The semiconductor substrate has a logic region and a memory region. The logic transistor is disposed on the logic region, in which the logic transistor comprises a high-k metal gate structure. The storage transistor is disposed on the memory region, in which the storage transistor includes a charge storage structure and a high-k metal gate structure. The charge storage structure is disposed on the memory region. The high-k metal gate structure is disposed on the charge storage structure.

In accordance with another embodiment of the present disclosure, a memory device includes a semiconductor substrate, an Oxide-Nitride-Oxide (ONO) charge storage structure, a high-k dielectric layer, and a metal gate electrode. The Oxide-Nitride-Oxide (ONO) charge storage structure is over a first region of the semiconductor substrate. The high-k dielectric layer is directly above the ONO charge storage structure. The metal gate electrode is directly above the high-k dielectric layer.

In accordance with another embodiment of the present disclosure, a memory device includes a semiconductor substrate, a charge storage structure, a dummy dielectric layer, a high-k dielectric layer, and a gate electrode. The charge storage structure is over a first region of the semiconductor substrate. The dummy dielectric layer is over the charge storage structure, in which the charge storage structure laterally extends past opposite sides of the dummy dielectric layer. The high-k dielectric layer is over the dummy dielectric layer. The gate electrode is over the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a semiconductor substrate having a logic region and a memory region;
 a logic transistor disposed on the logic region, wherein the logic transistor comprises a high-k metal gate structure;
 a storage transistor disposed on the memory region, wherein the storage transistor comprises:
 a charge storage structure disposed on the memory region; and
 a high-k metal gate structure disposed on the charge storage structure;
 an inner spacer on a sidewall of the high-k metal gate structure of the storage transistor; and
 an outer spacer on a sidewall of the charge storage structure and a sidewall of the inner spacer facing away from the high-k metal gate structure of the storage transistor, wherein the outer spacer is spaced apart from a sidewall of the high-k metal gate structure of the storage transistor by the inner spacer and has a bottom end lower than a bottom end of the inner spacer.

2. The memory device of claim 1, wherein the semiconductor substrate further has a high-voltage region, and the memory device further comprises:
 a high-voltage transistor disposed on the high-voltage region, wherein the high-voltage transistor comprises a high-k metal gate structure.

3. The memory device of claim 1, wherein the charge storage structure comprises an Oxide-Nitride-Oxide (ONO) structure.

4. The memory device of claim 1, wherein the high-k metal gate structure of the storage transistor comprises:
 a high-k dielectric layer, wherein a bottom of the high-k dielectric layer is higher than a top surface of the charge storage structure; and
 a metal gate electrode over the high-k dielectric layer.

5. The memory device of claim 4, wherein the storage transistor further comprises:
 a dummy dielectric layer between the charge storage structure and the high-k metal gate structure of the high-k metal gate structure of the storage transistor.

6. The memory device of claim 5, wherein
 the inner spacer is further on a sidewall of the dummy dielectric layer of the storage transistor, and the bottom end of the inner spacer is over a top surface of the charge storage structure.

7. The memory device of claim 1, wherein the logic transistor further comprises:
a dummy dielectric layer between the semiconductor substrate and the high-k metal gate structure of the logic transistor.

8. The memory device of claim 7, further comprising:
a gate spacer on a sidewall of the high-k metal gate structure of the logic transistor and a sidewall of the dummy dielectric layer of the logic transistor.

9. The memory device of claim 1, wherein each of the high-k metal gate structure of the logic transistor and the high-k metal gate structure of the storage transistor comprises:
a high-k dielectric layer; and
a metal gate electrode over the high-k dielectric layer, wherein the high-k dielectric layer of the high-k metal gate structure of the logic transistor comprises a high-k dielectric material the same as that of the high-k dielectric layer of the high-k metal gate structure of the storage transistor.

10. A memory device, comprising:
a semiconductor substrate;
an Oxide-Nitride-Oxide (ONO) charge storage structure over a first region of the semiconductor substrate;
a high-k dielectric layer directly above the ONO charge storage structure, wherein the ONO charge storage structure laterally extends past opposite sides of the high-k dielectric layer; and
a metal gate electrode directly above the high-k dielectric layer.

11. The memory device of claim 10, further comprising:
a select gate high-k dielectric layer over a second region of the semiconductor substrate adjoining the first region of the semiconductor substrate; and
a select gate metal electrode over the select gate high-k dielectric layer.

12. The memory device of claim 11, wherein the high-k dielectric layer has a first layer and a second layer over the first layer, the select gate high-k dielectric layer has a third layer having the same material as that of the first layer of the high-k dielectric layer and a fourth layer having the same material as that of the second layer of the high-k dielectric layer over the third layer.

13. The memory device of claim 10, further comprising:
a gate spacer on a sidewall of the high-k dielectric layer and a sidewall of the metal gate electrode, wherein a bottom of the gate spacer is over a top surface of the ONO charge storage structure.

14. The memory device of claim 10, further comprising:
a dummy dielectric layer between the ONO charge storage structure and the high-k dielectric layer.

15. The memory device of claim 14, further comprising:
a gate spacer on a sidewall of the dummy dielectric layer and a sidewall of the high-k dielectric layer, wherein a bottom of the gate spacer is over a top surface of the ONO charge storage structure.

16. A memory device, comprising:
a semiconductor substrate;
a charge storage structure over a first region of the semiconductor substrate;
a dummy dielectric layer over the charge storage structure, wherein the charge storage structure laterally extends past opposite sides of the dummy dielectric layer;
a high-k dielectric layer over the dummy dielectric layer; and
a gate electrode over the high-k dielectric layer.

17. The memory device of claim 16, wherein a bottom surface of the high-k dielectric layer is over a top surface of the dummy dielectric layer.

18. The memory device of claim 16, further comprising:
a gate spacer disposed over a top surface of the charge storage structure, wherein the gate spacer surrounds the dummy dielectric layer, the high-k dielectric layer, and the gate electrode.

19. The memory device of claim 16, further comprising:
a select gate high-k dielectric layer over a second region of the semiconductor substrate adjoining the first region of the semiconductor substrate; and
a select gate electrode over the select gate high-k dielectric layer.

20. The memory device of claim 19, wherein a top surface of the gate electrode is substantially level with a top surface of the select gate electrode.

* * * * *